US011417665B2

(12) United States Patent
Lee et al.

(10) Patent No.: US 11,417,665 B2
(45) Date of Patent: Aug. 16, 2022

(54) SEMICONDUCTOR DEVICES

(71) Applicant: SAMSUNG ELECTRONICS CO., LTD., Suwon-si (KR)

(72) Inventors: Ki-Seok Lee, Hwaseong-si (KR);
Bomg-Soo Kim, Yongin-si (KR);
Ji-Young Kim, Yongin-si (KR);
Sung-Hee Han, Hwaseong-si (KR);
Yoo-Sang Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/060,026

(22) Filed: Sep. 30, 2020

(65) Prior Publication Data
US 2021/0020641 A1    Jan. 21, 2021

Related U.S. Application Data

(63) Continuation of application No. 16/134,252, filed on Sep. 18, 2018, now Pat. No. 10,818,671.

(30) Foreign Application Priority Data

Nov. 17, 2017  (KR) .................. 10-2017-0154317

(51) Int. Cl.
*H01L 27/108*    (2006.01)
*H01L 21/768*    (2006.01)
(Continued)

(52) U.S. Cl.
CPC ...... *H01L 27/10855* (2013.01); *H01L 21/764* (2013.01); *H01L 21/7682* (2013.01);
(Continued)

(58) Field of Classification Search
CPC ............ H01L 27/10855; H01L 21/764; H01L 27/10814; H01L 21/7682; H01L 21/76834;
(Continued)

(56) References Cited

U.S. PATENT DOCUMENTS 8,344,517 B2    1/2013  Kim et al.
8,889,543 B2 *  11/2014  Baek .................. H01L 27/2409
                                                                438/670
(Continued)

FOREIGN PATENT DOCUMENTS

KR    10-2015-0088635    8/2015

*Primary Examiner* — Shahed Ahmed
*Assistant Examiner* — Khatib A Rahman
(74) *Attorney, Agent, or Firm* — F. Chau & Associates, LLC

(57) ABSTRACT

A semiconductor device includes a plurality of conductive structures arranged on a substrate and spaced apart from each other in a second direction substantially perpendicular to a first direction, in which each of the plurality of conductive structures extends in the first direction. A plurality of contact structures are arranged between the conductive structures in an alternating arrangement and spaced apart from each other in the first direction. A plurality of insulation structures are arranged in a space between the conductive structures and between the contact structures. A plurality of air spacers are arranged between the alternating arrangement of the plurality of conductive structures and the plurality of contact structures, respectively and spaced apart from each other in the first direction.

18 Claims, 47 Drawing Sheets

(51) Int. Cl.
*H01L 23/528* (2006.01)
*H01L 23/532* (2006.01)
*H01L 21/764* (2006.01)

(52) U.S. Cl.
CPC .... *H01L 21/76834* (2013.01); *H01L 23/5283* (2013.01); *H01L 23/53295* (2013.01); *H01L 27/10814* (2013.01); *H01L 27/10826* (2013.01)

(58) Field of Classification Search
CPC .......... H01L 23/5283; H01L 23/53295; H01L 27/10826; H01L 23/528; H01L 21/76816; H01L 21/76877
See application file for complete search history.

(56) References Cited

U.S. PATENT DOCUMENTS

| | | | |
|---|---|---|---|
| 8,999,845 B2 | 4/2015 | Yu | |
| 9,012,321 B1 | 4/2015 | Kim et al. | |
| 9,214,382 B2 | 12/2015 | Lee et al. | |
| 9,230,612 B2 | 1/2016 | Park | |
| 9,318,379 B2 * | 4/2016 | Lee | H01L 21/764 |
| 9,356,073 B1 * | 5/2016 | Kim | H01L 23/528 |
| 9,379,002 B2 * | 6/2016 | Han | H01L 21/764 |
| 9,379,004 B1 * | 6/2016 | Kwon | H01L 27/1052 |
| 9,391,138 B2 * | 7/2016 | Kim | H01L 29/0649 |
| 9,419,000 B2 | 8/2016 | Kim et al. | |
| 9,508,649 B2 * | 11/2016 | Lee | H01L 27/10888 |
| 9,520,348 B2 | 12/2016 | Choi et al. | |
| 10,037,996 B2 * | 7/2018 | Kim | H01L 27/10885 |
| 2012/0276711 A1 * | 11/2012 | Yoon | H01L 21/764 438/421 |
| 2014/0061736 A1 | 3/2014 | Hwang et al. | |
| 2015/0179651 A1 | 6/2015 | Park et al. | |
| 2015/0214146 A1 * | 7/2015 | Kim | H01L 27/10885 257/773 |
| 2015/0214291 A1 * | 7/2015 | Park | H01L 24/02 257/503 |
| 2015/0262625 A1 | 9/2015 | Han et al. | |
| 2016/0035731 A1 | 2/2016 | Lee et al. | |
| 2016/0043171 A1 * | 2/2016 | Jang | H01L 27/10888 257/330 |
| 2016/0049408 A1 * | 2/2016 | Jung | H01L 27/10885 438/618 |
| 2016/0148937 A1 * | 5/2016 | Park | H01L 27/10888 257/296 |
| 2016/0197003 A1 * | 7/2016 | Kim | H01L 27/10855 438/655 |
| 2016/0300795 A1 * | 10/2016 | Kim | H01L 27/10814 |
| 2017/0005097 A1 * | 1/2017 | Kim | H01L 23/528 |
| 2017/0062347 A1 * | 3/2017 | Kim | H01L 21/76264 |
| 2017/0076974 A1 | 3/2017 | Choi et al. | |
| 2017/0154805 A1 | 6/2017 | Kim et al. | |
| 2018/0040561 A1 * | 2/2018 | Kim | H01L 23/5283 |
| 2019/0157275 A1 | 5/2019 | Lee et al. | |

* cited by examiner

FIG. 5
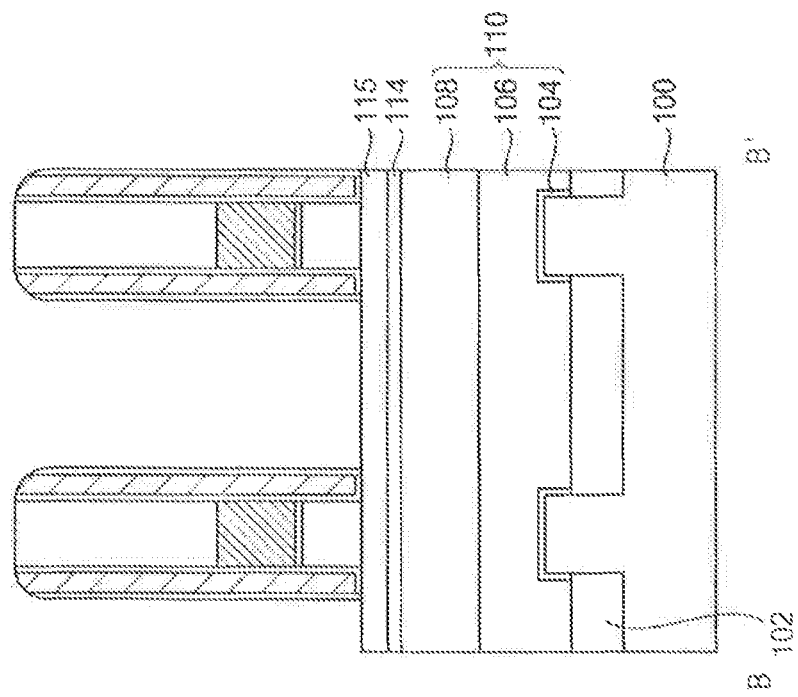
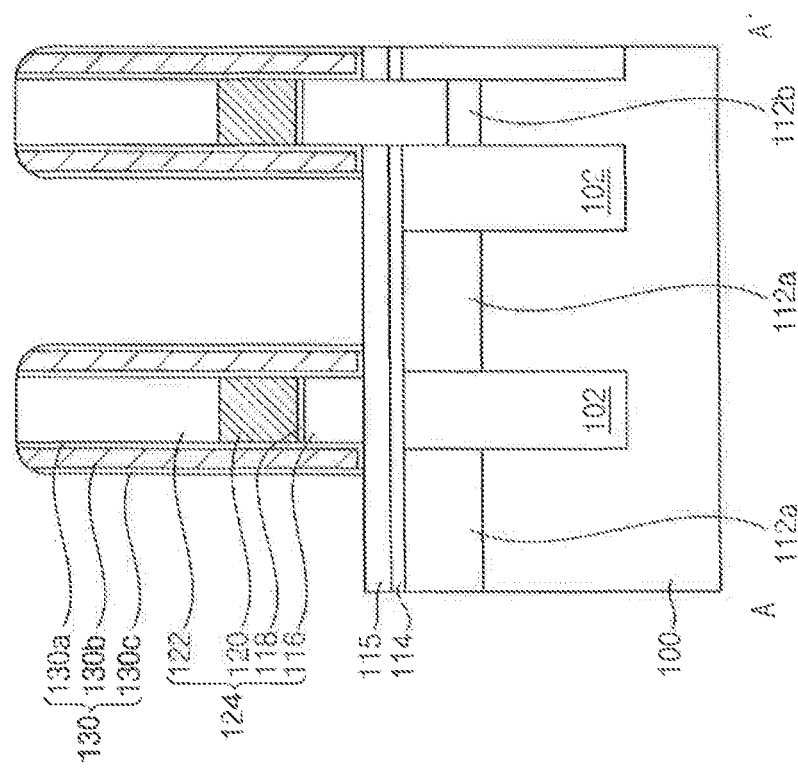

FIG. 6
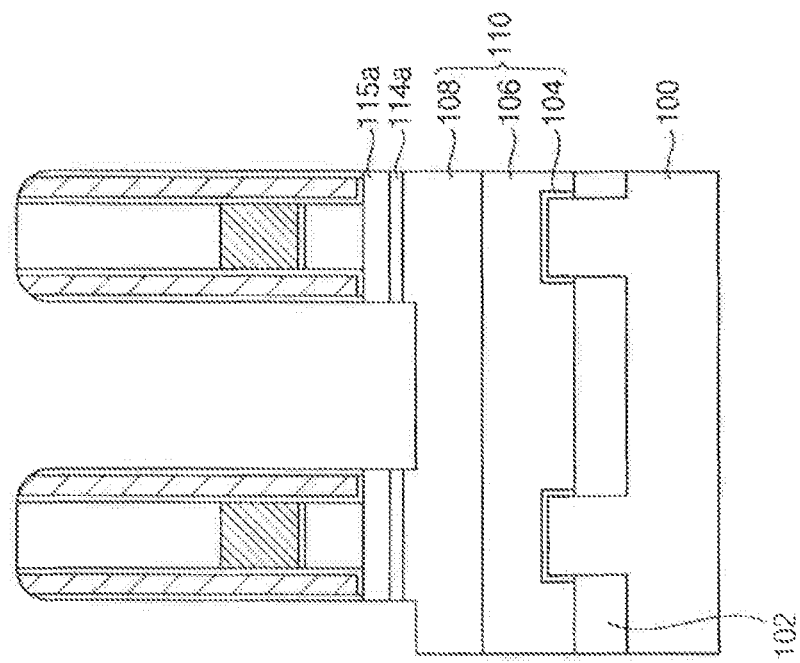
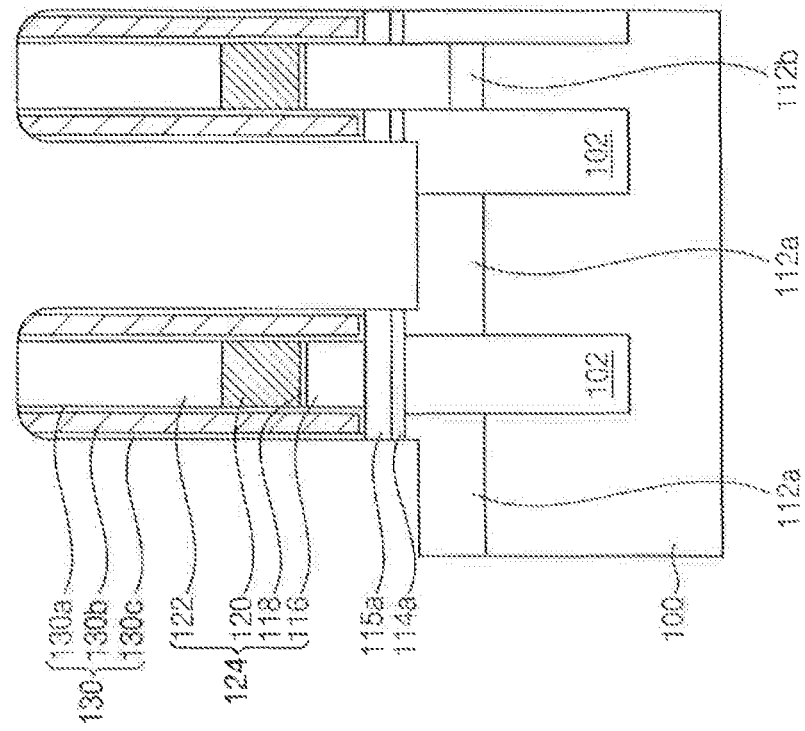

FIG. 7
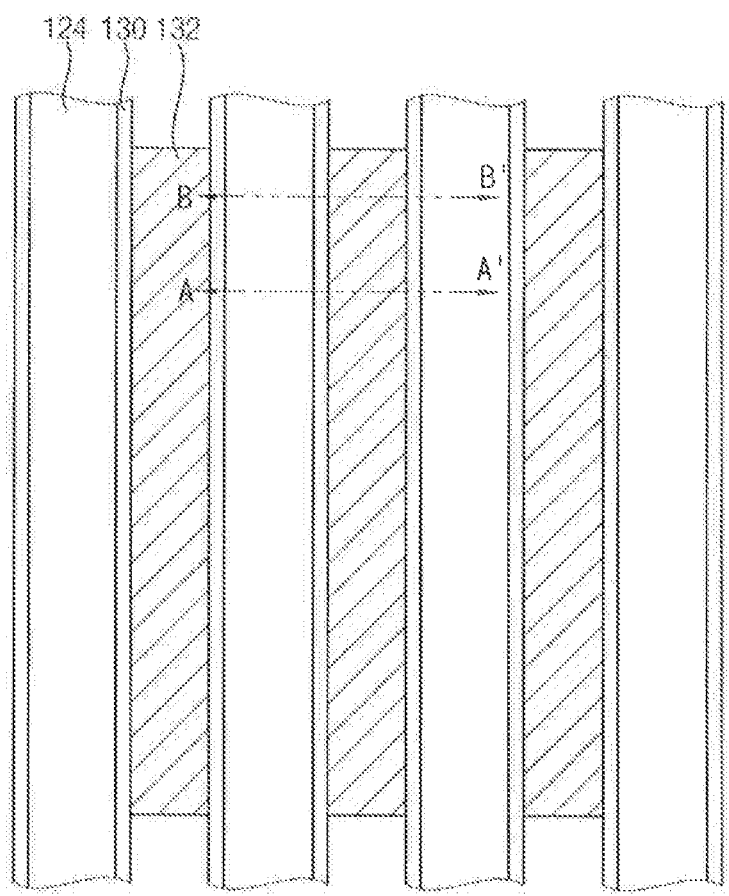
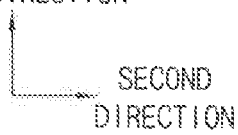

FIG. 8
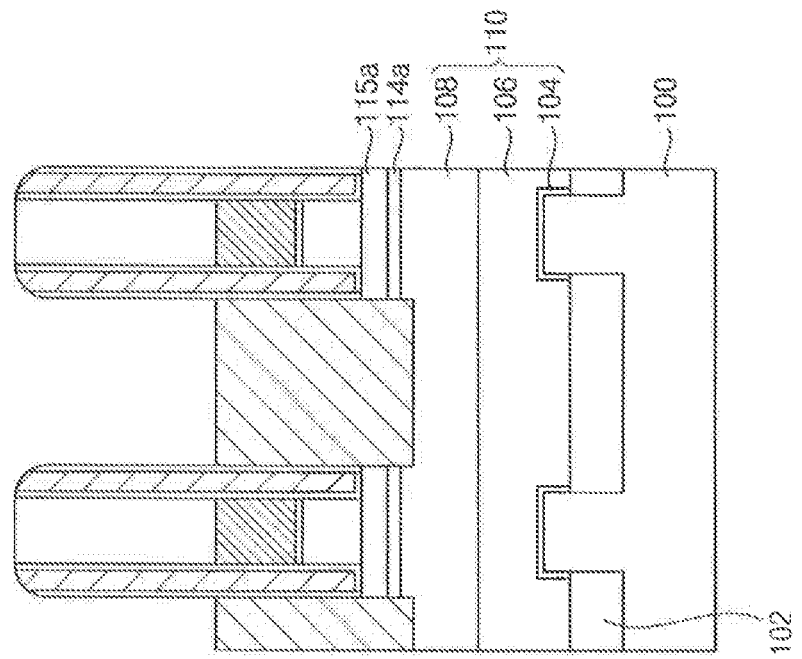
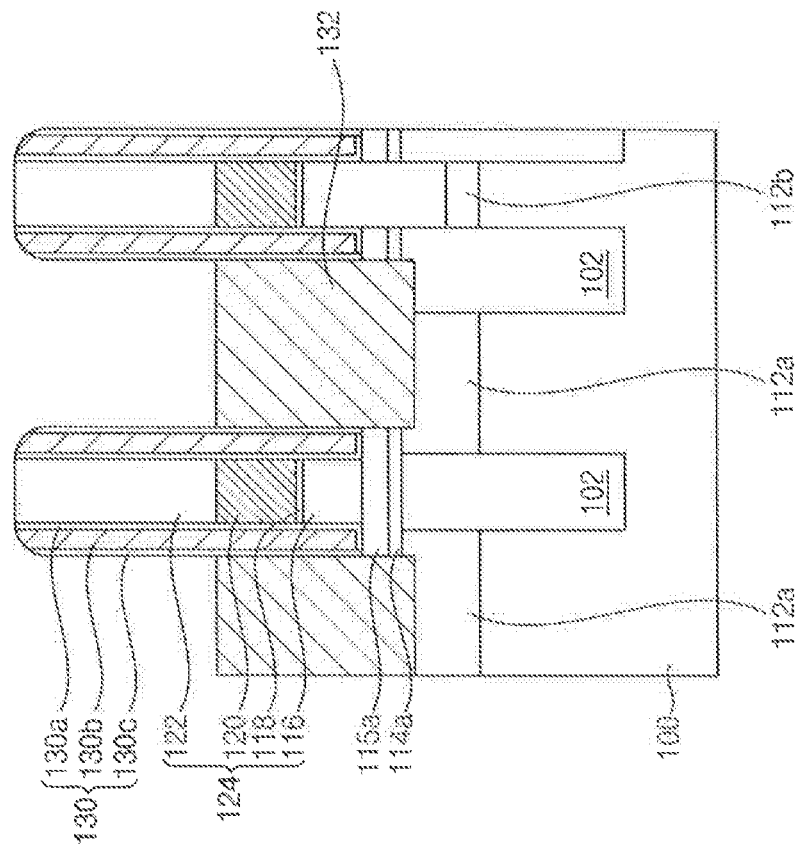

FIG. 14
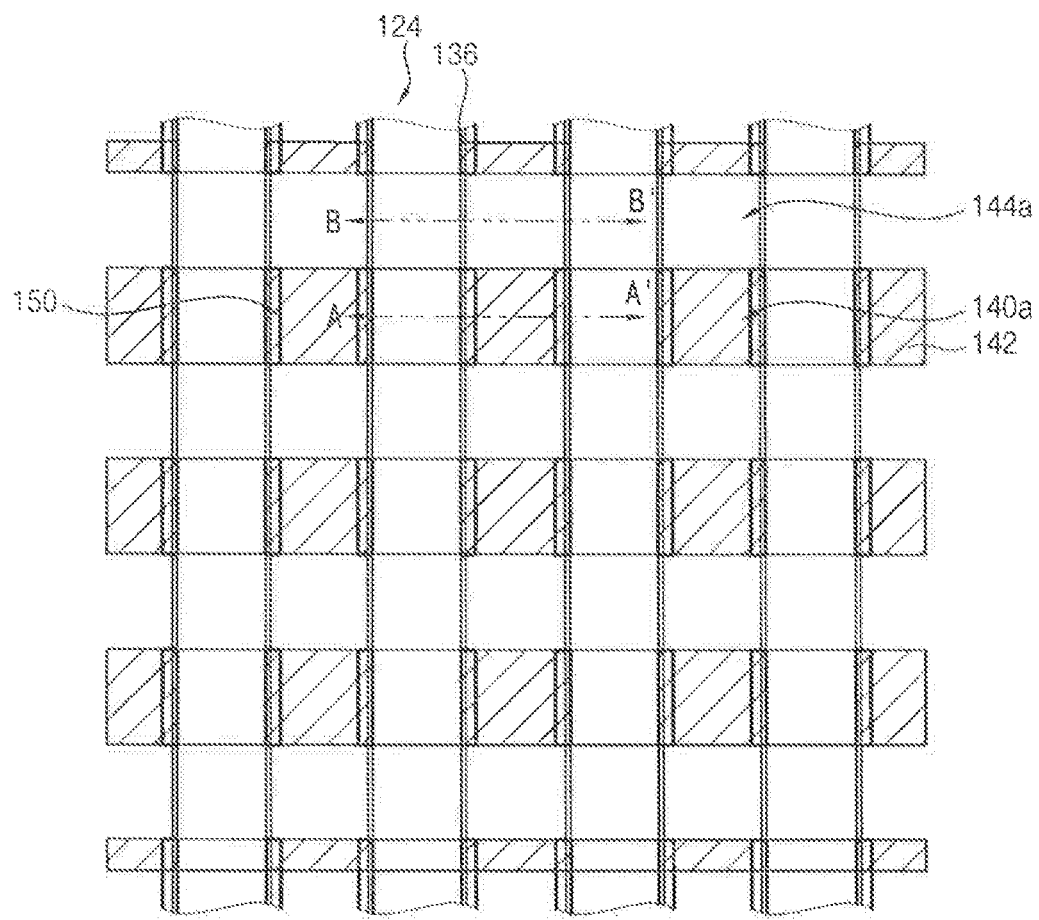
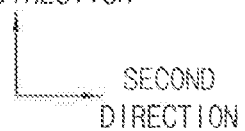

FIG. 17
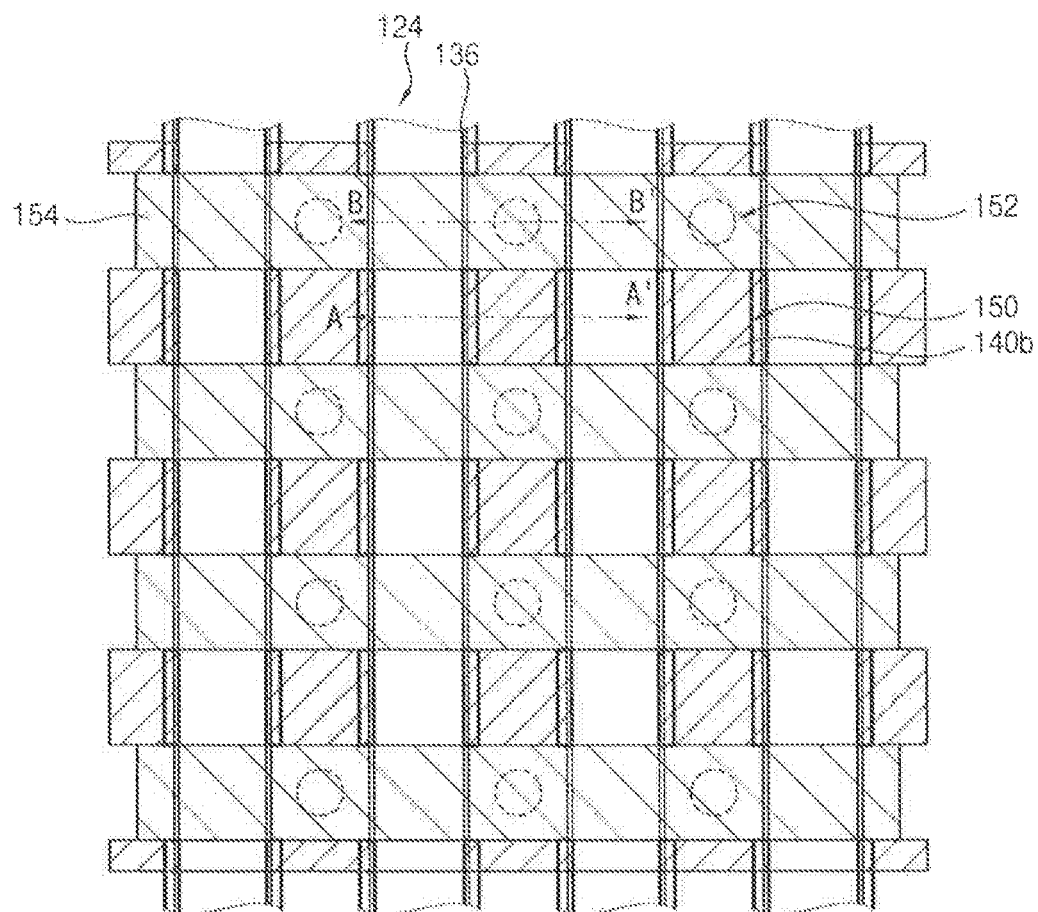
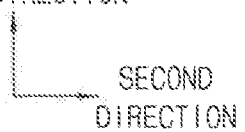

FIG. 25
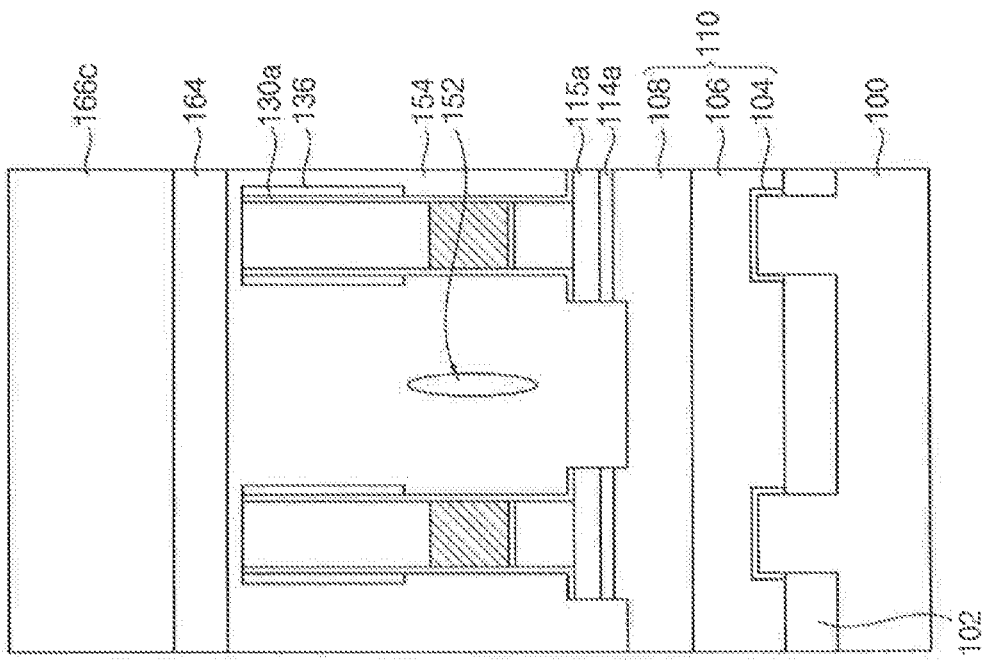
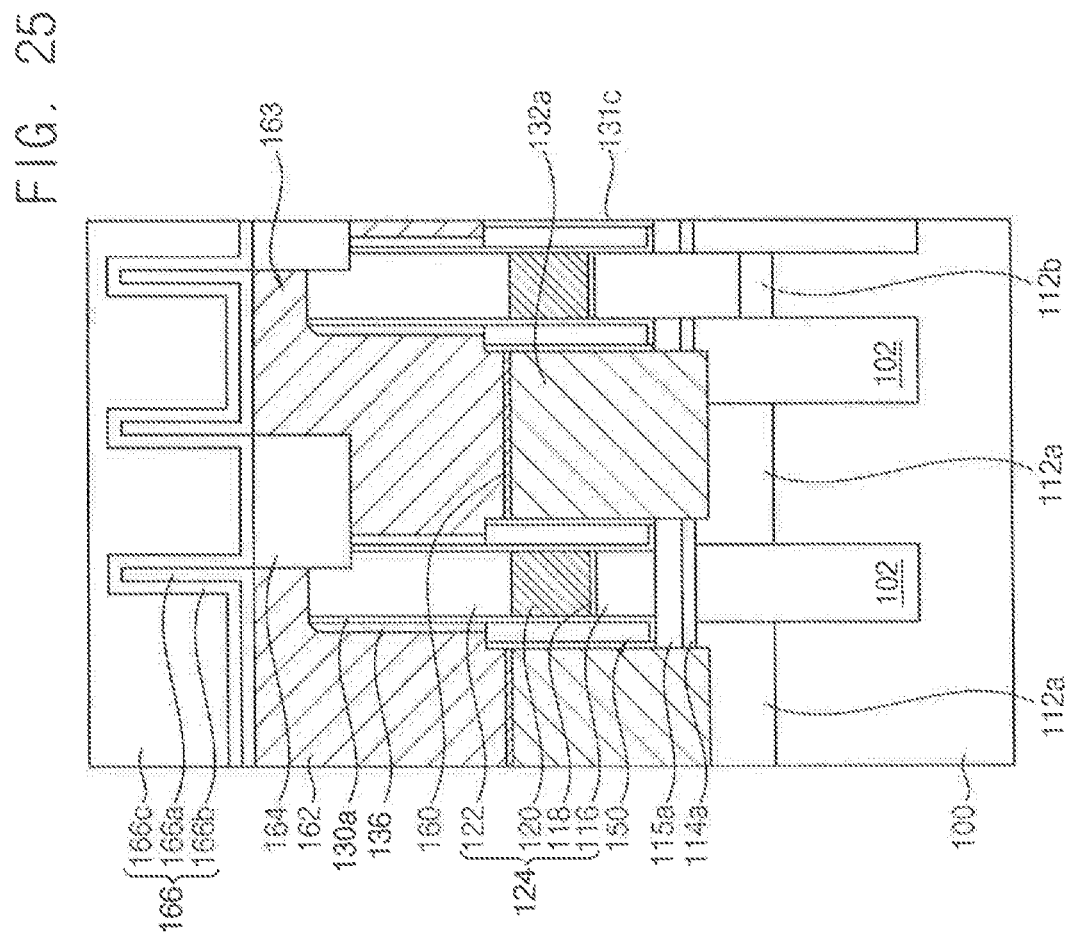

FIG. 31
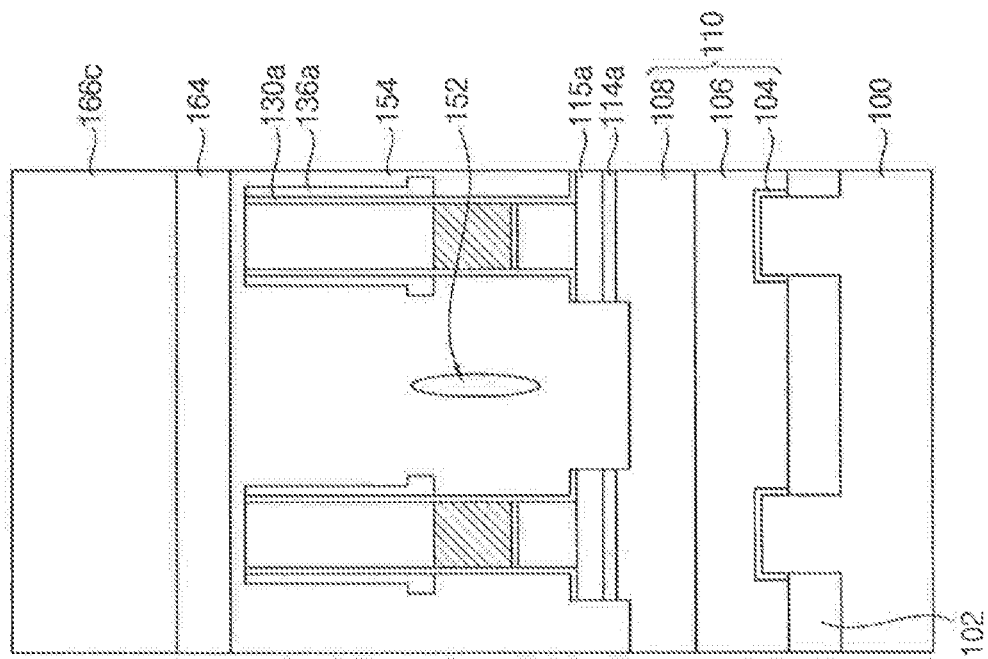
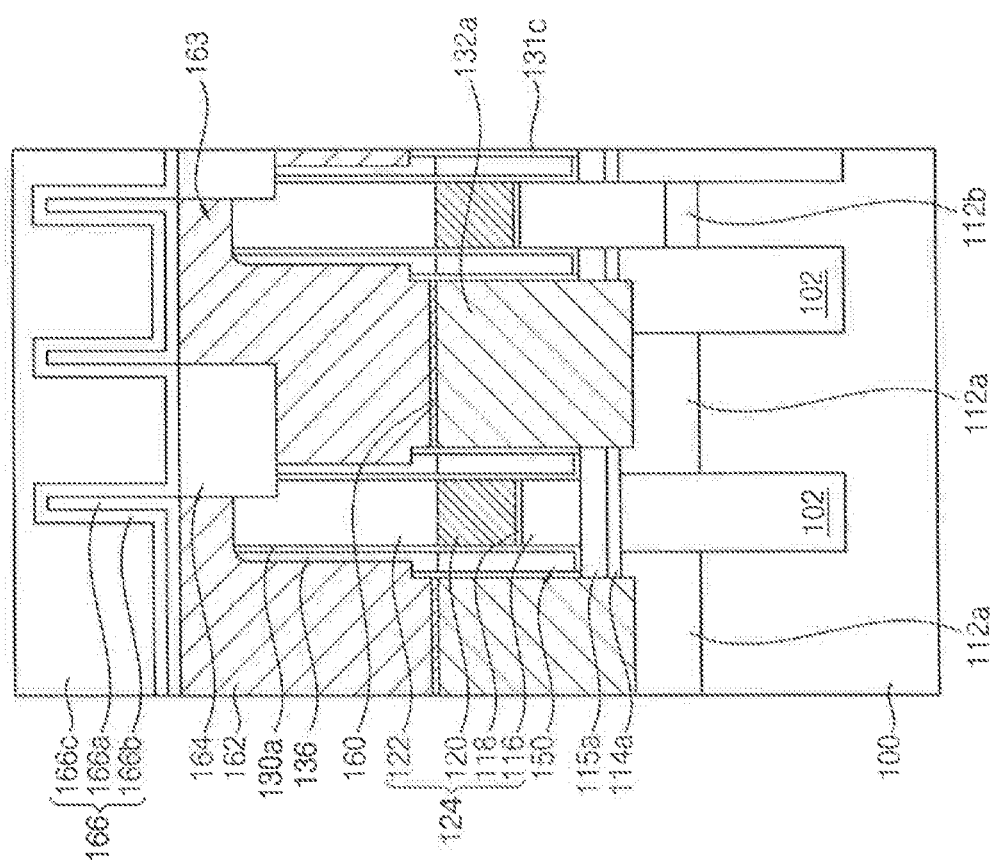

FIG. 32
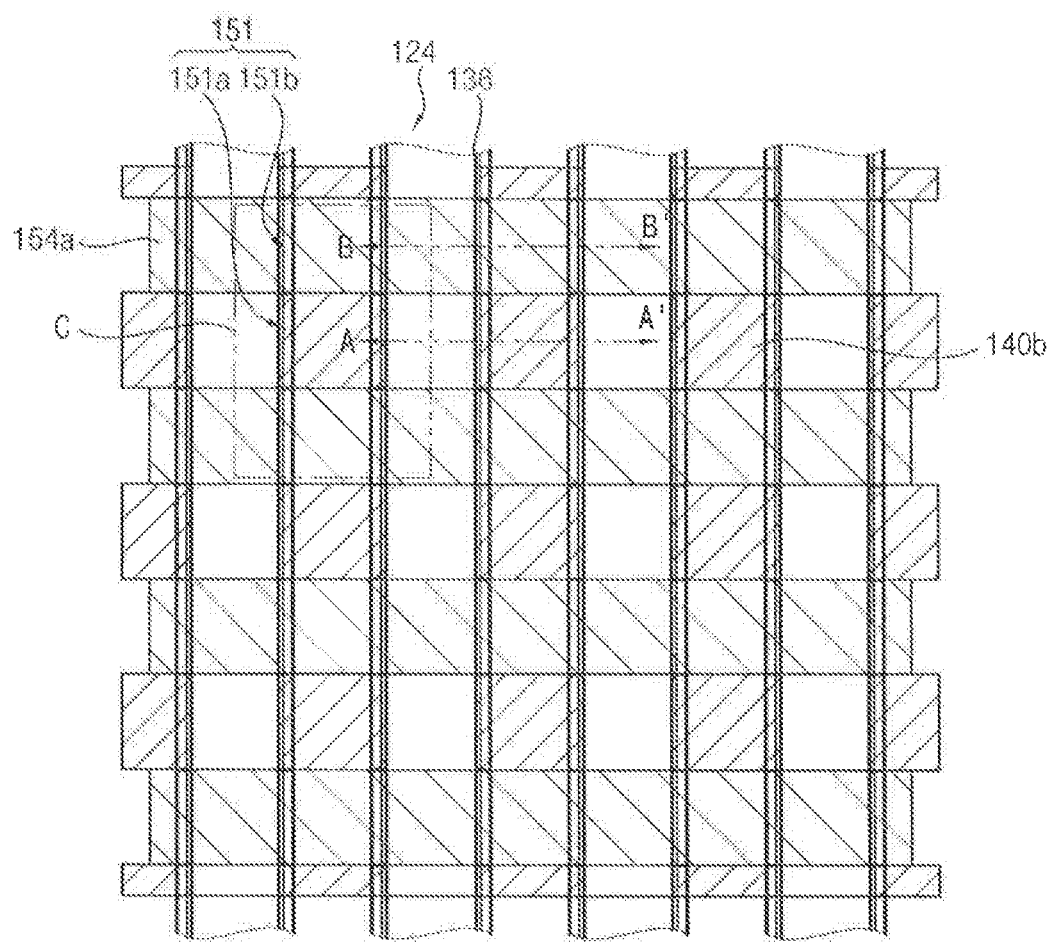
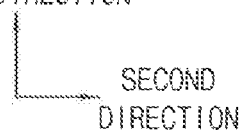

FIG. 37
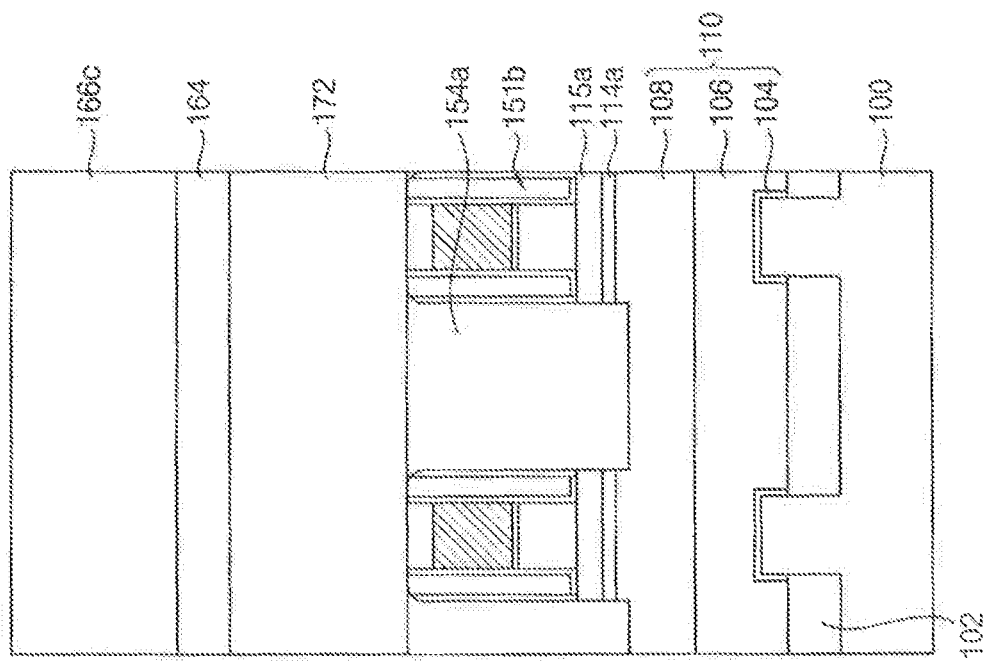
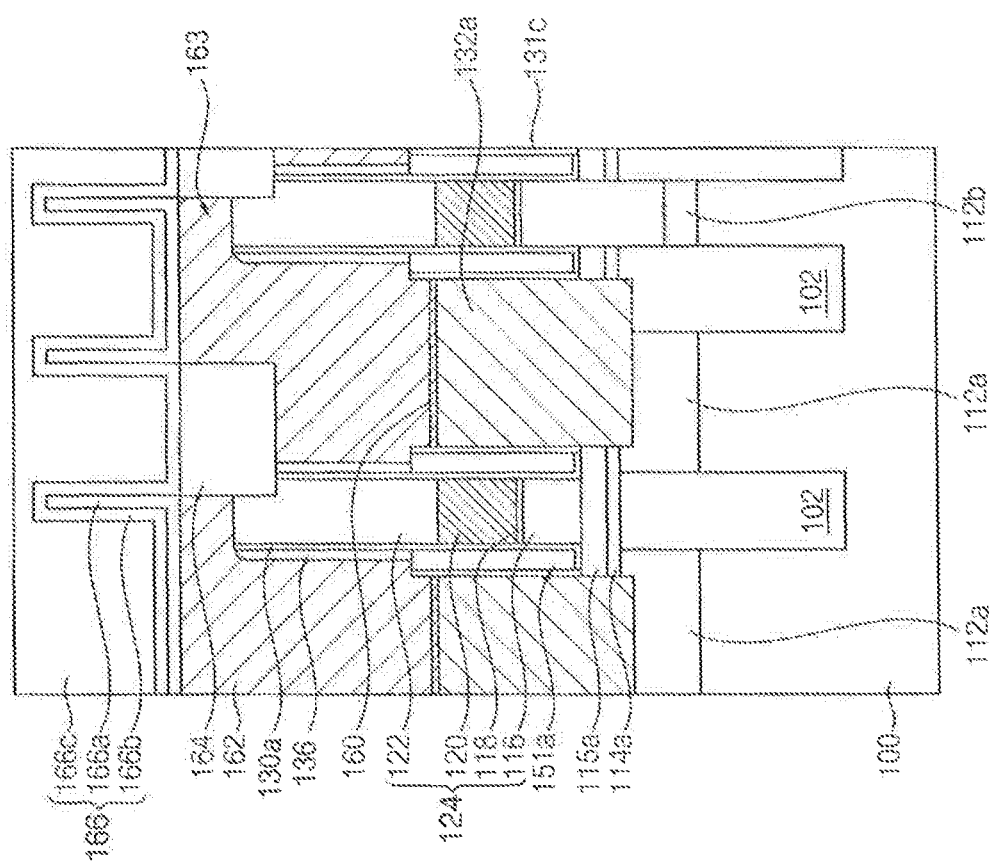

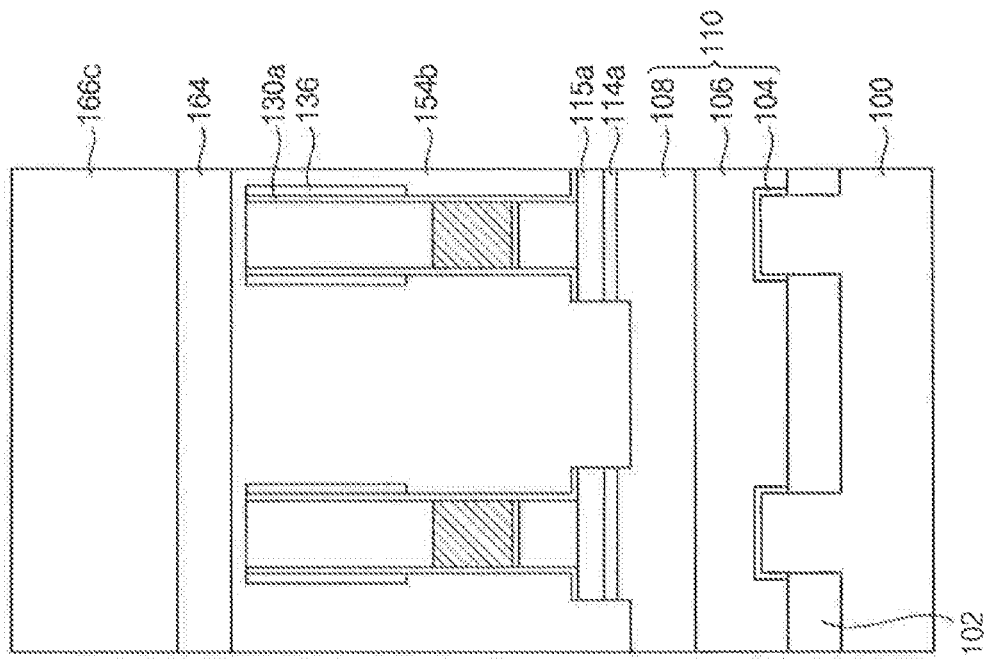
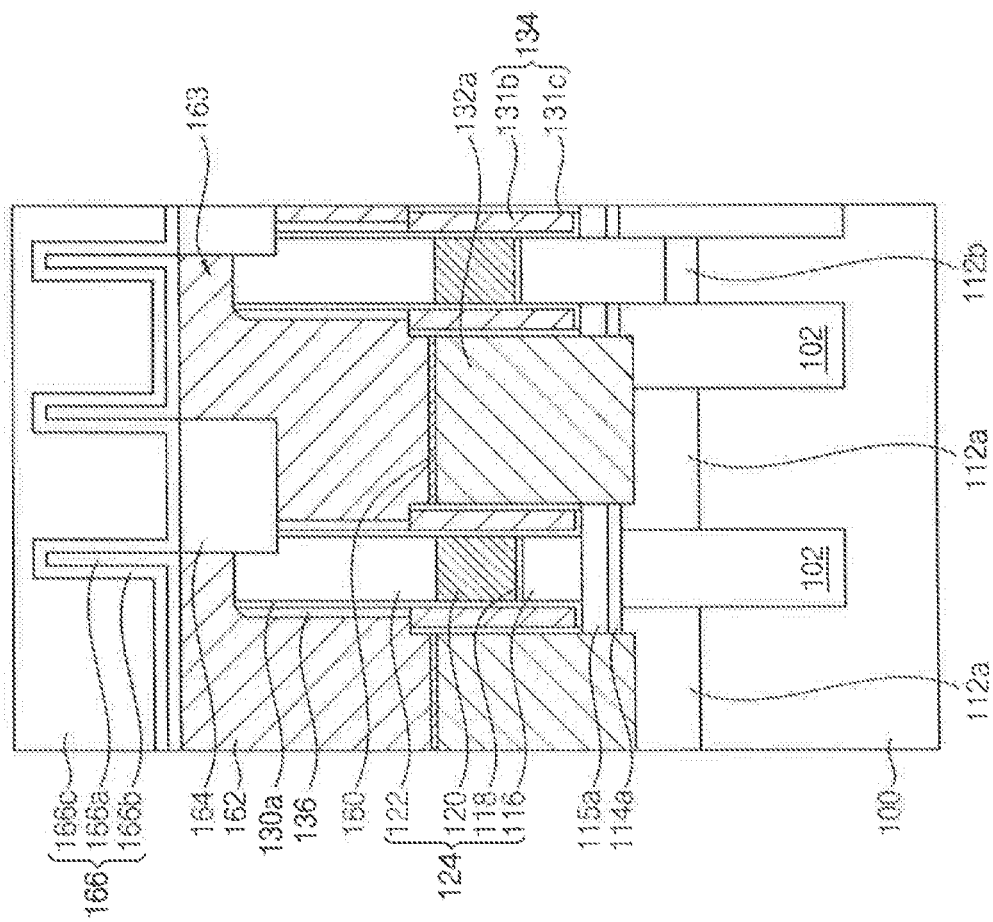
FIG. 43

SEMICONDUCTOR DEVICES

CROSS-REFERENCE TO RELATED APPLICATIONS

This application is a continuation of U.S. patent application Ser. No. 16/134,252 filed on Sep. 18, 2018, which claims priority under 35 USC § 119 from Korean Patent Application No. 10-2017-0154317, filed on Nov. 17, 2017 in the Korean Intellectual Property Office (KIPO), the contents of which are incorporated herein by reference in their entireties.

1. TECHNICAL FIELD

Example embodiments of the inventive concept relate to the integration of semiconductor devices and methods of manufacturing the same. More particularly, example embodiments of the inventive concept relate to a wiring structure of semiconductor devices including a conductive structure and methods of manufacturing the same.

2. DISCUSSION OF THE RELATED ART

As semiconductor devices have become more highly integrated, the aspect ratios of wirings, such as a bit line structures, increase. Thus, there may be difficulty in forming contact structures between the wirings.

SUMMARY

Example embodiments of the inventive concept provide a semiconductor device including a wiring structure having a reduced capacitance and a low resistance.

According to example embodiments of the inventive concept, there is provided a semiconductor device. The semiconductor device includes a plurality of conductive structures arranged on a substrate and spaced apart from each other in a second direction substantially perpendicular to a first direction, each of the plurality of conductive structures extending in the first direction; a plurality of contact structures arranged between the conductive structures in an alternating arrangement and spaced apart from each other in the first direction; a plurality of insulation structures, each one of the insulation structures arranged in a space between the alternating arrangement of the conductive structures and the contact structures; and spacers arranged between the alternating arrangement of the conductive structures and the contact structures, respectively and the spacers are spaced apart from each other in the first direction.

According to example embodiments of the inventive concept, there is provided a semiconductor device. The semiconductor device includes a plurality of conductive structures arranged on a substrate and spaced apart from each other in a second direction substantially perpendicular to a first direction, each of the plurality of conductive structures extending in the first direction, each of the plurality of the conductive structures including a conductive pattern and a first mask pattern stacked on each other; a plurality of contact structures arranged between the conductive structures in an alternating arrangement to contact a surface of the substrate and the plurality of contact structures spaced apart from each other in the first direction; a plurality of insulation structures, each one of the insulation structures arranged in a space between the alternating arrangement of the plurality of conductive structures and the plurality of contact structures, each of the plurality of insulation structures including an air gap therein; and air spacers arranged between a lower portion of the plurality of conductive structures and the plurality of contact structures, respectively; and wherein the air spacers and the air gap face a conductive pattern of the conductive structure.

According to example embodiments of the inventive concept, there is provided a semiconductor device. The semiconductor device includes a plurality of conductive structures arranged on a substrate and spaced apart from each other in a second direction substantially perpendicular to a first direction, each of the plurality of conductive structures extending in the first direction; a plurality of contact structures arranged between the conductive structures in an alternating arrangement and spaced apart from each other in the first direction, each of the plurality of the contact structures having an upper surface lower than an upper surface of each of the plurality of conductive structures; a plurality of insulation structures arranged in a space between the alternating arrangement of the plurality of conductive structures and plurality of the contact structures, respectively; and air spacers arranged between a lower portion of each of the plurality of conductive structures and the plurality of contact structures, and spaced apart from each other in the first direction.

According to example embodiments of the inventive concept, an air space may be provided between a conductive structure and a contact structure, and an air gap may be provided between the conductive structure and an insulation structure, to reduce a parasitic capacitance.

According to example embodiments of the inventive concept, the spacers comprise air spacers.

According to example embodiments of the inventive concept, the spacers are filled with an insulating material including at least one of silicon nitride and silicon oxide.

According to example embodiments of the inventive concept, the air spacers comprise first air spacers arranged between the alternating arrangement of the conductive structures and the contact structures, and further comprising second air spacers arranged between the plurality of conductive structures and the plurality of insulation structures.

BRIEF DESCRIPTION OF THE DRAWINGS

Example embodiments of the inventive concept will be more clearly understood by a person of ordinary skill in the art from the following detailed description taken in conjunction with the accompanying drawings. FIGS. 1 to 47 represent non-limiting, example embodiments of the inventive concept as described herein.

FIGS. 1 to 3 are cross-sectional views and plan views illustrating a semiconductor device in accordance with example embodiments of the inventive concept in which:

FIG. 1 is a plan view illustrating a vertical type semiconductor device;

FIG. 2 is a cross-sectional view taken along a line I-I' in FIG. 1; and

FIG. 3 is a cross-sectional view taken along a line II-II' in FIG. 1;

FIGS. 4 to 18 are cross-sectional views and plan views illustrating a method of manufacturing a semiconductor device in accordance with example embodiments of the inventive concept in which:

FIG. 4 is a cross-sectional view taken along a line in FIG. 1;

FIG. 5 shows the forming of an isolation layer by a trench isolation process.

FIG. 6 shows the formation of a first insulation layer pattern and a second insulation layer pattern.

FIGS. 7 and 8 shows different views of the formation of a first preliminary polysilicon pattern to fill a lower portion of the second preliminary trench.

FIG. 9 shows the first preliminary spacer and the second preliminary spacer have been removed.

FIGS. 10 and 11 show the formation of a second preliminary polysilicon pattern on the first preliminary polysilicon pattern.

FIGS. 12 and 13 show third mask patterns formed on the preliminary polysilicon structure and the bit line structure.

FIGS. 14 and 15 are plan and cross-sectional views showing the first spacers on both sides of the bit line structure are removed.

FIG. 16 shows an air gap in the insulation structure.

FIGS. 17 and 18 show plan and cross-sectional views of an insulation layer may be formed on the bit line structure and the preliminary contact structure to fill the second opening.

FIGS. 19 to 21 are cross-sectional views and plan views illustrating a method of manufacturing a semiconductor device in accordance with example embodiments of the inventive concept in which:

FIG. 19 shows a mold layer formed on the bit line structure to fill the preliminary trench;

FIG. 20 shows the mold pattern is removed; and

FIG. 21 shows a polysilicon layer formed on the bit line structures to fill the second preliminary trench between the bit line structures.

FIG. 22 is a cross-sectional view illustrating a second mask pattern is provided on an upper sidewall of a bit line structure of a semiconductor device in accordance with example embodiments of the inventive concept.

FIG. 23 is a cross-sectional view illustrating formation of a first spacer and a second spacer may be formed on a lower sidewall of the bit line structure according to a method of manufacturing a semiconductor device in accordance with example embodiments of the inventive concept.

FIG. 24 is a cross-sectional view illustrating formation of a mold layer on the bit line structure to fill the preliminary trench according to a method of manufacturing a semiconductor device in accordance with example embodiments of the inventive concept.

FIG. 25 is a cross-sectional view illustrating an upper surface of the contact structure positioned lower than an upper surface of an air spacer of a semiconductor device in accordance with example embodiments of the inventive concept.

FIGS. 26 to 30 are cross-sectional views illustrating a method of manufacturing a semiconductor device in accordance with example embodiments of the inventive concept in which:

FIG. 26 shows a mold layer formed on a first preliminary polysilicon pattern and a bit line structure;

FIG. 27 shows third mask patterns may be formed on the mold layer;

FIG. 28 shows the first preliminary polysilicon pattern etched using the mold pattern and the third mask pattern as an etching mask to form a pillar-shaped contact structure;

FIG. 29 shows the first and second spacers in both sides of the bit line structure have been removed; and FIG. 30 shows an insulation layer formed on the bit line structure and the mold pattern to fill the second opening.

FIG. 31 is a cross-sectional view illustrating a second mask pattern provided on an insulation liner on an upper sidewall of a bit line structure of a semiconductor device in accordance with example embodiments of the inventive concept.

FIGS. 32 and 33 are cross-sectional views illustrating a first air spacer provided between a contact structure and a bit line structure in a semiconductor device in accordance with example embodiments of the inventive concept.

FIGS. 34 to 36 are cross-sectional views illustrating a method of manufacturing a semiconductor device in accordance with example embodiments of the inventive concept in which:

FIG. 34 shows a third insulation layer formed to fill the first opening between the preliminary contact structures and the bit line structures;

FIG. 35 shows the first spacer on both sidewalls of the bit line structure has been removed; and FIG. 36 shows a fourth insulation layer formed on the bit line structure and the insulation structure.

FIGS. 37 to 39 are cross-sectional views illustrating a semiconductor device in accordance with example embodiments of the inventive concept in which:

FIG. 37 shows an upper surface of a contact structure 132a may be positioned lower than an upper surface of a first air spacer, and the upper surface of the contact structure 132a may be positioned lower than a bottom surface of a second mask pattern;

FIG. 38 shows a second mask pattern 136 may be provided on an upper sidewall of a bit line structure; and FIG. 39 shows a spacer structure is provided between the contact structure and the bit line structures.

FIG. 40 is a cross-sectional view illustrating an insulation layer formed on the bit line structures and the preliminary contact structure to fill the second opening according to a method of manufacturing the semiconductor device in FIG. 39.

FIG. 41 is a cross-sectional view illustrating a spacer structure provided between the bit line structure and the contact structure, and between the bit line structure and the insulation structure of a semiconductor device in accordance with example embodiments of the inventive concept.

FIG. 42 is a cross-sectional view illustrating an insulation layer formed on the bit line structure and the preliminary contact structure to fill the first opening according to a method of manufacturing the semiconductor device in FIG. 41.

FIGS. 43 to 45 are cross-sectional views illustrating a semiconductor device in accordance with example embodiments of the inventive concept and a method of manufacturing the same in which:

FIG. 43 shows a spacer structure provided between a contact structure and a bit line structure;

FIG. 44 shows the first spacer in both sides of the bit line structure has been removed; and FIG. 45 shows the preliminary polysilicon pattern is etched using the mold pattern and the third mask pattern as an etching mask.

FIGS. 46 and 47 are cross-sectional views illustrating a semiconductor device in accordance with example embodiments of the inventive concept and a method of manufacturing the same in which:

FIG. 46 shows a spacer structure is provided between the bit line structure and the contact structure, and between the bit line structure and the insulation structure; and FIG. 47 shows the preliminary polysilicon structure has been etched using the mold pattern and the third mask pattern as an etching mask.

DETAILED DESCRIPTION OF EMBODIMENTS

Hereinafter, example embodiments of the inventive concept will be described more fully with the accompanying drawings.

Figure 1:
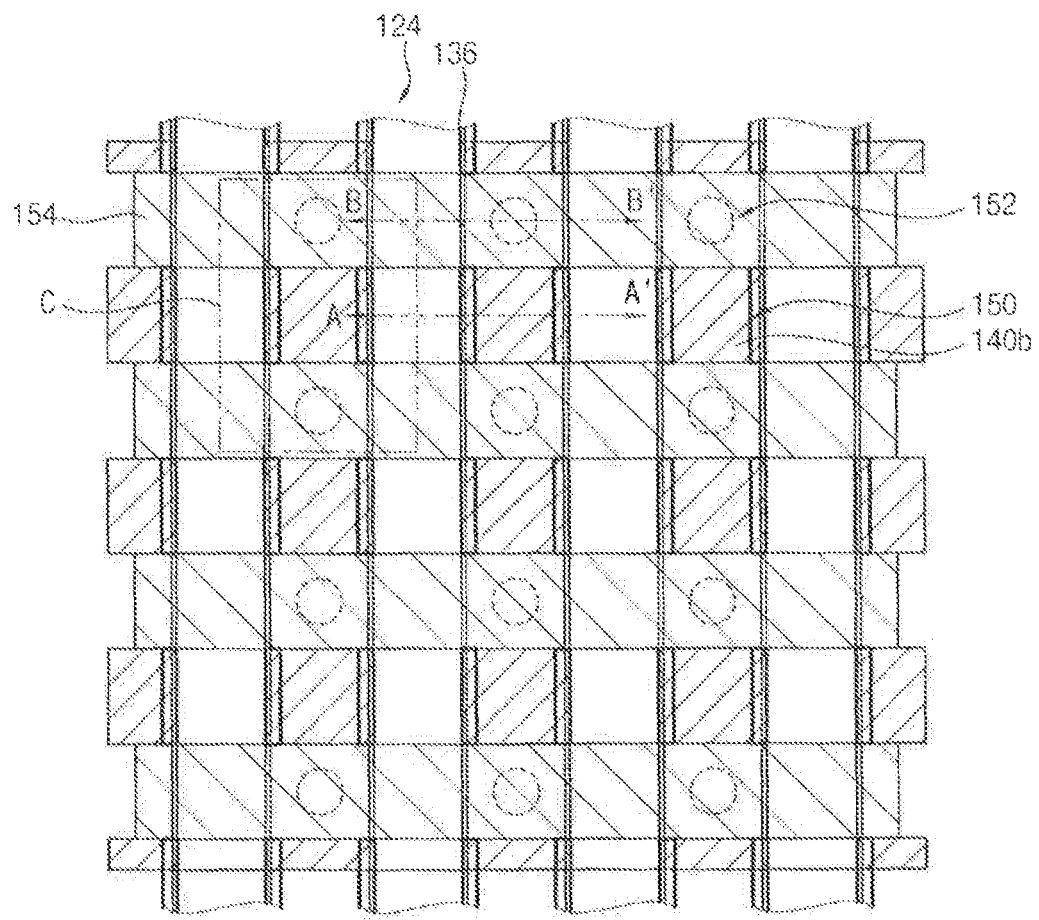
Figure 2:
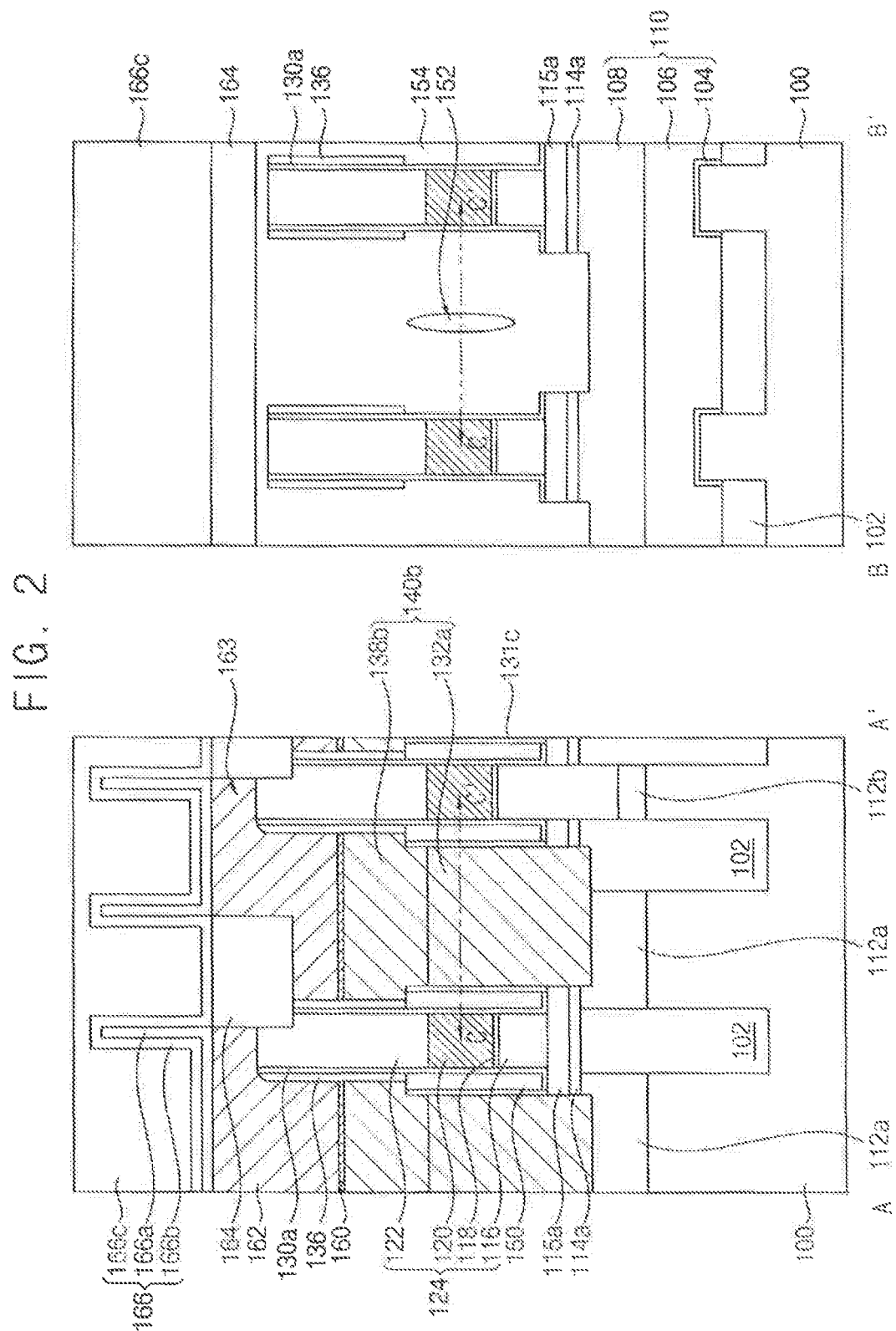
Figure 3:
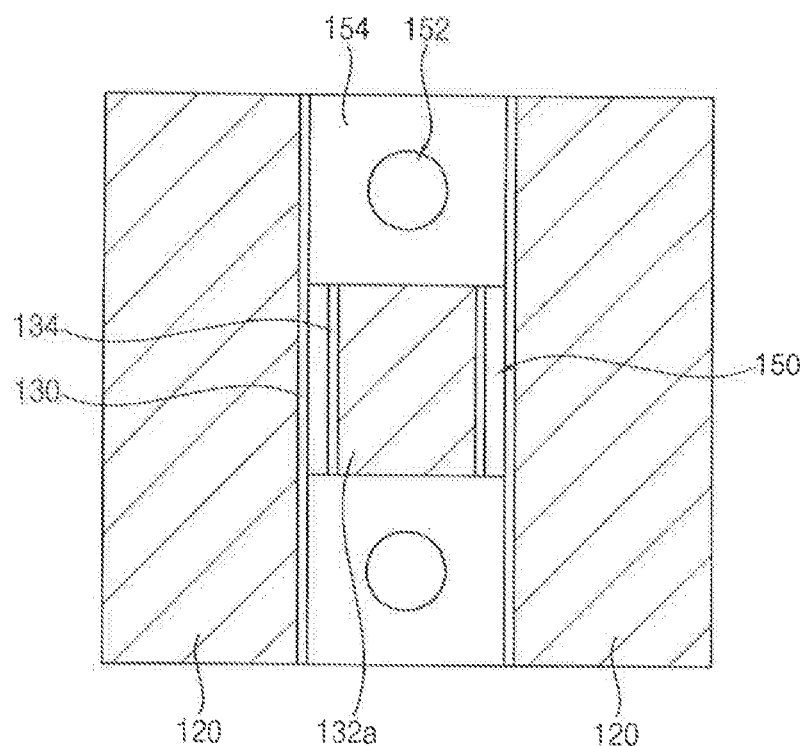

FIGS. 1 to 3 are cross-sectional views and plan views illustrating a semiconductor device in accordance with example embodiments of the inventive concept.

With regard to the cross-sectional views, in FIG. 2 the left figure is a cross-sectional view taken along a line A-A' in FIG. 1 and the right figure is a cross-sectional view taken along a line B-B' in FIG. 1. FIG. 3 is a plan view taken along a line C-C' in FIG. 2. FIG. 3 illustrates a portion C in FIG. 1.

Figure 4:
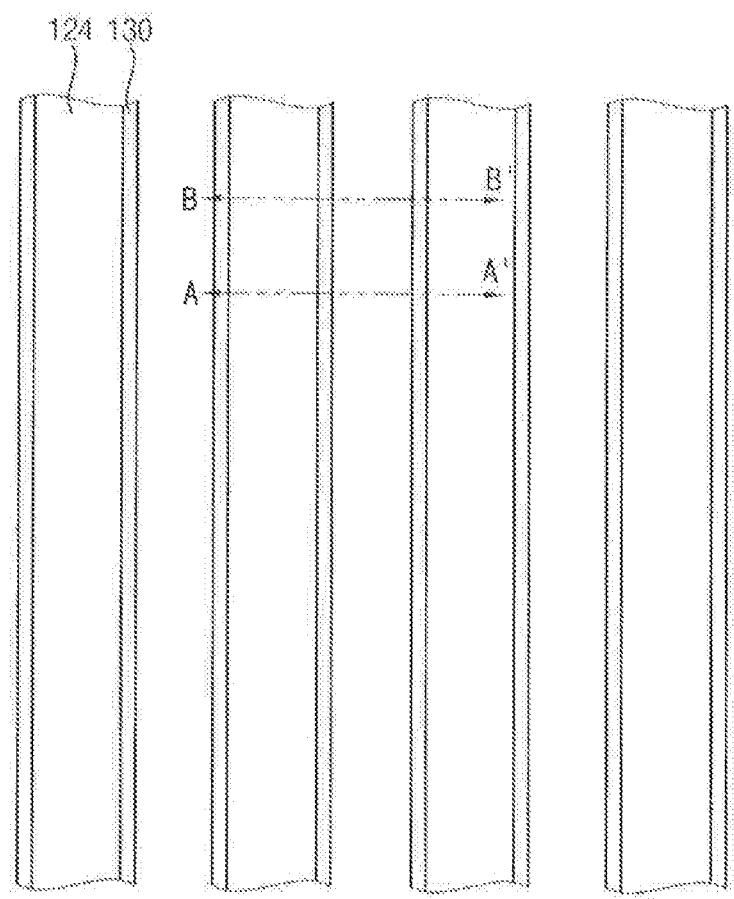

FIG. 1 is a plan view illustrating a vertical type semiconductor device in accordance with example embodiments of the inventive concept. FIGS. 2, 3 and 4 are cross-sectional views illustrating a vertical type semiconductor device in accordance with example embodiments of the inventive concept. FIG. 2 is a cross-sectional view taken along a line I-I' in FIG. 1, FIG. 3 is a cross-sectional view taken along a line II-II' in FIG. 1, and FIG. 4 is a cross-sectional view taken along a line in FIG. 1.

Referring to FIGS. 1 to 3, a semiconductor device may include a semiconductor substrate 100, a gate structure 110, a bit line structure 124, an insulation structure 154 and a contact structure 140b. An air spacer 150 may be provided between the bit line structure 124 and the contact structure 140b. The semiconductor device may further include an air gap 152 in the insulation structure 154. The semiconductor device may further include a pad structure 163 and a capacitor 166 electrically connected to the contact structure 140b.

The semiconductor substrate 100 may include an isolation layer 102, and thus, a region of the semiconductor substrate where the isolation layer 102 is formed may be defined as a field region, and a region of the semiconductor substrate where the isolation layer 102 is not formed may be defined as an active region. The isolation region 102 may include, for example, an oxide such as silicon oxide.

The gate structure 110 may be buried in an upper portion of the semiconductor substrate 100. The gate structure 110 may include a gate insulation layer 104, a gate electrode 106 and a capping pattern 108 stacked on each other. The gate insulation layer 104 may have a shape surrounding a sidewall and a bottom surface of the gate electrode 106. In example embodiments of the inventive concept, the gate structure 110 may extend in a second direction, and a plurality of the gate structures 110 may be arranged in the first direction. First impurity region 112a and second impurity region 112b may be provided in the active region adjacent to the gate structure 110. The gate structure 110 and the first impurity region 112a and the second impurity regions 112b may be defined as a transistor. In example embodiments, the first impurity region 112a may be electrically connected to the capacitor 166, and the second impurity region 112b may be electrically connected to the bit line structure 124.

A first insulation layer pattern 114a and a second insulation layer pattern 115a may be stacked on the semiconductor substrate 100. The first insulation layer pattern 114a and the second insulation layer pattern 115a may expose an upper portion of the second impurity regions 112b.

The bit line structure 124 may be provided on the second insulation layer pattern 115a and the second impurity region 112b, and may have a linear shape extending in the first direction. The bit line structure 124 may have a stacked structure of a conductive pattern structure and a first mask pattern 122. In example embodiments of the inventive concept, the conductive pattern structure may have a stacked structure of a polysilicon pattern 116, a barrier pattern 118 and a metal pattern 120. The first mask pattern may include, for example, silicon nitride.

An insulation liner 130a may be provided on a sidewall of the bit line structure 124. The insulation liner 130a may include, for example, silicon nitride.

A second mask pattern 136 may be provided on an upper sidewall of the first mask pattern 122. In some example embodiments of the inventive concept, the second mask pattern 136 may be formed on the insulation liner 130a. In some example embodiments of the inventive concept, the second mask pattern may have a uniform thickness in the second direction.

A plurality of the bit line structures 124 may be spaced apart from each other in the second direction perpendicular to the first direction. The first impurity region 112a may be exposed between the bit line structures 124. In example embodiments of the inventive concept, the first impurity regions 112a may be arranged side-by-side in the second direction.

The contact structure 140b may be provided between the bit line structures 124, and may make contact with the first impurity region 112a. In example embodiments, the contact structures 140b may be arranged side by side in the first direction and the second direction respectively.

The contact structure 140b may have a stacked structure comprised of a first polysilicon pattern 132a and a third polysilicon pattern 138b. In some example embodiments of the inventive concept, an upper surface of the first polysilicon pattern 132a may be positioned lower than a lower surface of the second mask pattern 136. As the air spacers 150 are formed only on a sidewall of the contact structure 140b, the air spacers 150 may be spaced apart from each other in the first direction. The air spacer 150 may have a longer length in the first direction than the second direction. A width in the second direction of the air spacer 150 may be greater than a width in the second direction of the second mask pattern 136.

The insulation structure 154 may be arranged in an isolated region between the bit line structures 124 and between the contact structures 140b. The insulation structures 154 may be arranged side-by-side in the first direction and the second direction respectively. For example, the insulation structure 154 and the contact structure 140b may be arranged repeatedly in the first direction. The insulation structure 154 may make contact with underlying insulation materials.

In example embodiments of the inventive concept, an upper surface of the insulation structure 154 may be substantially coplanar with the upper surface of the bit line structure. A second opening which is filled with the insulation structure may have a lower portion having a first width, a middle portion having a second width greater than the first width, and an upper portion having a third width less than the second width. In example embodiments of the inventive concept, the middle portion may face a conductive structure of the bit line structure. The upper portion may be positioned higher than the lower surface of the second mask pattern.

The insulation structure 154 may include the air gap 152 therein. In example embodiments of the inventive concept, the air gap 152 may be positioned corresponding to the middle portion of the second opening. Accordingly, the air gap 152 may face the conductive structure. For example, the insulation structure 154 may be formed on a sidewall of the middle portion of the second opening, and the air gap 152 as an empty space may be formed in the middle region of the middle portion of the second opening.

As described above, the air spacer 150 may be provided between the contact structure 140b and the bit line structure 124b. The air gap 152 may be provided in the middle region in the insulation structure 154 between the bit line structures 124 to face the conductive structure. Accordingly, when one contact structure 140b is view in the plan view, the air spacers 150 may be provided in both sides of the contact structure 140b in the second direction, and the air gaps 152 may be provided in both sides of the contact structure 140b in the first direction. The air spacers 150 and the air gaps on the sidewall of the contact structure 140b may be spaced apart from each other.

The pad structure 163 on the contact structure 140b may include a metal silicide layer 160 and a metal pattern 162. In addition, as the cross-section in the second direction of the contact structure 140b may have a "T" shape, the contact structure 140b may have a relatively wide top surface. Accordingly, a contact resistance between the contact structure 140b and the pad structure 163. In embodiment of the inventive concept, the metal silicide layer 160 may include cobalt silicide, tungsten silicide, etc, and the metal pattern 162 may include tungsten. The metal pattern may make contact with the contact structure 140b and may be formed on the upper surface of the bit line structure 124. When viewed in a plan view, the arrangement of the metal patterns 162 may be a honeycomb pattern such that the metal patterns 162 may be arranged at vertices and the center of hexagon respectively.

By the arrangement of the air spacer 150 and the air gap 152 in the embodiments of the inventive concept, a parasitic capacitance between the bit line structures 124 and the contact structures 140b may be reduced or eliminated. Thus, the semiconductor device may have excellent electrical properties.

FIGS. 4 to 18 are cross-sectional views and plan views illustrating a method of manufacturing a semiconductor device in accordance with example embodiments of the inventive concept.

Referring now to FIGS. 4 and 5, a trench isolation process may be performed on a semiconductor substrate 100 to form an isolation layer 102. Accordingly, the semiconductor substrate 100 may be divided into an active region and an isolation region by the isolation layer 102. Transistors may be formed in the semiconductor substrate 100. Each of the transistors may include a gate structure 110 and first impurity region 112a and the second impurity region 112b.

A portion of the semiconductor substrate 100 may be partially etched to form a gate trench, and a gate insulation layer 104, a gate electrode 106 and a capping pattern 108 may be formed within the gate trench to form the gate structure 110. The capping pattern may include silicon nitride. The gate structure 110 may extend in a second direction across the active region and the isolation region.

The first impurity region 112a and the second impurity regions 112b may be positioned under a surface of the semiconductor substrate 100 in both sides of the gate structure 110. The first impurity region 112a may be electrically connected to a capacitor, and the second impurity region 112b may be electrically connected to a bit line structure.

A first insulation layer and a second insulation layer may be formed sequentially on the semiconductor substrate 100 and the capping pattern 108, and may be patterned by a photolithography process to form a first preliminary insulation layer pattern 114 and a second preliminary insulation layer pattern 115. The second insulation layer may be formed of a material having an etch selectivity with respect to the first insulation layer. For example, the first insulation layer may be formed of silicon oxide, and the second insulation layer may be formed of silicon nitride. The first preliminary insulation layer pattern 114 and the second preliminary insulation layer pattern 115 may be arranged to selectively expose a surface of the second impurity region 112b.

Bit line structures 124 may be formed on the second preliminary insulation layer pattern 115 and the semiconductor substrate 100. The bit line structures 124 may have a linear shape extending in a first direction, and may be spaced apart from each other in the second direction.

In addition, a polysilicon layer, a barrier layer and a metal layer may be formed sequentially on the second preliminary insulation layer pattern 115, and a first mask pattern 122 may be formed on the metal layer. The polysilicon layer may be formed on the second preliminary insulation layer pattern 115 to make contact with the surface of the second impurity region 112b. The metal layer, the barrier layer and the polysilicon layer may be sequentially etched using the first mask pattern 122 as an etching mask. Accordingly, the bit line structure 124 including a conductive pattern structure having a polysilicon pattern 116, a barrier pattern 118 and a metal pattern 120 stacked on each other and a first mask pattern 122 may be formed. The second preliminary insulation layer pattern 115 may be exposed between the bit line structures 124.

A liner layer may be formed on a surface of the bit line structure 124 and a surface of the second preliminary insulation layer pattern 115. A first spacer layer and a second spacer layer may be formed on the liner layer. In example embodiments of the inventive concept, the liner layer and the second spacer layer may include silicon nitride, and the first spacer layer may include silicon oxide. A thickness of the first spacer layer may be greater than thicknesses of the first liner layer and the second spacer layer. The liner layer, the first spacer layer and the second spacer layer may be anisotropically etched to form an insulation liner 130a on a sidewall of the bit line structure 124, and a first preliminary spacer structure 130 including a first preliminary spacer 130b and a second preliminary spacer 130c.

As illustrated in FIG. 4, the first preliminary spacer structure 130 may have a linear shape extending in the first direction. A first preliminary trench may be formed between the first preliminary spacer structures 130 to extend in the first direction. The second preliminary insulation layer pattern 115 may be exposed through a bottom surface of the first preliminary trench.

Referring to FIG. 6, the second preliminary insulation layer pattern 115 and the underlying first preliminary insulation layer pattern 114 exposes by the first preliminary trench may be etched, to form a first insulation layer pattern 114a and a second insulation layer pattern 115a. By the process, a second preliminary trench may be formed to extend in the first direction. The first impurity region 112a or the capping pattern 108 included in the gate structure 110 may be exposed through a bottom surface of the second preliminary trench.

Referring to FIGS. 7 and 8, a first preliminary polysilicon pattern 132 may be formed to fill a lower portion of the second preliminary trench.

For example, a first polysilicon layer may be formed on the bit line structure 124 to completely fill the second preliminary trench. The first polysilicon layer may be etch-backed to form a first preliminary polysilicon pattern 132 filling the lower portion of the second preliminary trench. In the etch-back process, the portion of the first polysilicon layer on the bit line structure may be removed.

In example embodiments of the inventive concept, an upper surface of the first preliminary polysilicon pattern 132 may be positioned lower than an upper surface of the conductive pattern structure of the bit line structure 124. In an embodiment of the inventive concept, the upper surface of the first preliminary polysilicon pattern 132 may be positioned lower than a middle portion in a vertical direction of the first mask pattern 122 of the bit line structure 124.

The first preliminary polysilicon pattern 132 may have a shape extending in the first direction.

Figure 9:
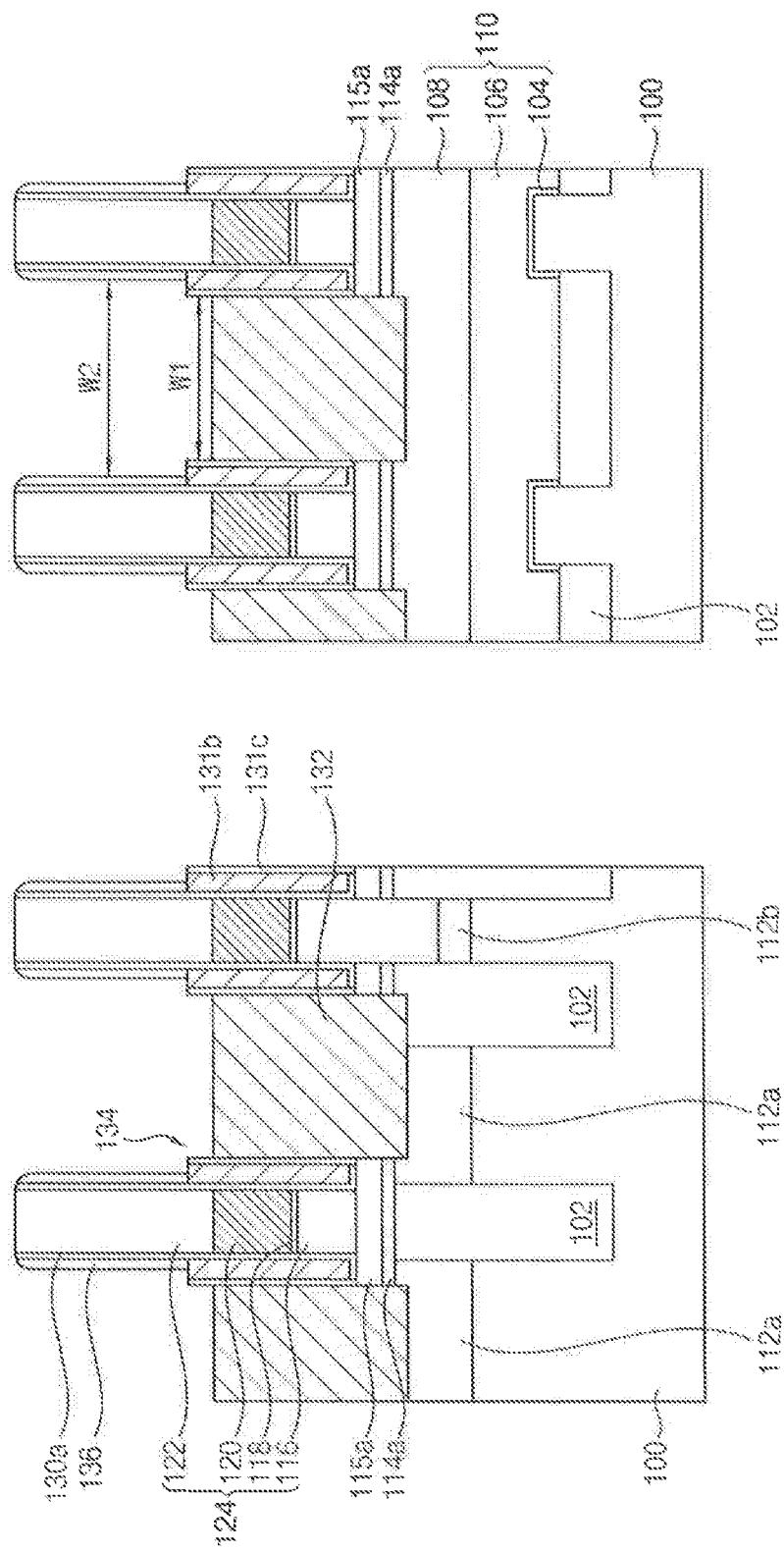

Referring now to FIG. 9, the second preliminary spacer 130c and the first preliminary spacer 130b exposed by the first preliminary polysilicon pattern 132 may be removed. Accordingly, a first spacer 131b and a second spacer 131c may be formed on a lower sidewall of the bit line structure 124. In example embodiments, upper surfaces of the first spacer 131b and the second spacer 131c may be positioned higher than the upper surface of the conductive pattern structure. Accordingly, a spacer structure 134 having the insulation liner 130a and the first spacer 131b and the second spacer 131c may be formed on the lower sidewall of the bit line structure.

When the portions of the first preliminary spacer 130b and the second preliminary spacer 130c are removed, the upper surface of the first preliminary polysilicon pattern 132 may be partially removed. Accordingly, the upper surface of the first preliminary polysilicon pattern 132 may be reduced to be lower than upper surfaces of the first spacer 131b and the second spacer 131c.

A second mask layer may be formed along the surfaces of the insulation liner 130a, the first spacer 131b and the second spacer 131c, the first preliminary polysilicon pattern 132 and the bit line structure 124. The second mask layer may be formed to have a thickness less than a thickness in the second direction of the first spacer 131b. The second mask layer may be anisotropically etched. Accordingly, a second mask pattern 136 may be formed on the insulation liner 130a on an upper sidewall of the bit line structure 124. The second mask pattern 136 may include a material the same as the insulation liner 130a. For example, the second mask pattern 136 may include silicon nitride.

The insulation liner 130a and the second mask pattern 136 may be stacked on the upper sidewall of the bit line structure 124. A sum of the thicknesses of the insulation liner 130a, the first spacer 131b and the second spacer 131c on the lower sidewall of the bit line structure 124 may be greater than a sum of the thicknesses of the insulation liner 130a and the second mask pattern 136 on the upper sidewall of the bit line structure 124. Accordingly, an upper width W2 in the second direction between the bit line structures 124 may be greater than a lower width W1 in the second direction between the bit line structures 124.

Figure 10:
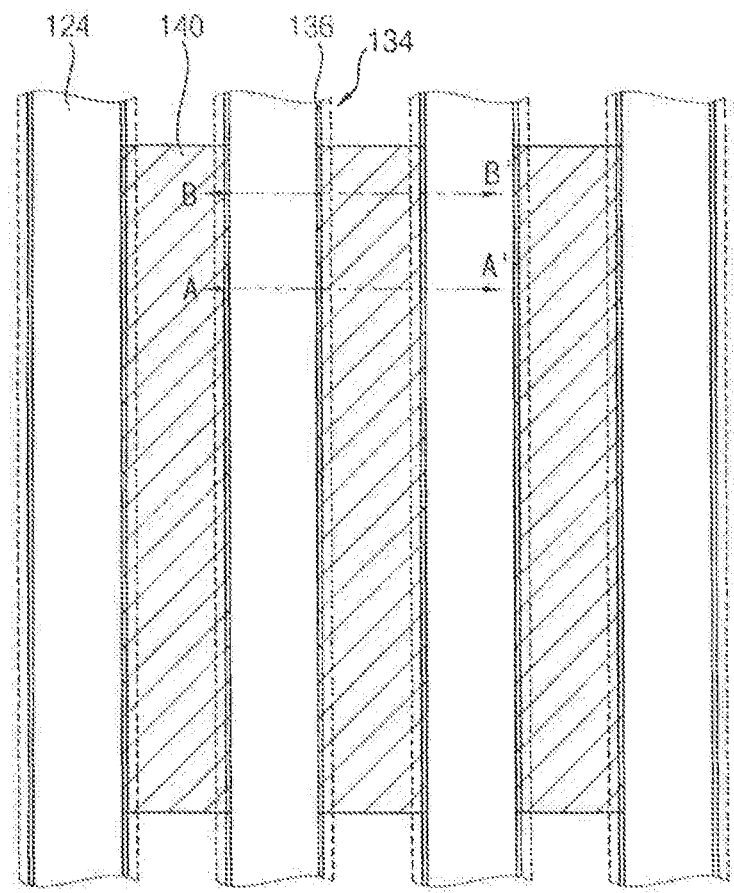
Figure 11:
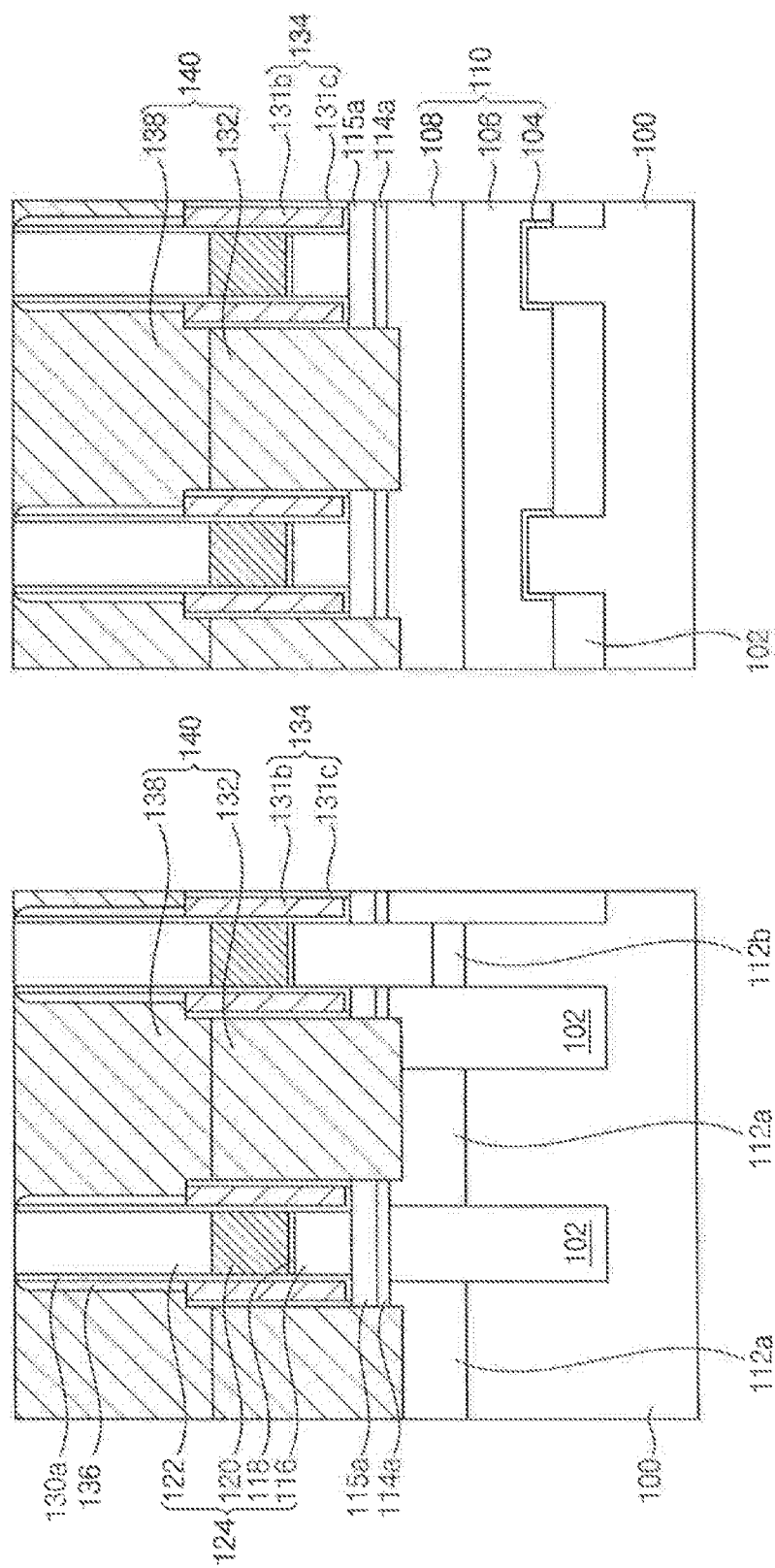

Referring to FIGS. 10 and 11, a second preliminary polysilicon pattern 138 may be formed on the first preliminary polysilicon pattern 132.

For example, a second polysilicon layer may be formed on the first preliminary polysilicon pattern 132 and the bit line structure 24 to fill a gap between the bit line structures 124. Then, the second polysilicon layer may be planarized until the upper surface of the bit line structure is exposed, to form the preliminary polysilicon pattern 138 on the first preliminary polysilicon pattern 132. Accordingly, a preliminary polysilicon structure 140 including the first and second preliminary polysilicon patterns 132, 138 stacked on each other may be formed. The planarization process may include a chemical mechanical polishing process or an etch-back process.

The preliminary polysilicon structure 140 may have a shape extending in the first direction. The preliminary polysilicon structure 140 may have a T shape when viewed from a cross-sectional view taken along the second direction.

Since the first and second preliminary polysilicon structures 132, 138 are formed by separate deposition processes respectively, there may be an interface arranged between the first preliminary polysilicon structure 132 and the second preliminary polysilicon structures 138.

Figure 12:
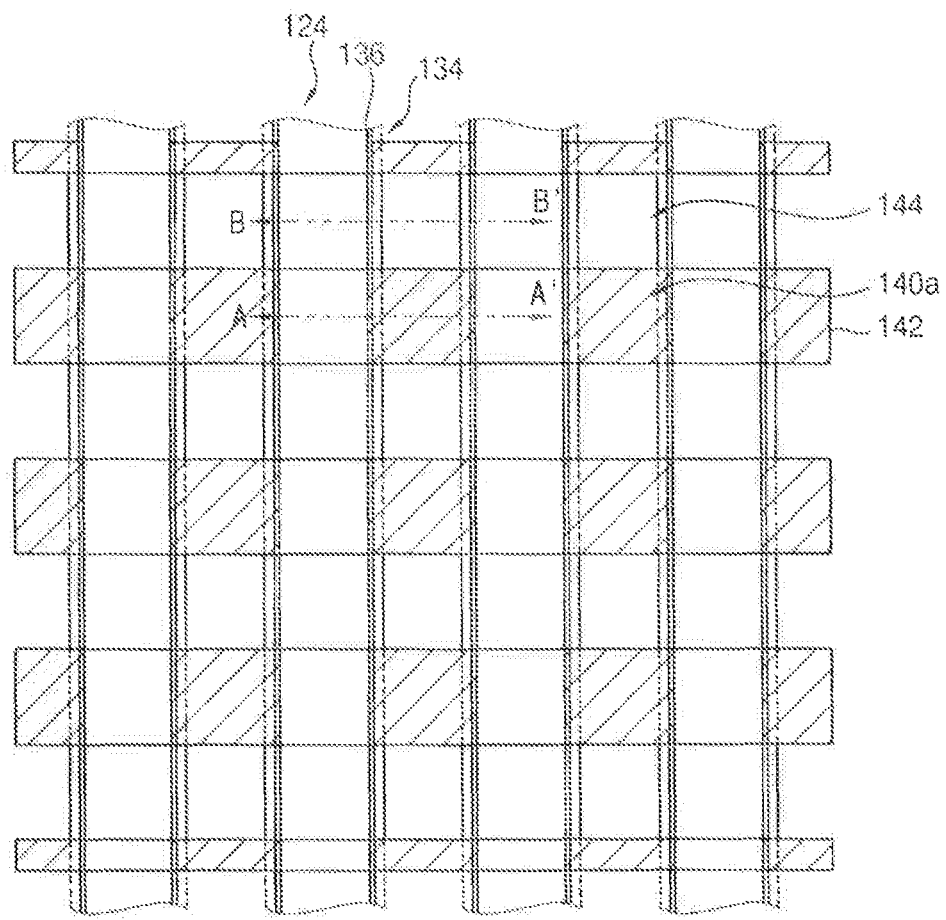
Figure 13:
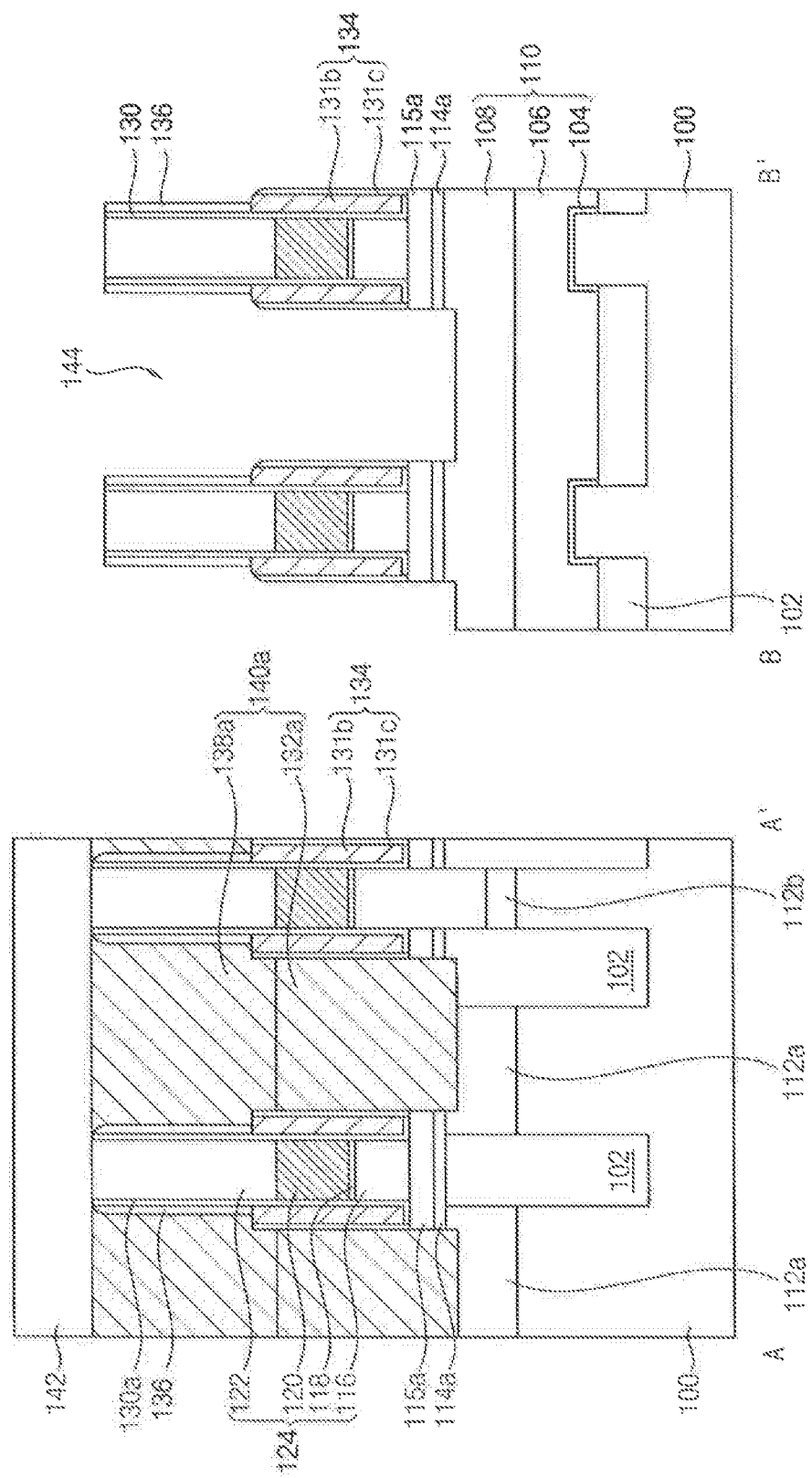

Referring to FIGS. 12 and 13, third mask patterns 142 may be formed on the preliminary polysilicon structure 140 and the bit line structure 124. The third mask pattern 142 may have a linear shape extending in the second direction. The third mask patterns 142 may be spaced apart from each other in the first direction. Accordingly, a portion between the third mask patterns 142 and the bit line structures 124 may have an isolated shape.

A portion between the bit line structures 124 covered by the third mask pattern 142 may face the first impurity region 112a in the vertical direction. For example, the portion between the bit line structures 124 covered by the third mask pattern 142 may correspond to a region where a contact structure is formed.

The preliminary polysilicon structure 140 may be etched using the third mask pattern 142 as an etching mask. By the process, the preliminary polysilicon structure 140 may be patterned, to form preliminary contact structures 140a having a pillar shape, which makes contact with the first impurity region 112a. The preliminary contact structure 140a may include a first polysilicon pattern 132a and a second polysilicon pattern 138a.

Additionally, a first opening 144 having an isolated shape may be formed between the preliminary contact structures 140a and the bit line structures 124. The capping pattern 108 may be exposed through a bottom surface of the first opening 144. During the etch process, the upper portion of the bit line structure 124 exposed by the third mask pattern 142 may be partially etched, and thus, the height of the bit line structure 124 may be reduced.

The preliminary contact structure 140a may be embossed by etching the preliminary polysilicon structure 140 having the linear shape. The second mask pattern 136 and the second spacer 131c may be exposed through a sidewall of the first opening 144 having the isolated shape.

The first spacer 131b and the second spacer 131c may have a linear shape extending in the first direction. A first portion of the first spacer 131b and the second spacer 131c interposed between the preliminary contact structure 140a and the bit line structure 124 and a second portion of the first spacer 131b and the second spacer 131c exposed by the sidewall of the first opening 144 may be arranged repeatedly.

Figure 15:
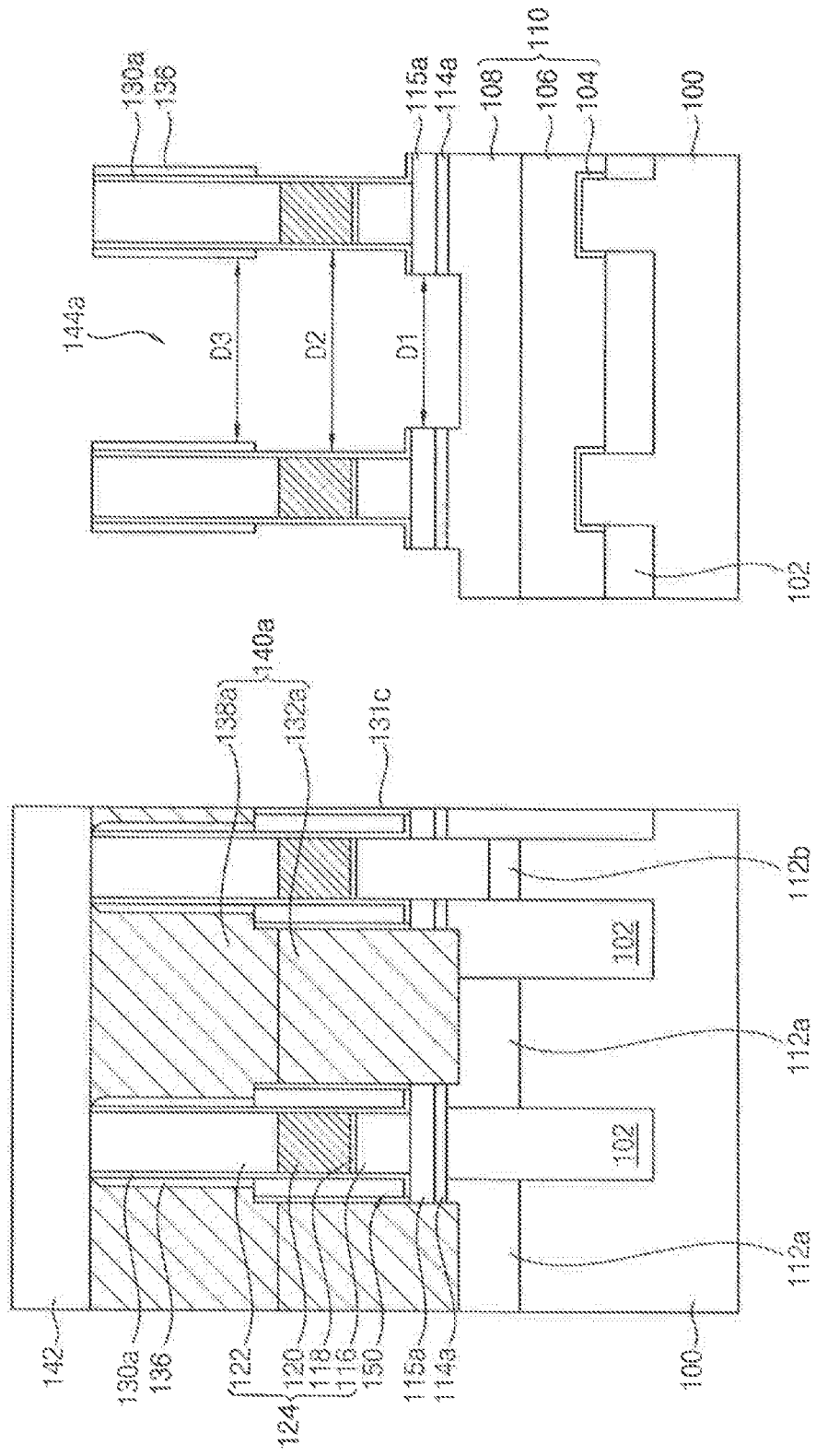
Figure 16:
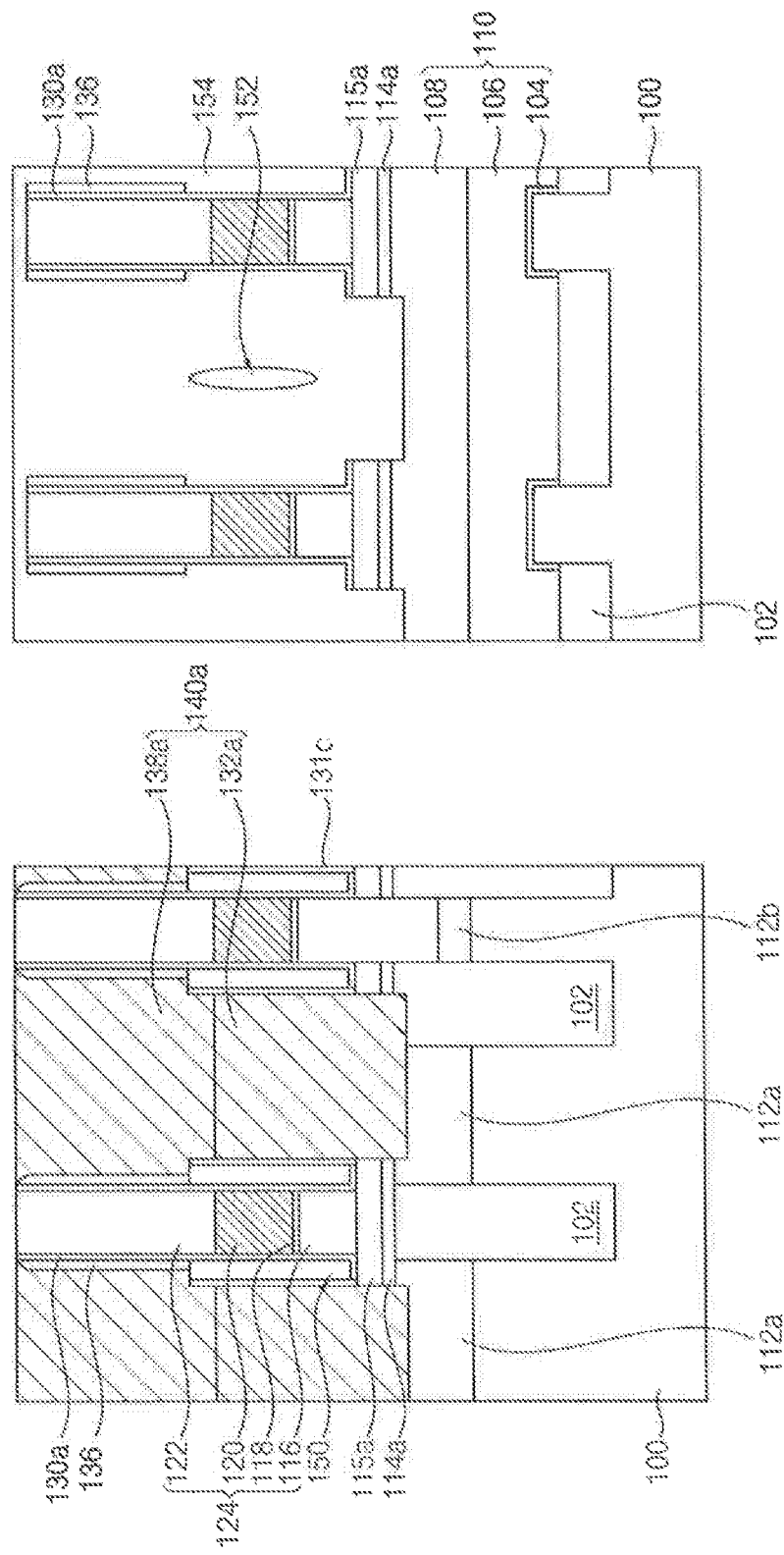

Referring now to FIGS. 14 and 15, the first spacers 131b on both sides of the bit line structure 124 may be removed. The first spacer 131b may be removed by an isotropic etch process.

Particularly, when the second spacer 131c and the first spacer 131b are removed through the sidewall of the first opening 144, the first spacer 131b between the preliminary contact structure 140a and the bit line structure 124 may be removed by an etching gas flowing in the first direction.

By the described process, as the first spacer 131b is removed, the inner width of the first opening 144 may be enlarged. Accordingly, a second opening 144a having different widths depending on its location may be formed. The insulation liner 130a may be exposed through a sidewall of the second opening 144a.

The second opening 144a may have a lower portion having a first width D1 in the second direction, a middle portion having a second width D2 greater than the first width D1 and an upper portion having a third width D3 less than the second width D2. Here, the portion of the second opening 144a formed by removing the first spacer 131b may correspond to the middle portion. The middle portion of the second opening 144a may face the sidewall of the conductive pattern structure of the bit line structure 124. An upper surface of the middle portion may be positioned higher than the upper surface of the conductive pattern structure.

As the first spacer 131b between the preliminary contact structure 140a and the bit line structure 124 is removed, an air spacer 150 may be formed between the preliminary contact structure 140a and the bit line structure 124. The air spacer 150 may face the preliminary contact structure 140a. Accordingly, the air spacers 150 may be spaced apart from each other in the first direction. The air spacer 150 may have a longer length in the first direction. The air spacers 150 may be in communication with the second opening 144a.

In example embodiments of the inventive concept, the air spacer 150 may be an empty space surrounded by the insulation liner 130a, the second spacer 131c and the preliminary contact structure 140a. In example embodiments of the inventive concept, the upper surface of the air spacer 150 may be positioned higher than the upper surface of the conductive pattern structure of the bit line structure 124. Accordingly, a parasitic capacitance between the bit line structure 124 and the preliminary contact structure 140a may be reduced by the air spacer 150.

Figure 18:
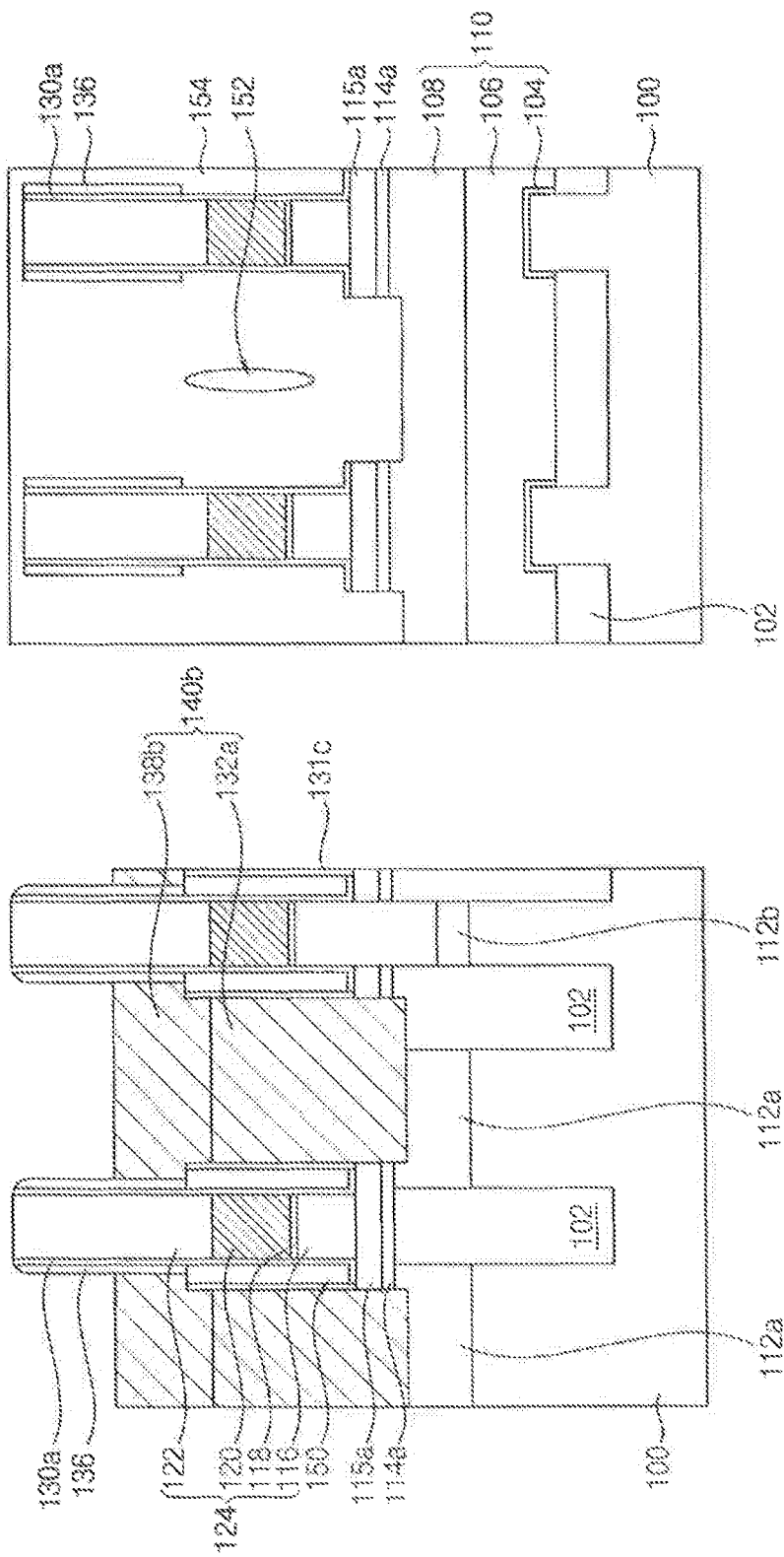

Referring to FIGS. 17 and 18, an insulation layer may be formed on the bit line structure 124 and the preliminary contact structure 140a to fill the second opening 144a. The insulation layer may be planarized until the upper surface of the bit line structure 124 is exposed, to form an insulation structure 154 within the second opening 144a.

The second opening 144a may have the middle portion wider than the lower portion and the upper portion. Therefore, when the insulation layer is formed conformally in the second opening 144a, an empty space may be formed in a middle region of the middle portion. For example, when the insulation layer is formed conformally on a sidewall and a bottom surface of the second opening 144a, before the middle portion of the second opening 144a is completed filled, the upper portion of the second opening 144a may be filled firstly to so that the empty space may be formed in the insulation layer. Accordingly, the insulation structure 154 may have an air gap 152 therein. In example embodiments of the inventive concepts, the air gap 152 may face the conductive pattern structure of the bit line structure 124.

As the insulation structure 154 is provided within the second opening 144a, a lower portion of the insulation structure 154 may have an isolated shape.

In example embodiments of the inventive concept, the upper surface of the bit line structure 124 in both sides of the second opening 144a have a relatively smaller height because the upper surface is partially etched by the previous etch process. Accordingly, the insulation structure 154 may cover the upper surface of the bit line structure having the relatively smaller height. For example, the insulation structure 154 may cover the bit line structure and may extend in the second direction.

Referring to FIG. 18, the upper portion of the preliminary contact structure 140a may be partially etched to form a contact structure 140b having a height less than the height of the preliminary contact structure 140a.

In the etch process, an upper portion of the second polysilicon pattern 138a may be partially etched to form a third polysilicon pattern 138b. Accordingly, the contact structure 140b may have a stacked structure of the first polysilicon pattern 132a and the third polysilicon pattern 138b. There may be an interface between the first and third polysilicon patterns 132a, 138b.

The upper surface of the contact structure 140b may be positioned higher than the upper surface of the air spacer 150. Accordingly, the contact structure 140b may have a T shape when viewed from the cross-sectional view taken along the second direction. A lower portion of the contact structure 140b may have a fourth width and an upper portion of the contact structure 140b may have a fifth width greater than the fourth width.

Referring again to FIGS. 1 and 2, a metal silicide layer and a metal layer may be formed on the contact structure 140b, and the metal layer may be patterned. Accordingly, a pad structure 163 having the metal silicide layer 160 and a metal pattern 162 may be formed. The metal silicide layer 160 may include cobalt silicide, tungsten silicide, etc. The metal pattern 162 may include, for example tungsten, cobalt, aluminum, etc.

An upper insulation layer 164 may be formed to fill a space between the pad structures 163. A capacitor 166 including a lower electrode 166a, a dielectric layer 166b and an upper electrode 166c may be formed.

By the processes, the semiconductor device as illustrated in FIGS. 1 and 2 may be manufactured.

Figure 19:
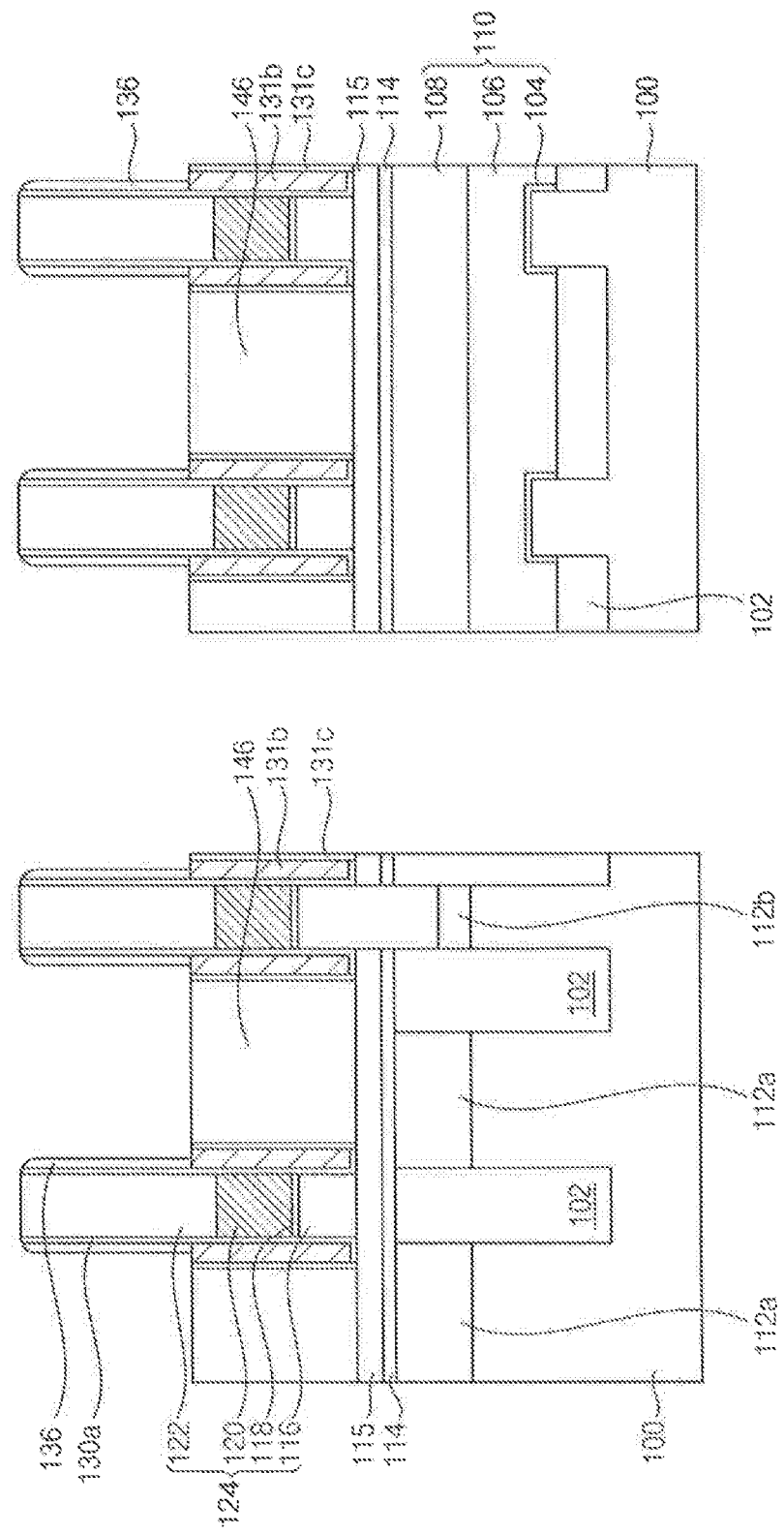
Figure 20:
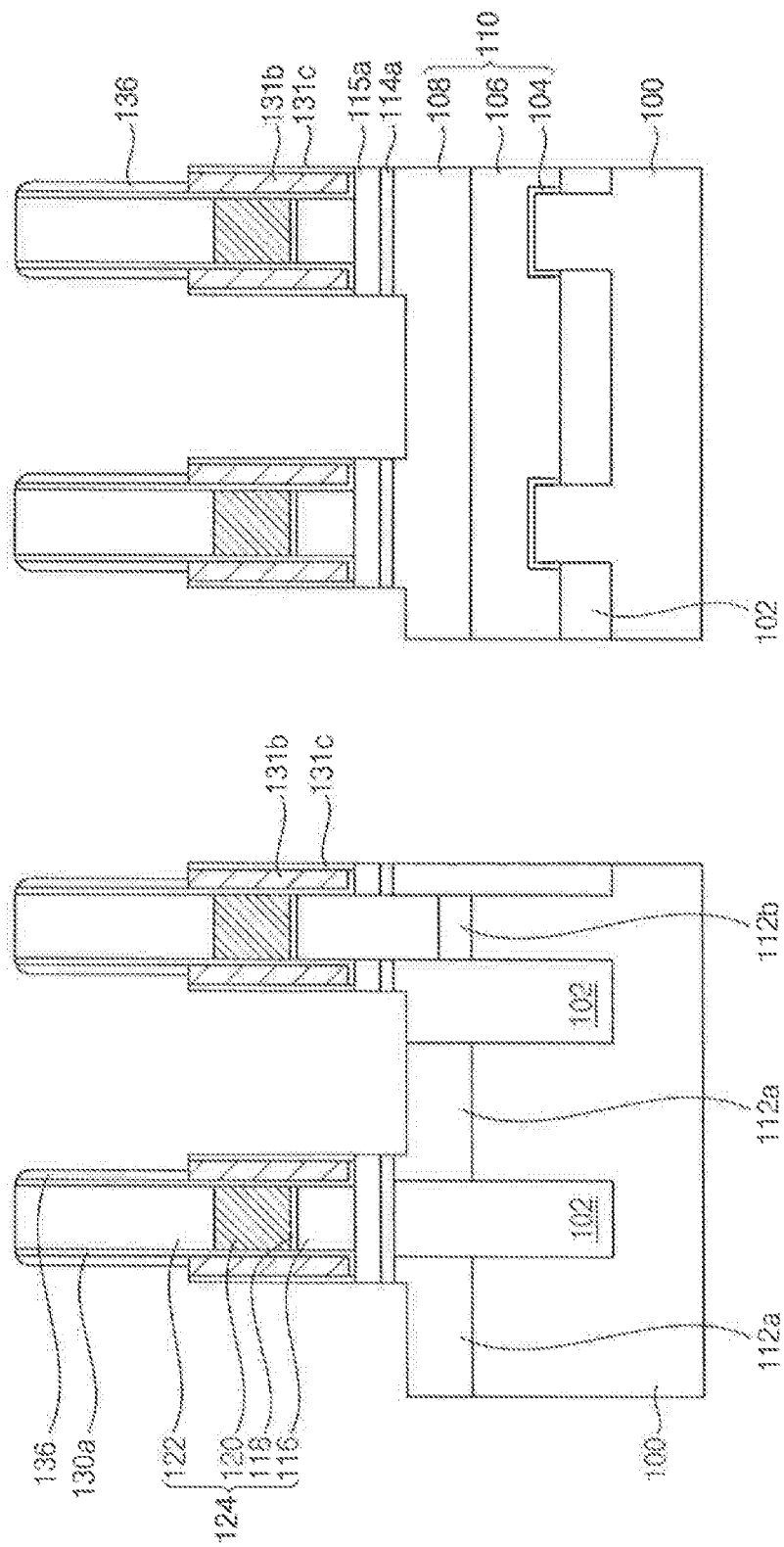
Figure 21:
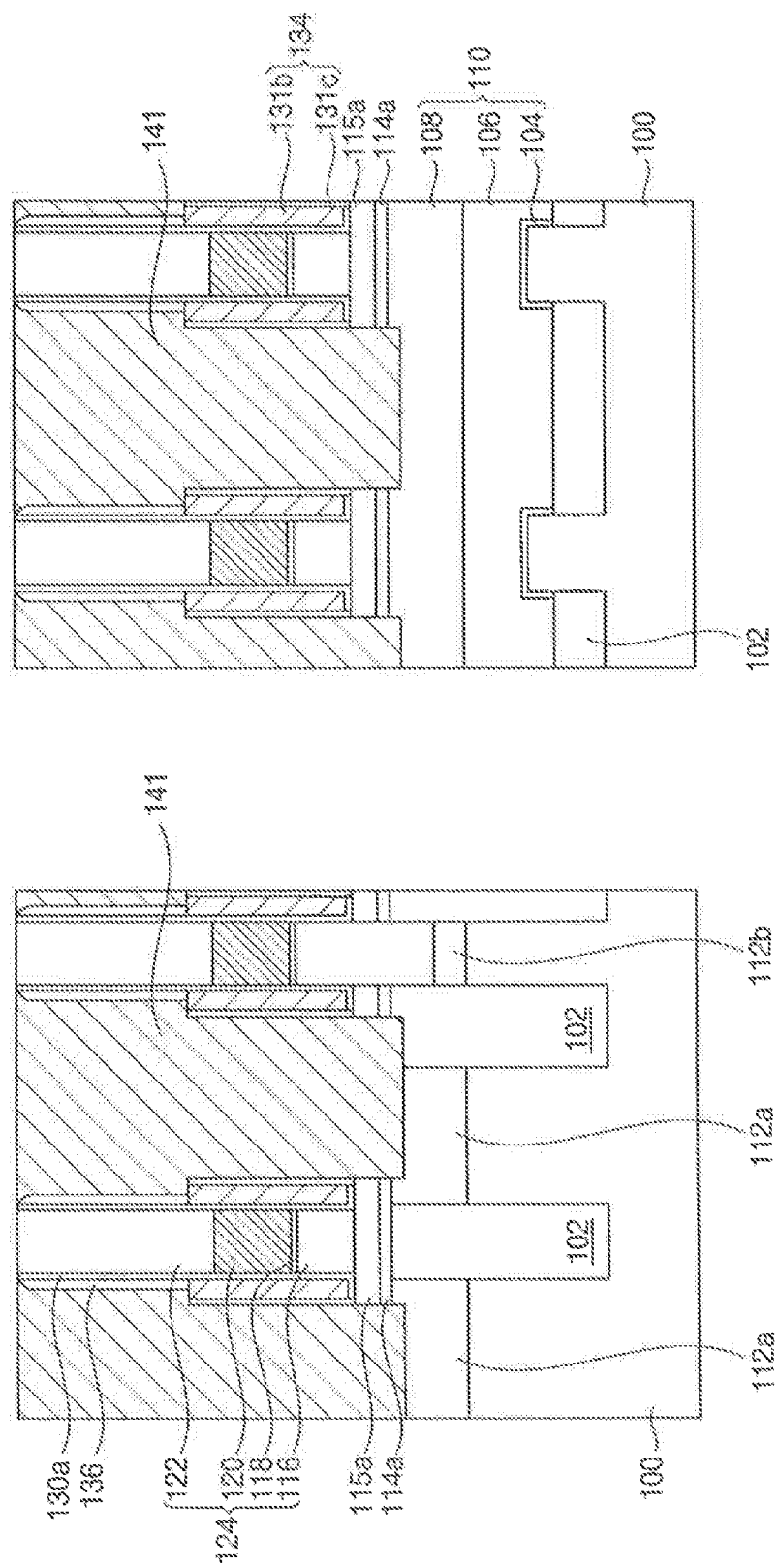

FIGS. 19 to 21 are cross-sectional views and plan views illustrating a method of manufacturing a semiconductor device in accordance with example embodiments of the inventive concept.

The method may be another method of manufacturing the semiconductor device as illustrated in FIGS. 1 and 21. The method may be substantially the same as the method described with reference to FIGS. 4 to 18, except for forming a contact structure.

First, processes the same as the processes described with reference to FIGS. 4 and 5 may be performed to form a structure in FIG. 5.

Referring to FIG. 19, a mold layer may be formed on the bit line structure 124 to fill the preliminary trench. In example embodiments of the inventive concept, the mold layer may include a spin on hard mask layer or a polysilicon layer. The mold layer may be etch-backed to form a mold pattern 146 filling a lower portion of the first preliminary trench. An upper surface of the mold pattern may be positioned higher than an upper surface of a conductive pattern structure of a bit line structure 124.

Portions of the second preliminary spacer 130c (see FIG. 5) and the first preliminary spacer 130b (see FIG. 5) exposed by the mold pattern 146 may be etched. Accordingly, a first spacer 131b and a second spacer 131c may be formed on a lower sidewall of the bit line structure 124.

Then, a second mask layer may be formed along surfaces of an insulation liner 130a, first spacer 131b and the second spacer 131c, a mold pattern 146 and a bit line structure 124. The second mask layer may be formed to have a thickness less than a thickness in the second direction of the first spacer 131b. The second mask layer may be anisotropically etched. Accordingly, a second mask pattern 136 may be formed on the insulation liner 130a. For example, the second mask pattern 136 may be formed on an upper sidewall of the bit line structure 124.

Referring to FIG. 20, the mold pattern 146 may be removed. Then, a second preliminary insulation layer pattern 115 and an underlying first preliminary insulation layer pattern 114 exposed by the first preliminary trench may be etched, to form a first insulation layer pattern 114a and a second insulation layer pattern 115a. By the described process, a second preliminary trench may be formed to extend in the first direction. A first impurity region 112a or a capping pattern 108 may be exposed through a bottom surface of the second preliminary trench.

Referring to FIG. 21, a polysilicon layer may be formed on the bit line structures 124 to completely fill the second preliminary trench between the bit line structures 124. The polysilicon layer may be planarized until an upper surface of the bit line structure 124 is exposed, to form a preliminary polysilicon pattern 141 filling the second preliminary trench. The preliminary polysilicon structure 141 may have a "T" shape when viewed from a cross-sectional view taken along the second direction.

The preliminary polysilicon structure 141 may be formed by a single deposition process of the polysilicon layer, and for that reason there may not be an interface therein.

Then, processes may be performed that are the same as the processes described with reference to FIGS. 12 to 18 to form the semiconductor device as illustrated in FIGS. 1 to 3.

Figure 22:
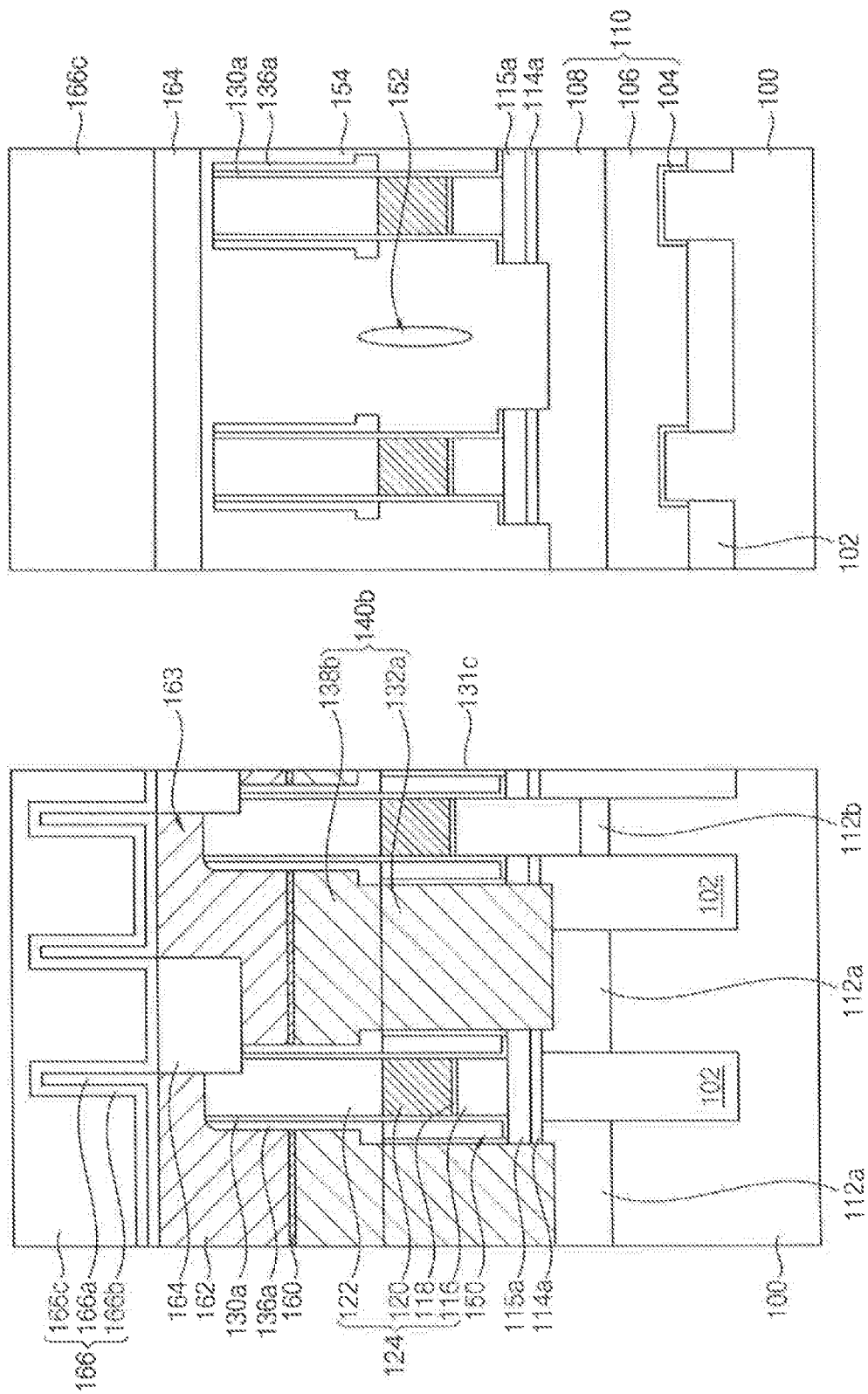

FIG. 22 is a cross-sectional view illustrating a semiconductor device in accordance with example embodiments of the inventive concept.

The semiconductor device in FIG. 22 may be substantially the same as the semiconductor device described with reference to FIGS. 1 to 3, except for a shape of a second mask pattern.

Referring to FIG. 22, a second mask pattern 136a may be provided on an upper sidewall of a bit line structure 124. In example embodiments of the inventive concept, the second mask pattern 136a may be formed on an insulation liner 130a. In example embodiments, a lower portion of the second mask pattern 136a may protrude laterally. For example, the lower portion of the second mask pattern 136a may have a first thickness, and an upper portion of the second mask pattern 136a may have a second thickness less than the first thickness.

An air spacer 150 may be positioned lower than a lower surface of the second mask pattern 136a. In example embodiments of the inventive concept, the air spacer 150 may be an empty space surrounded by an insulation liner 130a, a second spacer 131c and the lower surface of the second mask pattern 136a.

Figure 23:
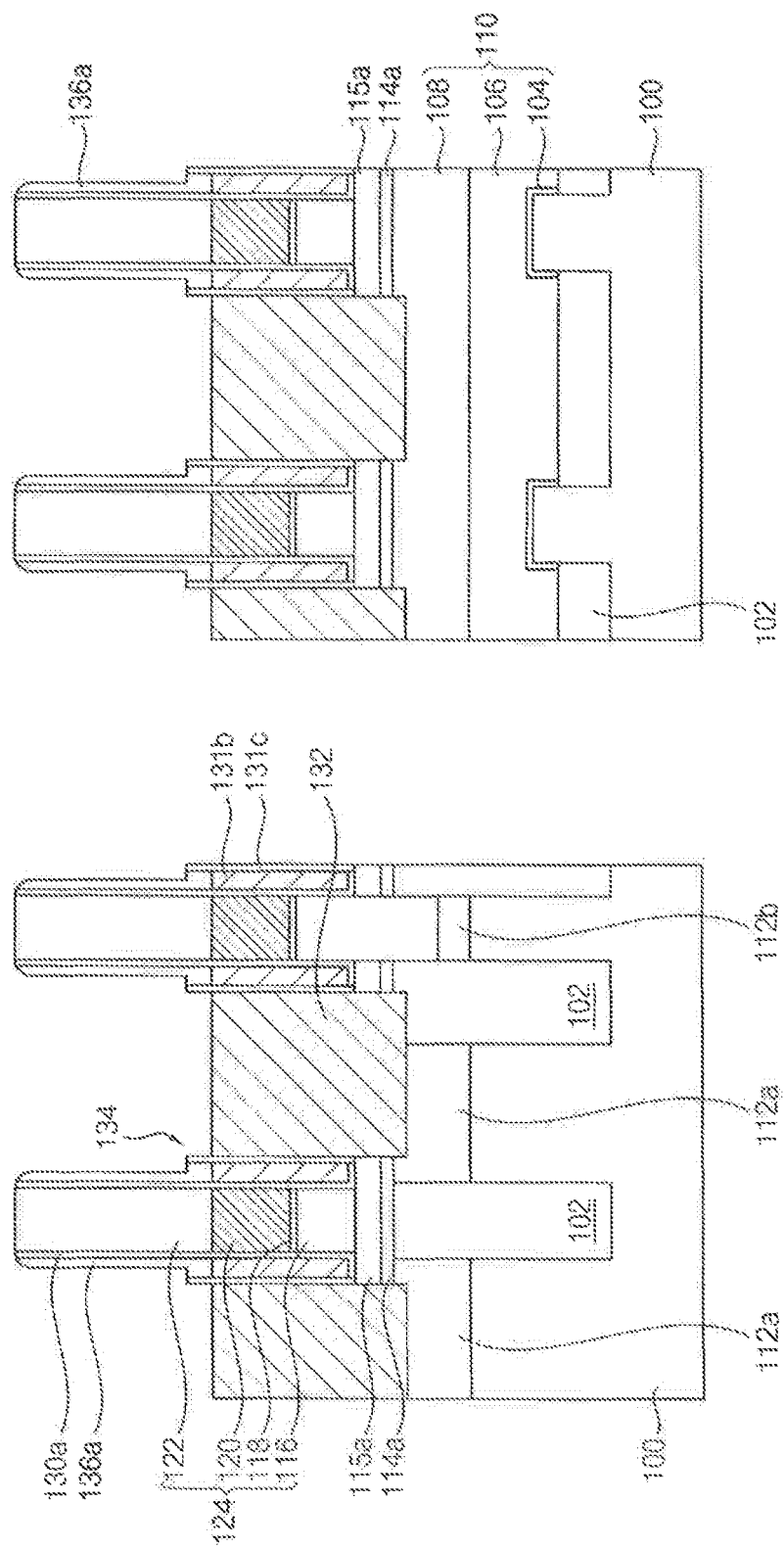

FIG. 23 is a cross-sectional view illustrating a method of manufacturing a semiconductor device in accordance with example embodiments of the inventive concept.

The method may be used for manufacturing the semiconductor device as illustrated in FIG. 22. The method may be substantially the same as the method described with reference to FIGS. 4 to 18, except for forming a second mask pattern.

First, processes the same as the processes described with reference to FIGS. 5 to 8 may be performed to form a structure in FIG. 8.

Referring to FIG. 23, the second preliminary spacer 130c (see FIG. 8) and the first preliminary spacer 130b (see FIG. 8) exposed by the first preliminary polysilicon pattern 132 may be removed. Accordingly, a first spacer 131b and a second spacer 131c may be formed on a lower sidewall of the bit line structure 124. Here, the first preliminary spacer may be etched more than the second preliminary spacer. Accordingly, a recess may be formed on the first spacer 131b between the insulation liner 130a and the second spacer 131c. On the other hand, when the portions of the first and second preliminary spacers 130b, 130c are removed, the upper surface of the first preliminary polysilicon pattern 132 may be partially removed.

Then, a second mask layer may be formed along surfaces of the insulation liner 130a, the first spacer 131b and the second spacer 131c, the first preliminary polysilicon pattern 132 and the bit line structure 124. The second mask layer may be formed to fill the recess. The second mask layer may be formed to have a thickness less than a thickness in the second direction of the first spacer 131b. The second mask layer is formed along a sidewall and a bottom surface of the recess, the second mask layer may completely fill the recess.

The second mask layer may be anisotropically etched. Accordingly, a second mask pattern 136 may be formed on the insulation liner 130a. The second mask pattern 136a may be formed on an upper sidewall of the bit line structure 124. A lower portion of the second mask pattern 136a may protrude laterally. In addition, the lower portion of the second mask pattern 136a may have a first thickness, and an upper portion of the second mask pattern 136a may have a second thickness less than the first thickness.

Then, processes the same as the processes described with reference to FIGS. 10 to 18 may be performed to form the semiconductor device as illustrated in FIG. 22.

Figure 24:
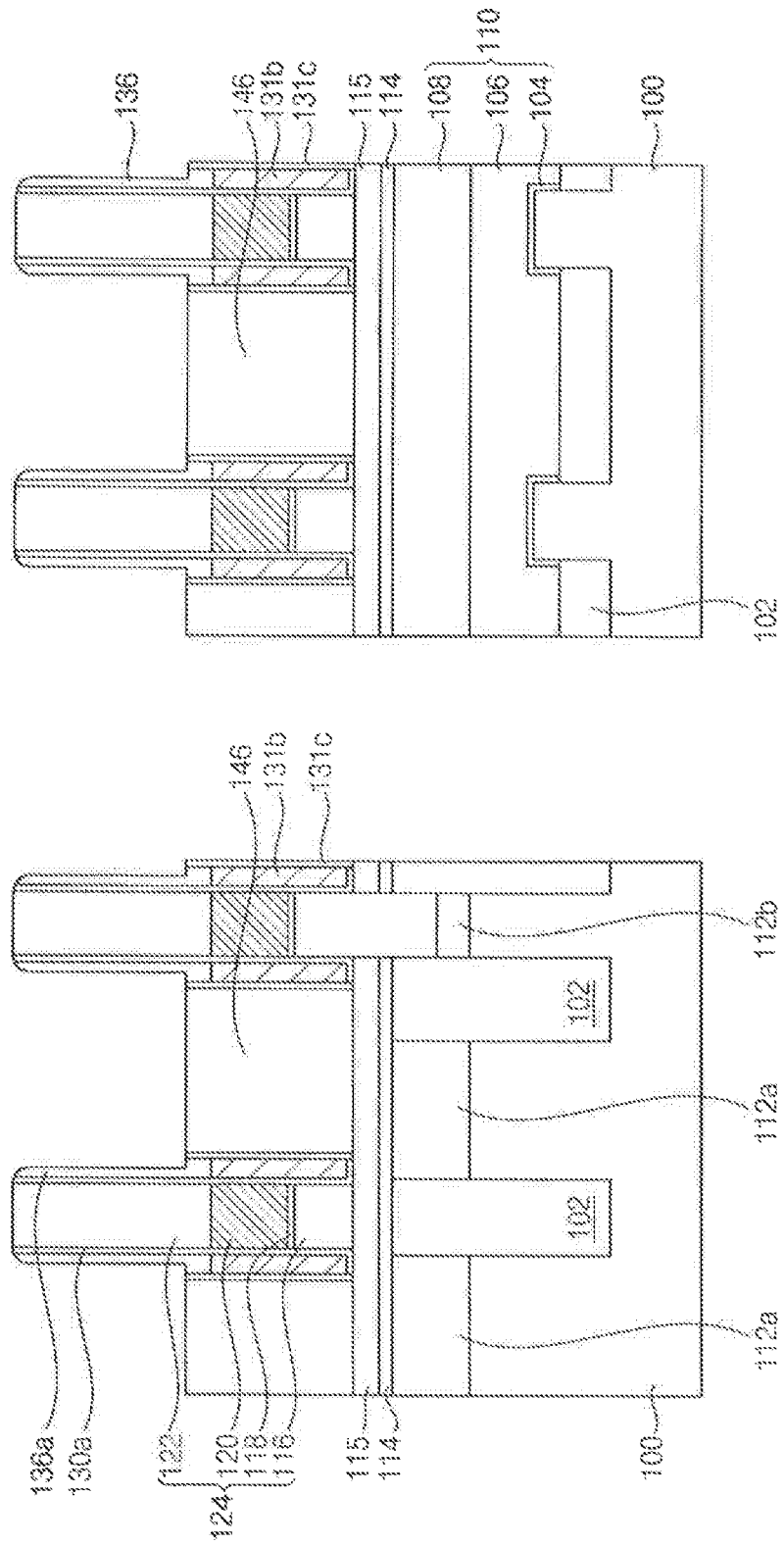
Figure 26:
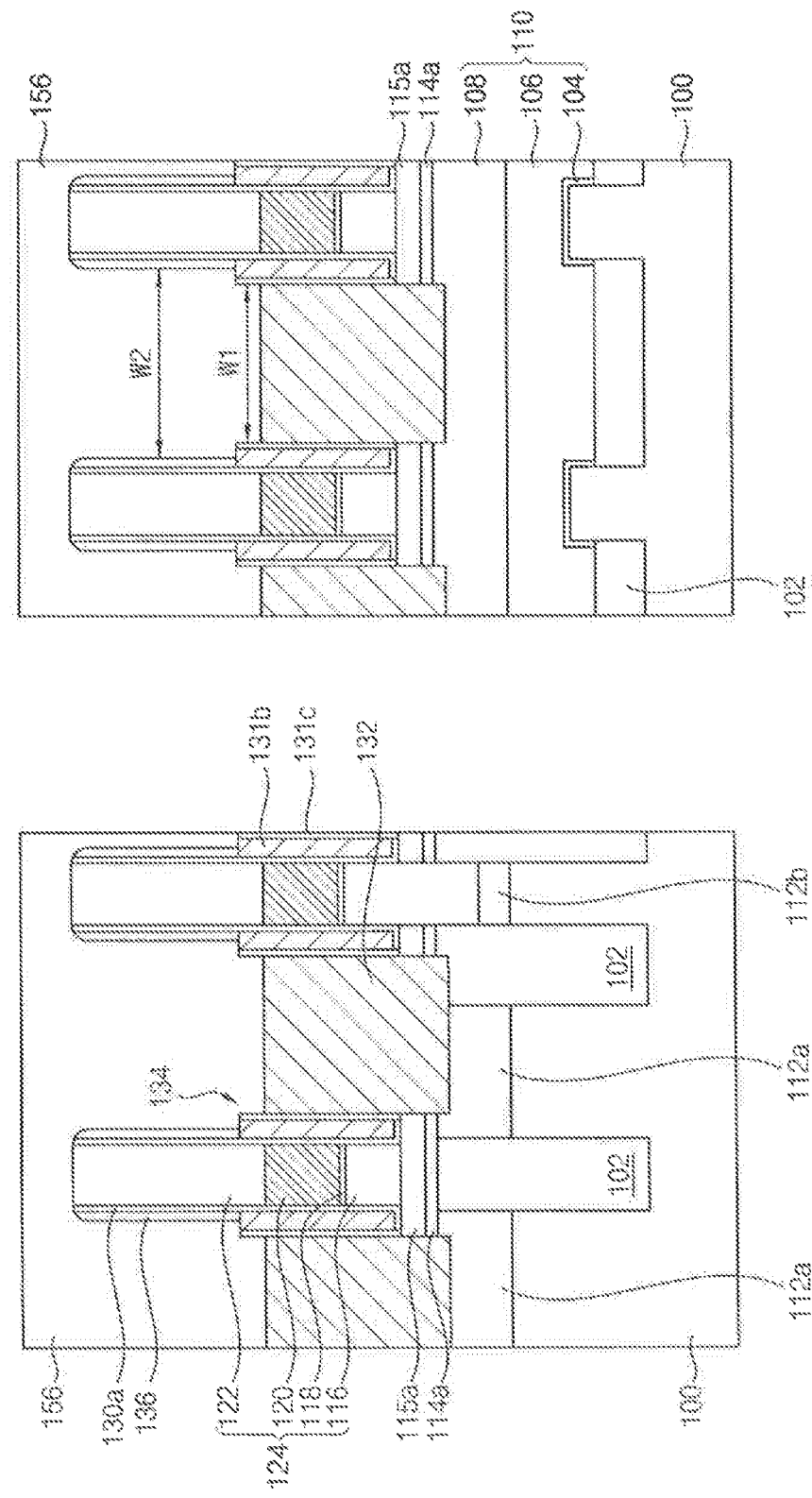

FIG. 24 is a cross-sectional view illustrating a method of manufacturing a semiconductor device in accordance with example embodiments of the inventive concept.

The method may be used for manufacturing the semiconductor device as illustrated in FIG. 22. The method may be substantially the same as the method described with reference to FIGS. 19 to 21, except for forming a second mask pattern.

First, processes the same as the processes described with reference to FIGS. 4 and 5 may be performed to form a structure in FIGS. 4 and 5.

Referring to FIG. 24, a mold layer may be formed on the bit line structure 124 to fill the preliminary trench. The mold layer may be etch-backed to form a mold pattern 146 filling a lower portion of the first preliminary trench.

Portions of the second preliminary spacer 130c (see FIG. 5) and the first preliminary spacer 130b (see FIG. 5) exposed by the mold pattern 146 may be etched to form a first spacer 131b and a second spacer 131c. Here, the first preliminary spacer may be etched more than the second preliminary spacer. Accordingly, a recess may be formed on the first spacer 131b between the insulation liner 130a and the second spacer 131c.

A second mask layer may be formed along surfaces of the insulation liner 130a, the first spacer 131b and the second spacer 131c, the mold pattern 146 and the bit line structure 124 and may be anisotropically etched. Accordingly, a second mask pattern 136 may be formed on the insulation liner 130a. The second mask pattern 136a may be formed on an upper sidewall of the bit line structure 124.

Then, processes the same as the processes described with reference to FIG. 20 to 21 or processes the same as the processes described with reference to FIGS. 12 to 18 may be performed to form the semiconductor device as illustrated in FIG. 22.

FIG. 25 is a cross-sectional view illustrating a semiconductor device in accordance with example embodiments of the inventive concept.

The semiconductor device in FIG. 25 may be substantially the same as the semiconductor device described with reference to FIGS. 1 to 3, except for a shape of a contact structure.

Referring to FIG. 25, a contact structure may include a first polysilicon pattern 132a. An upper surface of the contact structure 132a may be positioned lower than an upper surface of an air spacer 150. Accordingly, the upper surface of the contact structure 132a may be positioned lower than a lower surface of a second mask pattern 136. The contact structure 132a may not have a "T" shape when viewed from a cross-sectional view taken along the second direction.

On the other hand, the insulation structure 154 may include an air gap 152 therein.

FIGS. 26 to 30 are cross-sectional views illustrating a method of manufacturing a semiconductor device in accordance with example embodiments of the inventive concept.

The method may be used for manufacturing the semiconductor device as illustrated in FIG. 25. The method may be substantially the same as the method described with reference to FIGS. 5 to 18, except for forming a contact structure.

First, processes the same as the processes described with reference to FIGS. 5 to 9 may be performed to form a structure in FIG. 9.

A mold layer may be formed on a first preliminary polysilicon pattern 132 and a bit line structure 124. The mold layer 156 may be formed by a deposition process or a spin coating process. The mold layer 156 may be formed to completely fill a gap between the bit line structures. The mold layer 156 may include a material having a high etch selectivity with a first spacer 131b.

In some embodiments, a planarization process may be further performed on the mold layer 156.

Figure 27:
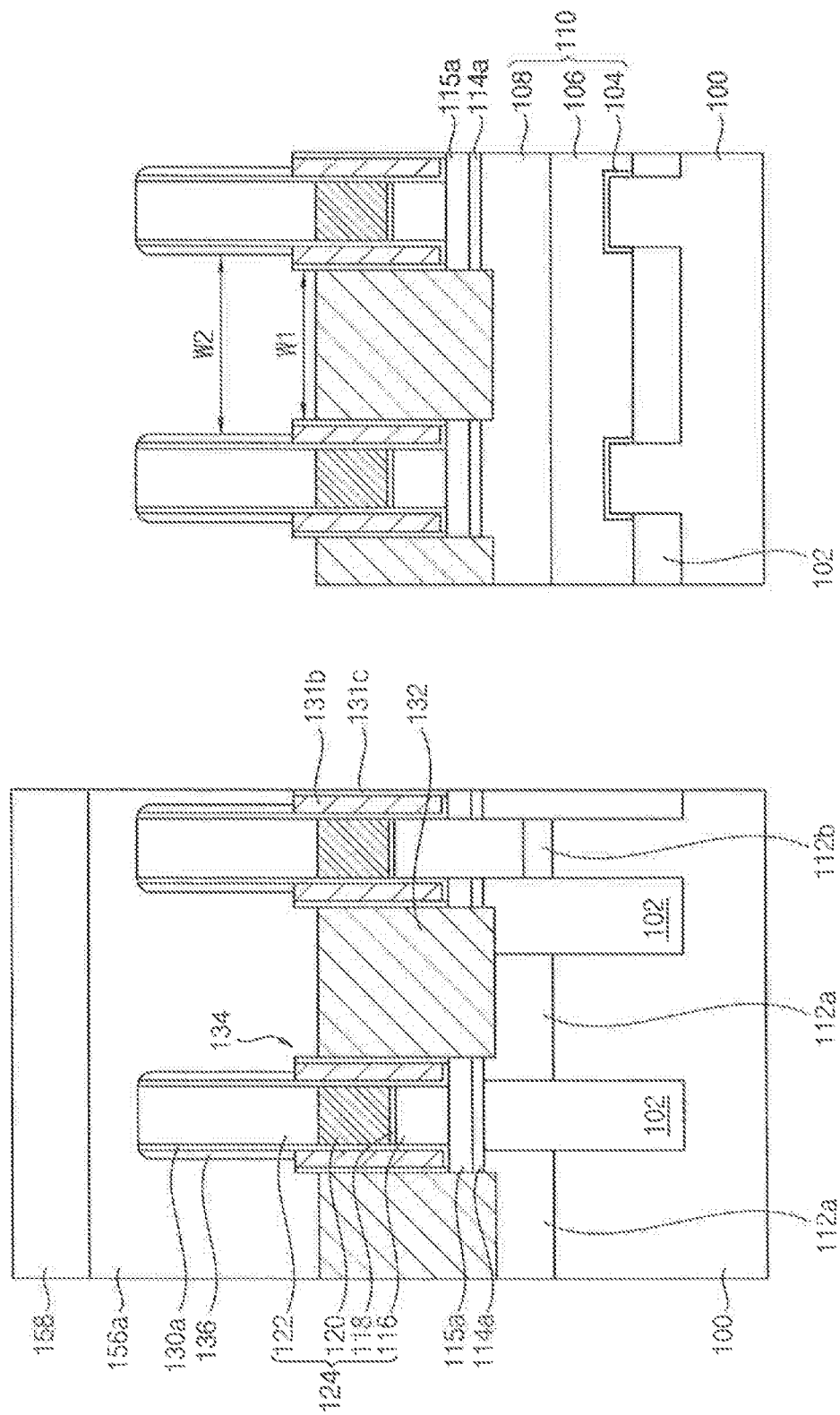

Referring to FIG. 27, third mask patterns 158 may be formed on the mold layer 156. The third mask patterns 158 may extend in the second direction respectively.

A region where the third mask pattern 158 is formed between the bit line structures 124 may face a first impurity region 112a of a semiconductor substrate 100 in a vertical direction. The region where the third mask pattern 158 is formed between the bit line structures 124 may correspond to a region where a contact structure is formed.

The mold layer 156 may be removed using the third mask pattern 158 as an etching mask, to form a mold pattern 156a. Accordingly, the first preliminary polysilicon pattern 132 may be exposed as the portion of the mold layer 156 is removed.

Figure 28:
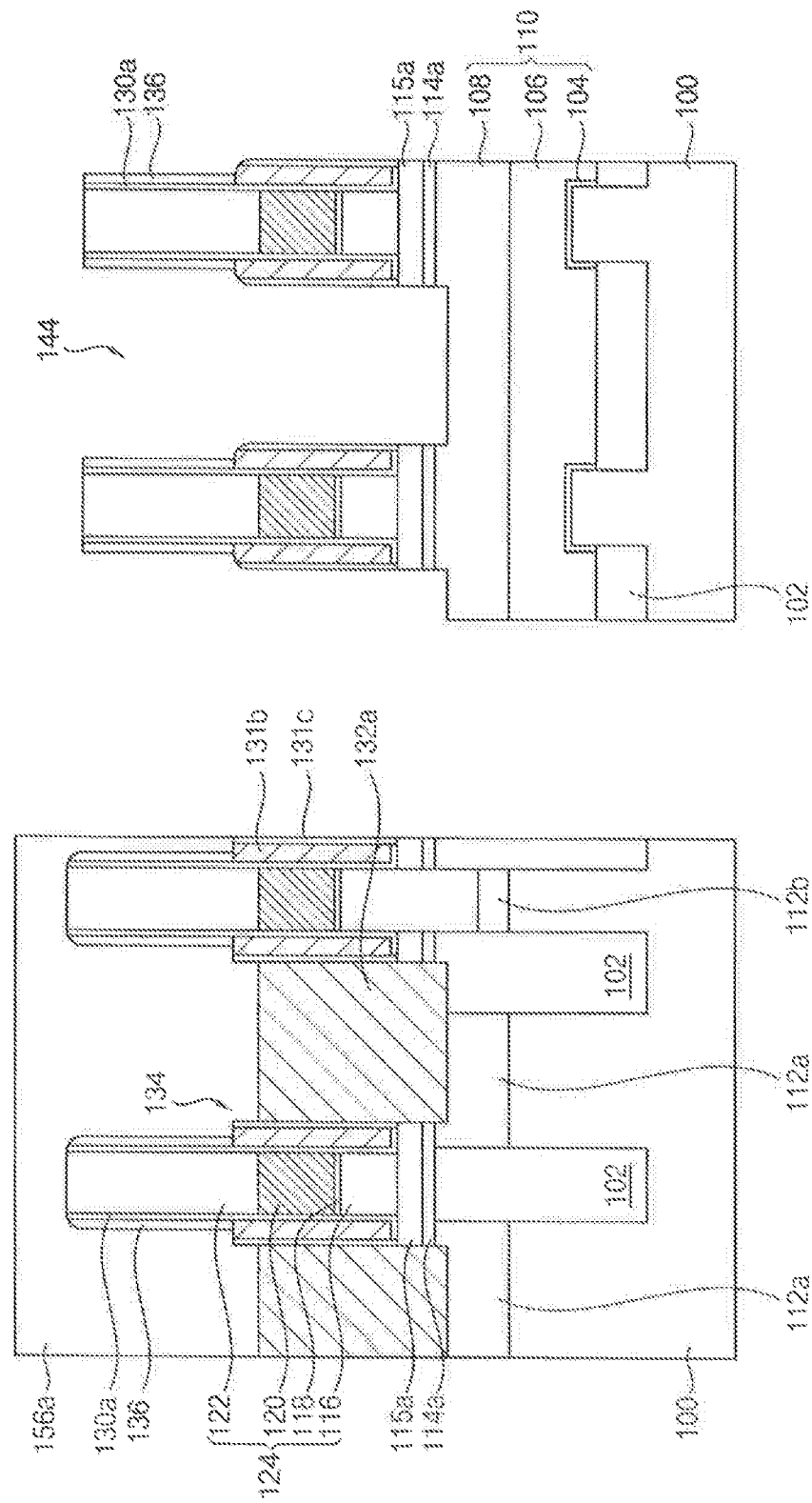

Referring to FIG. 28, the first preliminary polysilicon pattern 132 may be etched using the mold pattern 156a and the third mask pattern 158 as an etching mask. Accordingly, a pillar-shaped contact structure 132a which makes contact with the first impurity region 112a may be formed. A first opening 144 may be formed between the contact structures 132a and the bit line structures 124.

An upper surface of the contact structure 132a may be positioned lower than an upper surface of the first spacer 131b. The contact structure 132a may be covered by the mold pattern 156a. In example embodiments of the inventive concept, by the etch process, the third mask pattern 158 may be partially or completely removed.

Figure 29:
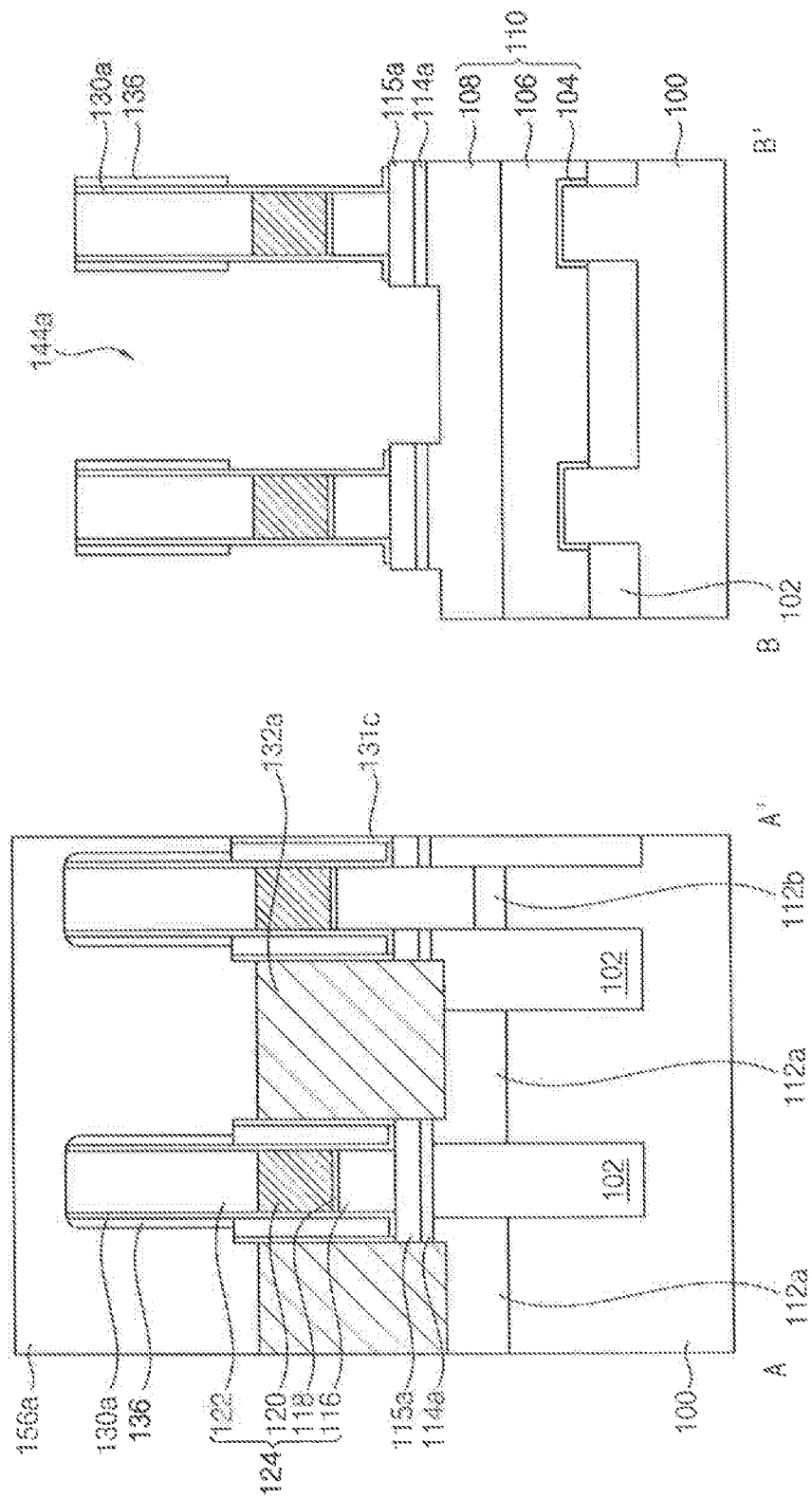

Referring to FIG. 29, the first spacer 131b and the second spacer 131c in both sides of the bit line structure 124 may be removed. The first spacer 131b and the second spacer 131c may be removed by an isotropic etch process.

For example, the first spacer 131b and the second spacer 131c may be removed through the sidewall of the first opening 144, and as an etching gas flows into the first opening 144, the first spacer 131b between the contact structure 132a and the bit line structure may be etched.

As the first spacer 131b between the contact structure 132a and the bit line structure 124 is removed, an air spacer 150 may be formed between the contact structure 132a and the bit line structure. The air spacer 150 may face the contact structure 132a. Accordingly, the air spacers 150 may be spaced apart from each other in the first direction.

By the process described above, an inner width of the first opening 144 may be partially enlarged, to form a second opening 144a. The second opening 144a may have a lower portion having a first width, a middle portion having a second width greater than the first width and an upper portion having a third width less than the second width.

Figure 30:
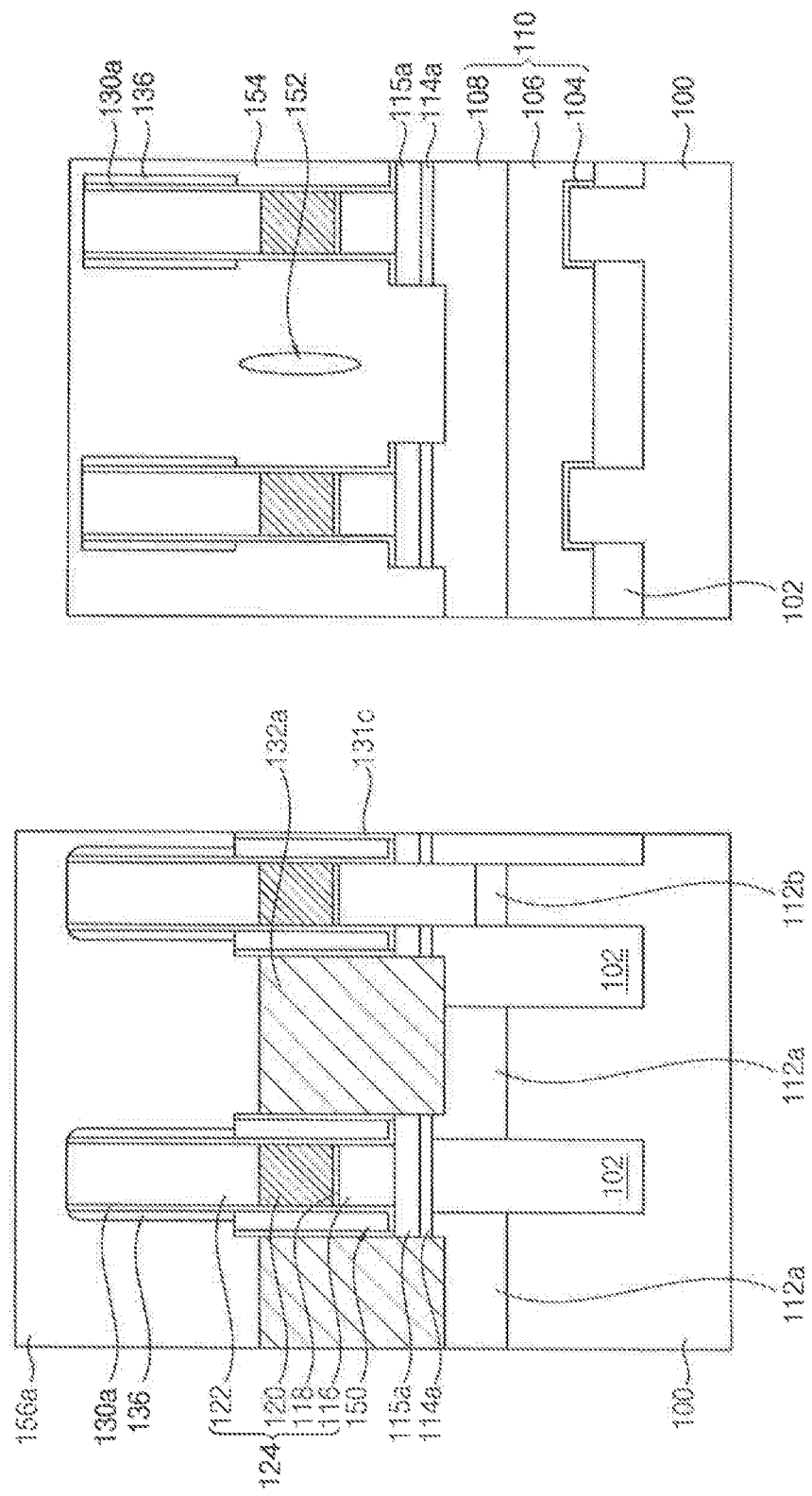

Referring to FIG. 30, an insulation layer may be formed on the bit line structure 124 and the mold pattern 156a to fill the second opening 144a. The insulation layer may be planarized until the upper surface of the bit line structure 124 is exposed, to form an insulation structure 154 within the second opening. The insulation structure 154 may have an air gap 152 therein.

Then, the mold pattern 156a may be removed. Subsequently, processes for forming a pad structure and a capacitor electrically connected to the contact structure 140b, to thereby manufacture the semiconductor device shown in FIG. 25.

FIG. 31 is a cross-sectional view illustrating a semiconductor device in accordance with example embodiments of the inventive concept.

The semiconductor device in FIG. 31 may be substantially the same as the semiconductor device described with reference to FIG. 25, except for a shape of a second mask pattern.

Referring to FIG. 31, a second mask pattern 136a may be provided on be provided on an insulation liner on an upper sidewall of a bit line structure 124. A lower portion of the second mask pattern 136a may protrude laterally. For example, the lower portion of the second mask pattern 136a may have a first thickness, and an upper portion of the second mask pattern 136a may have a second thickness less than the first thickness.

In example embodiments of the inventive concept, an upper surface of the contact structure 132a may be positioned lower than a lower surface of the second mask pattern 136. Accordingly, the contact structure 132a may not have a "T" shape when viewed from a cross-sectional view taken along the second direction.

Hereinafter, a method of manufacturing the semiconductor device in FIG. 32 will be explained.

First, processes may be performed that are the same as the processes described with reference to FIGS. 5 to 8 to form a structure in FIG. 8. Then, processes may be performed that are the same as the processes described with reference to FIG. 23 to form a second mask pattern. Then, processes may be performed that are the same as the processes described with reference to FIGS. 26 to 30. Accordingly, the semiconductor device shown in FIG. 31 may be manufactured.

Figure 33:
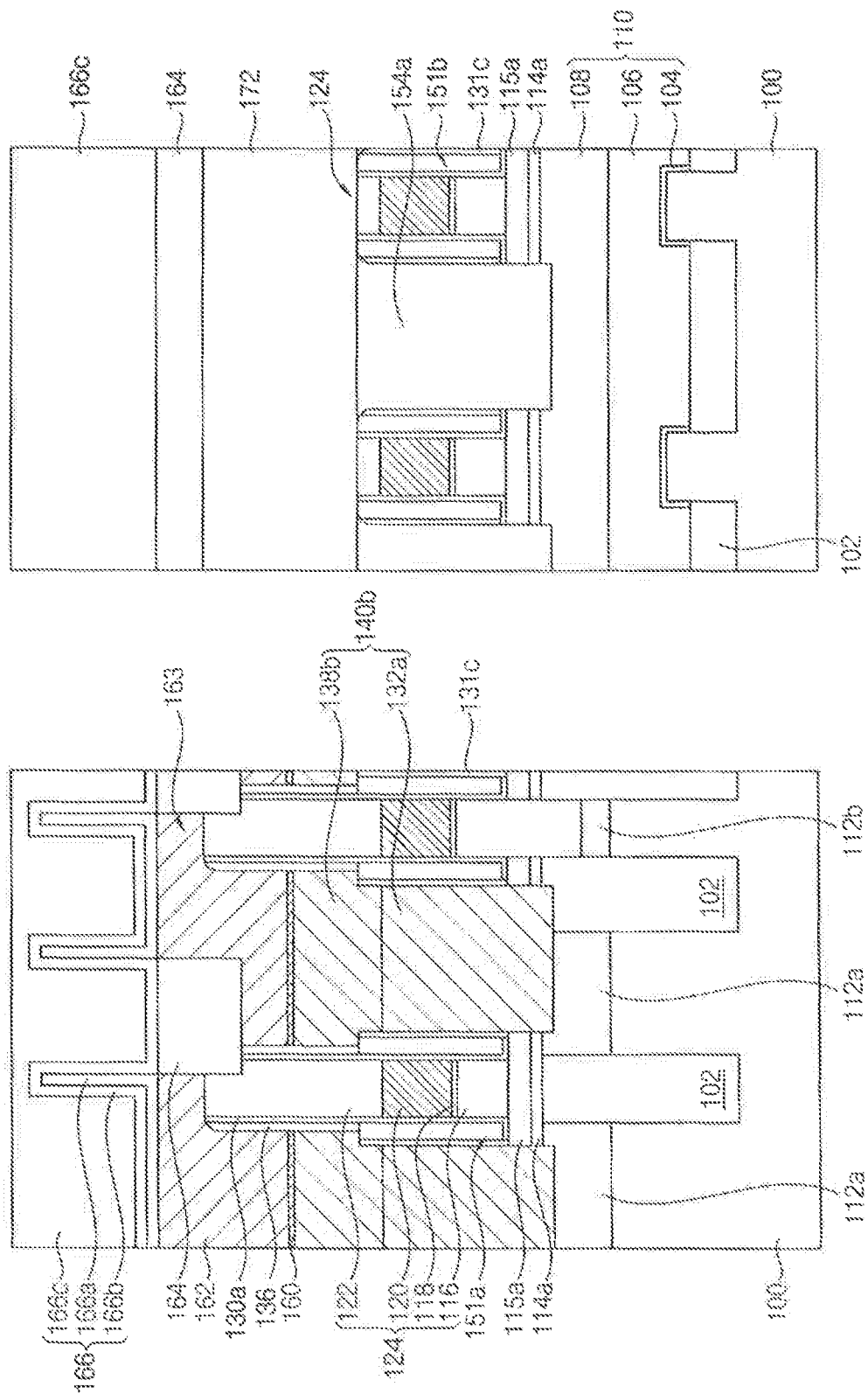

FIGS. 32 and 33 are cross-sectional views illustrating a semiconductor device in accordance with example embodiments of the inventive concept.

Referring to FIGS. 32 and 33, a first air spacer 151a may be provided between a contact structure 140b and a bit line structure 124. The first air spacer 151a may be substantially the same as the air spacer described with reference to FIGS. 1 to 3. A second air spacer 151b may be provided between the bit line structure 124 and an insulation structure 154a.

In example embodiments of the inventive concept, the first and second air spacers 151a, 151b may be in communication with each other and may extend in the first direction. Accordingly, the first and second air spacers 151a, 151b may be arranged alternately and repeatedly on a sidewall of the bit line structure 124. The first and second air spacers 151a, 151b may be provided as one spacer extending in the first direction.

In example embodiments of the inventive concept, an upper surface of the bit line structure 124 may have a first height and a second height that is less than the first height. A first upper surface of the bit line structure 124 adjacent to the first air spacer 151a may have the first height, and a second upper surface of the bit line structure 124 adjacent to the second air spacer 151b may have the second height. The second upper surface of the bit line structure 124 may be substantially coplanar with or higher than a top portion of the second air spacer 151b. As an example, the second upper surface of the bit line structure 124 may be positioned lower than the upper surface of the contact structure 140b.

The insulation structure 154a may be arranged in an isolated region between the bit line structures 124 and between the contact structures 140b. An upper surface of the insulation structure 154a may be coplanar with the second upper surface of the bit line structure 124.

An insulation layer pattern 172 may be provided on the insulation structure 154a and the second upper surface of the bit line structure 124. In example embodiments of the inventive concept, the insulation layer pattern 172 may have a shape extending in the second direction.

In example embodiments of the inventive concept, the second air spacer 151b may be a space surrounded by the insulation liner 130a, the second spacer 131c, the insulation structure 154a and the insulation layer pattern 172.

In example embodiments of the inventive concept, the upper surfaces of the first and second air spacers 151a, 151b may be higher than an upper surface of the conductive pattern structure of the bit line structure 124.

When one contact structure 140b and one insulation structure 154a adjacent to each other in the first direction is seen, the first and second air spacers 151a, 151b may be provided in both sides of the contact structure 140b and the insulation structure 154a respectively to extend in the first direction. In such construction, an empty space may not be provided in both sides of the contact structure 140b in the first direction.

Figure 34:
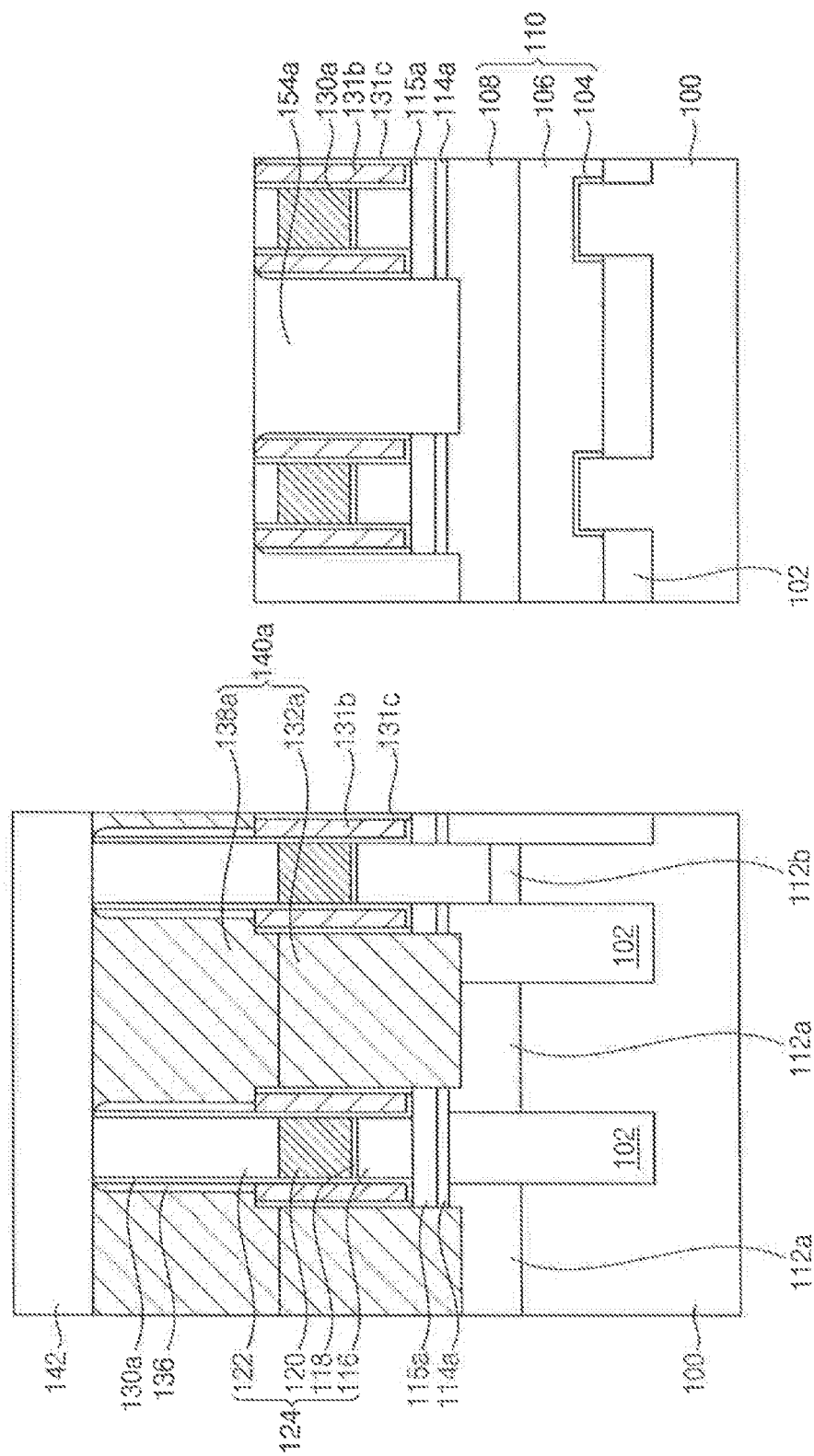
Figure 35:
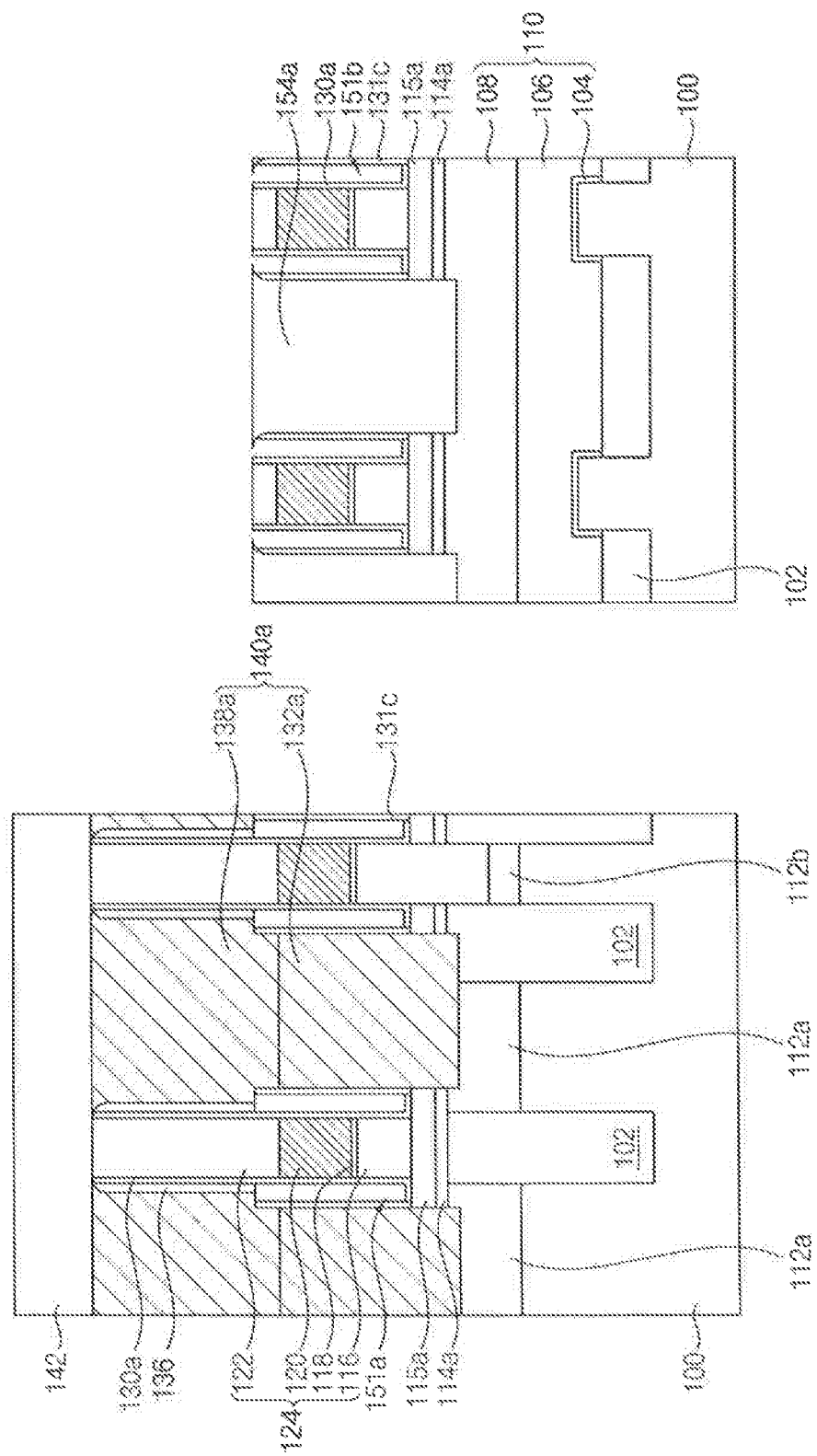
Figure 36:
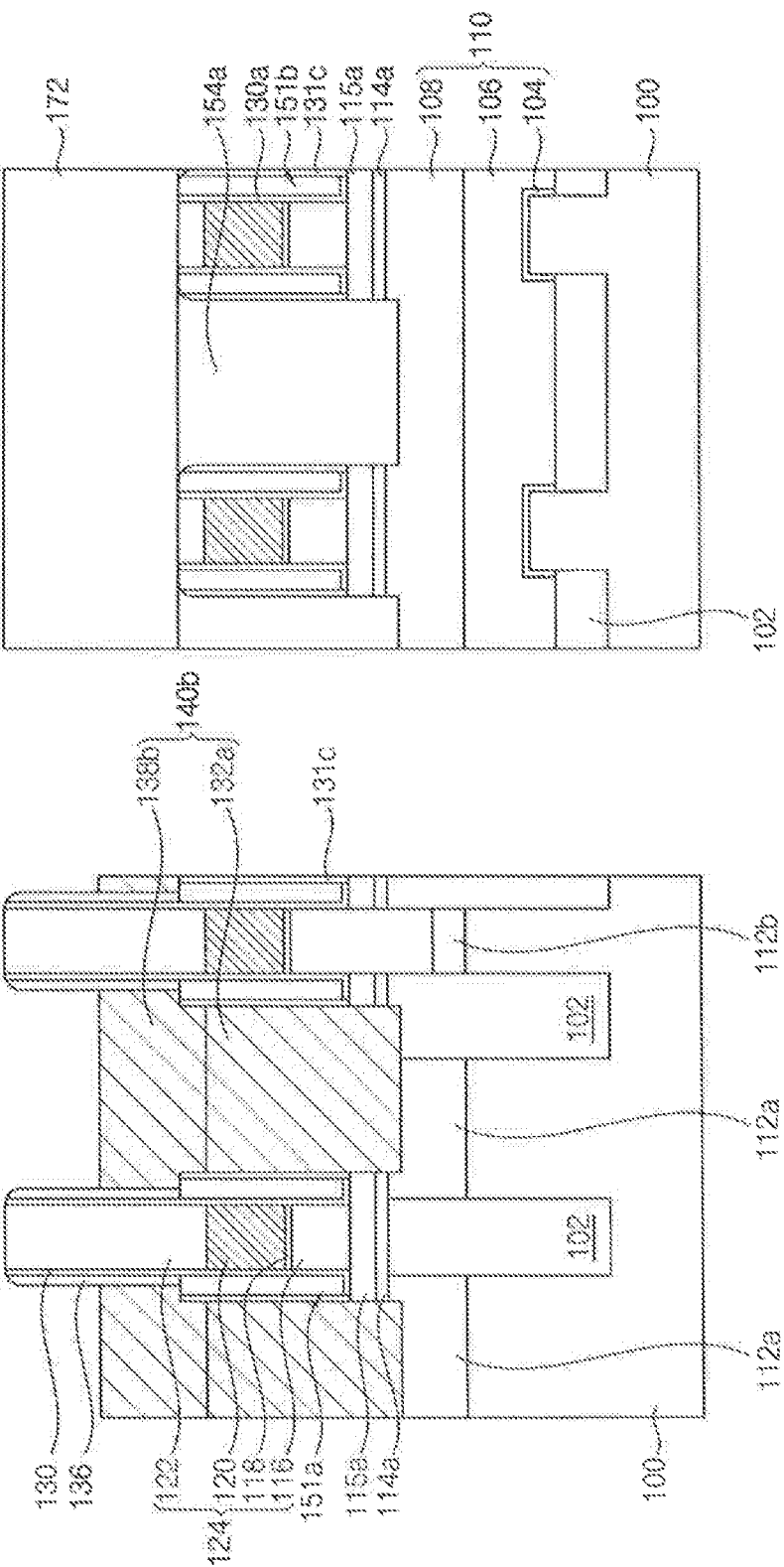

FIGS. 34 to 36 are cross-sectional views illustrating a method of manufacturing a semiconductor device in accordance with example embodiments of the inventive concept.

The method may be used for manufacturing the semiconductor device as illustrated in FIGS. 32 and 34. The method may be substantially the same as the method described with reference to FIGS. 4 to 18, except for forming a second air spacer.

First, processes the same as the processes described with reference to FIGS. 5 to 13 may be performed to form a structure in FIG. 13.

Referring to FIG. 34, a third insulation layer may be formed to fill the first opening between the preliminary contact structures 140a and the bit line structures 124. The third insulation layer may include a material having a high etch selectivity with the first spacer. In example embodiments, the third insulation layer may include SiOC, silicon nitride or a low electric material.

The third insulation layer may be etch-backed using the third mask pattern 142 to expose the upper surface of the first spacer 131b. Accordingly, an insulation structure 154a having a pillar shape may be formed. In the etch-back process of the third insulation layer, at least a portion of the first mask pattern 122 may be removed. Accordingly, the bit line structure 124 exposed by the third mask pattern 142 may have a relatively low second height.

Referring to FIG. 35, the first spacer 131b on both sidewalls of the bit line structure 124 may be removed. The first spacer 131b may be removed by an isotropic etch process.

Particularly, the first spacer 131 in both sides of the insulation structure 154a may be etched, and an etching source may be supplied through the etched first spacer 131b to etch the first spacer 131b on a sidewall of the preliminary contact structure 140a.

Accordingly, a first air spacer 151a may be formed between the preliminary contact structure 140a and the bit line structure 124, and a second air spacer 151b may be formed between the insulation structure 154a and the bit line structure 124.

Referring to FIG. 36, a fourth insulation layer may be formed on the bit line structure 124 and the insulation structure 154a. Then, the fourth insulation layer may be etch-backed until an upper surface of the bit line structure 124 is exposed, to form an insulation layer pattern 172. An upper portion of the second air spacer 151b may be covered by the insulation layer pattern 172.

Then, an upper portion of the preliminary contact structure 140a may be etched to form a contact structure 140b having a height lower than the preliminary contact structure 140a. An upper surface of the contact structure 140b may be positioned higher than an upper surface of the first air spacer 151a. The contact structure 140b may have a T shape when viewed from a cross-sectional view taken along the second direction.

By the processes, the semiconductor device illustrated in FIGS. 32 and 33 may be manufactured.

Hereinafter, another method of manufacturing the semiconductor device in FIGS. 32 and 33 will be explained. This method may be substantially the same as the method described with reference to FIGS. 19 to 21, except for forming a second air spacer.

First, processes may be performed that are the same as the processes described with reference to FIG. 5 to form a structure shown in FIG. 5. Processes may be formed that are the same as the processes described with reference to FIGS. 19 to 21 to form a structure shown in FIG. 21. For example, a preliminary polysilicon structure may be formed using a mold pattern.

Then, processes may be performed that are the same as the processes described with reference to FIGS. 12 and 13 to form a preliminary contact structure shown in FIG. 13.

Then, processes may be performed that are the same as the processes described with reference to FIGS. 34 to 36 to form the semiconductor device illustrated in FIGS. 32 and 33.

FIG. 37 is a cross-sectional view illustrating a semiconductor device in accordance with example embodiments of the inventive concept.

The semiconductor device in FIG. 37 may be substantially the same as the semiconductor device described with reference to FIGS. 32 and 33, except for a shape of a contact structure.

Referring to FIG. 37, an upper surface of a contact structure 132a may be positioned lower than an upper surface of a first air spacer 151a. Accordingly, the upper surface of the contact structure 132a may be positioned lower than a bottom surface of a second mask pattern 136.

The contact structure 132a may have a "T" shape when viewed from a cross-sectional view taken along the second direction.

A first air spacer 151a may be provided between the bit line structure 124 and the contact structure 132a, and a second air spacer 151b may be provided between the bit line structure 124 and the insulation structure 154a.

Hereinafter, a method of manufacturing the semiconductor device in FIG. 37 according to an embodiment of the inventive concept will be explained.

First, processes may be performed that are the same as the processes described with reference to FIGS. 5 to 9 to form a structure in FIG. 9. Then, processes may be performed that are the same as the processes described with reference to FIGS. 26 to 28 to form a structure in FIG. 28. For example, the contact structures having the pillar shape may be formed to make contact with the first impurity region. Additionally, a first opening may be formed between the contact structures and the bit line structures.

Then, processes the same as the processes described with reference to FIGS. 34 to 36 may be performed. Accordingly, the semiconductor device in FIG. 37 may be manufactured.

Figure 38:
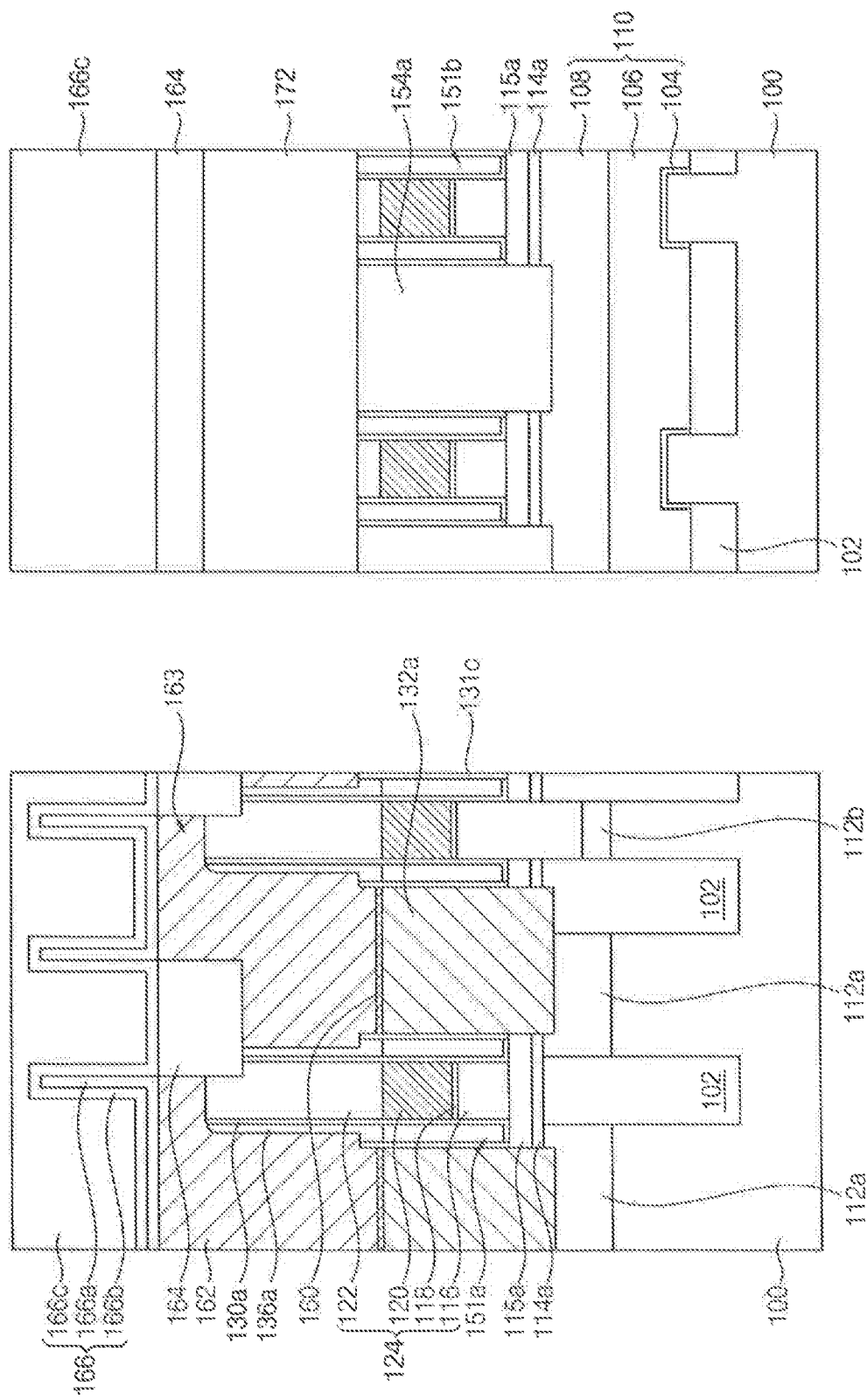

FIG. 38 is a cross-sectional view illustrating a semiconductor device in accordance with example embodiments of the inventive concept.

The semiconductor device in FIG. 38 may be substantially the same as the semiconductor device described with reference to FIG. 37, except for a shape of a second mask pattern 136a.

Referring to FIG. 38, a second mask pattern 136a may be provided on an upper sidewall of a bit line structure 124. A lower portion of the second mask pattern 136a may protrude laterally. For example, the lower portion of the second mask pattern 136a may have a first thickness in the second direction, and an upper portion of the second mask pattern 136a may have a second thickness in the second direction less than the first thickness.

In example embodiments of the inventive concept, an upper surface of a contact structure 132a may be positioned lower than an upper surface of the protruding portion of the second mask pattern 136a. The contact structure 132a may not have a "T" shape when viewed from a cross-sectional view taken along the second direction.

Hereinafter, a method of manufacturing the semiconductor device in FIG. 38 according to an embodiment of the inventive concept will be explained.

First, processes may be performed that are the same as the processes described with reference to FIGS. 5 to 8 to form a structure in FIG. 8. Then, processes may be performed that are the same as the processes described with reference to FIGS. 26 to 28 to form a structure in FIG. 28. For example, the contact structures having a pillar shape may be formed to make contact with the first impurity region. Additionally, a first opening may be formed between the contact structures and the bit line structures.

Then, processes the same as the processes described with reference to FIGS. 34 to 36 may be performed. Accordingly, the semiconductor device in FIG. 38 may be manufactured.

Figure 39:
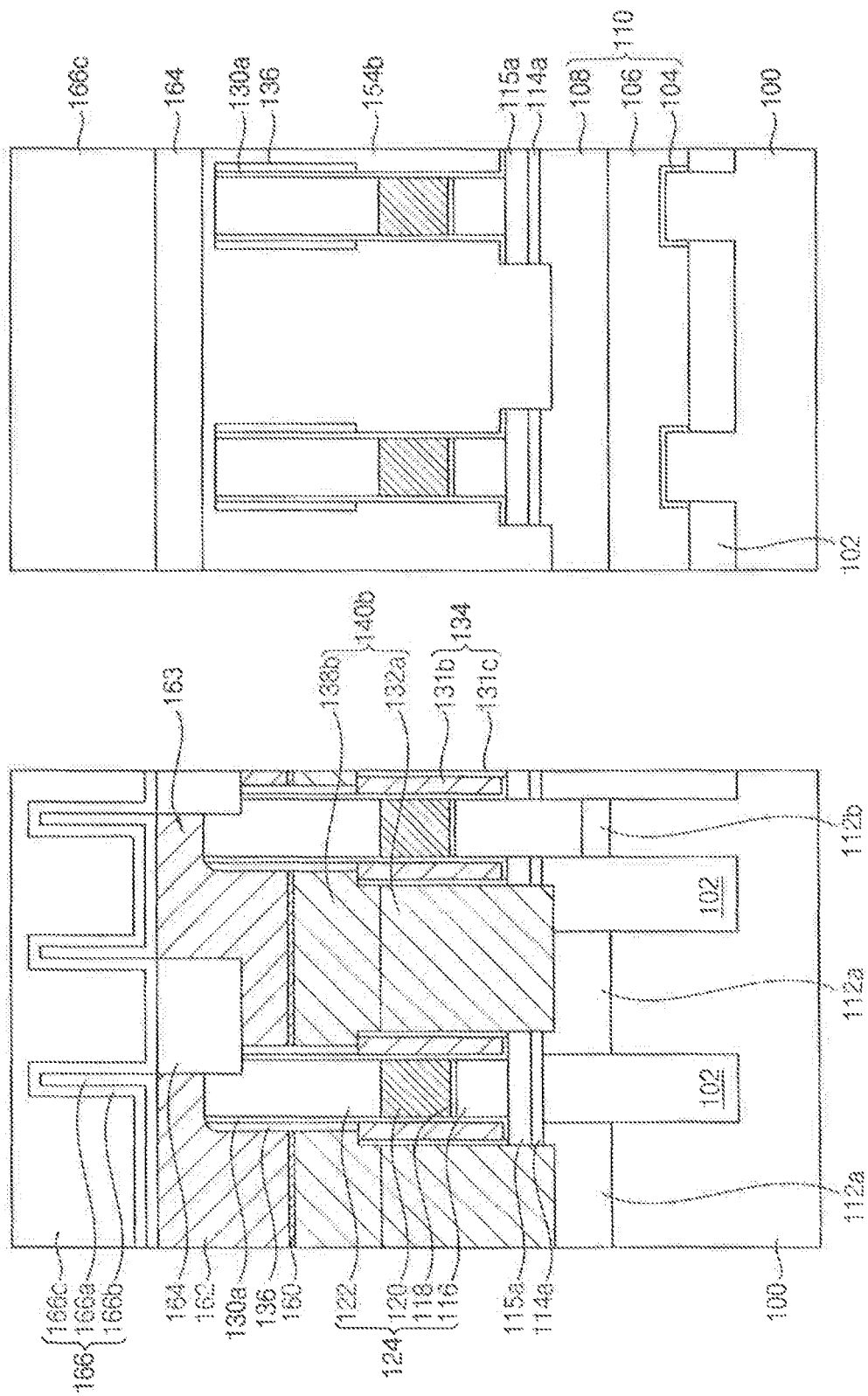

FIG. 39 is a cross-sectional view illustrating a semiconductor device in accordance with example embodiments of the inventive concept.

The semiconductor device in FIG. 39 may be substantially the same as the semiconductor device described with reference to FIGS. 1 to 3, except that an air spacer and an air gap are not provided, and a spacer structure is further included.

Referring to FIG. 39, a spacer structure 134 may be provided between the contact structure 140b and the bit line structures 124. The spacer structure 134 may include a first spacer 131b and a second spacer 131c. The spacer structure 134 may be formed on an insulation liner 130a on a sidewall of the bit line structure 124.

In example embodiments of the inventive concept, the insulation liner 130a and the second spacer 131c may include silicon nitride, and the first spacer 131b may include silicon oxide.

The spacer structure 134 may be positioned lower than a bottom surface of a second mask 136. For example, an upper portion of the spacer structure 134 may be positioned lower than the bottom surface of the second mask pattern 136. Because the spacer structures 134 are formed on the sidewall of the contact structure 140b, the spacer structures 134 may be spaced apart from each other in the first direction. The spacer structure 134 may have a longer length in the first direction. A width in the second direction of the spacer structure 134 may be greater than a width in the second direction of the second mask pattern 136.

The contact structure 140b may include a first portion lower than the bottom surface of the adjacent second mask pattern 136 and a second portion higher than the bottom surface of the second mask pattern 136. In example embodiments of the inventive concept, a width in the second direction of the first portion of the contact structure 140b may be smaller than a width in the second direction of the second portion of the contact structure 140b. For example, the contact structure 140b may have a "T" shape when viewed from the cross-sectional view taken along the second direction.

The insulation structure 154b may be arranged between the bit line structures 124 and between the contact structures 140b. The insulation structure 154b may not have an air gap.

Figure 40:
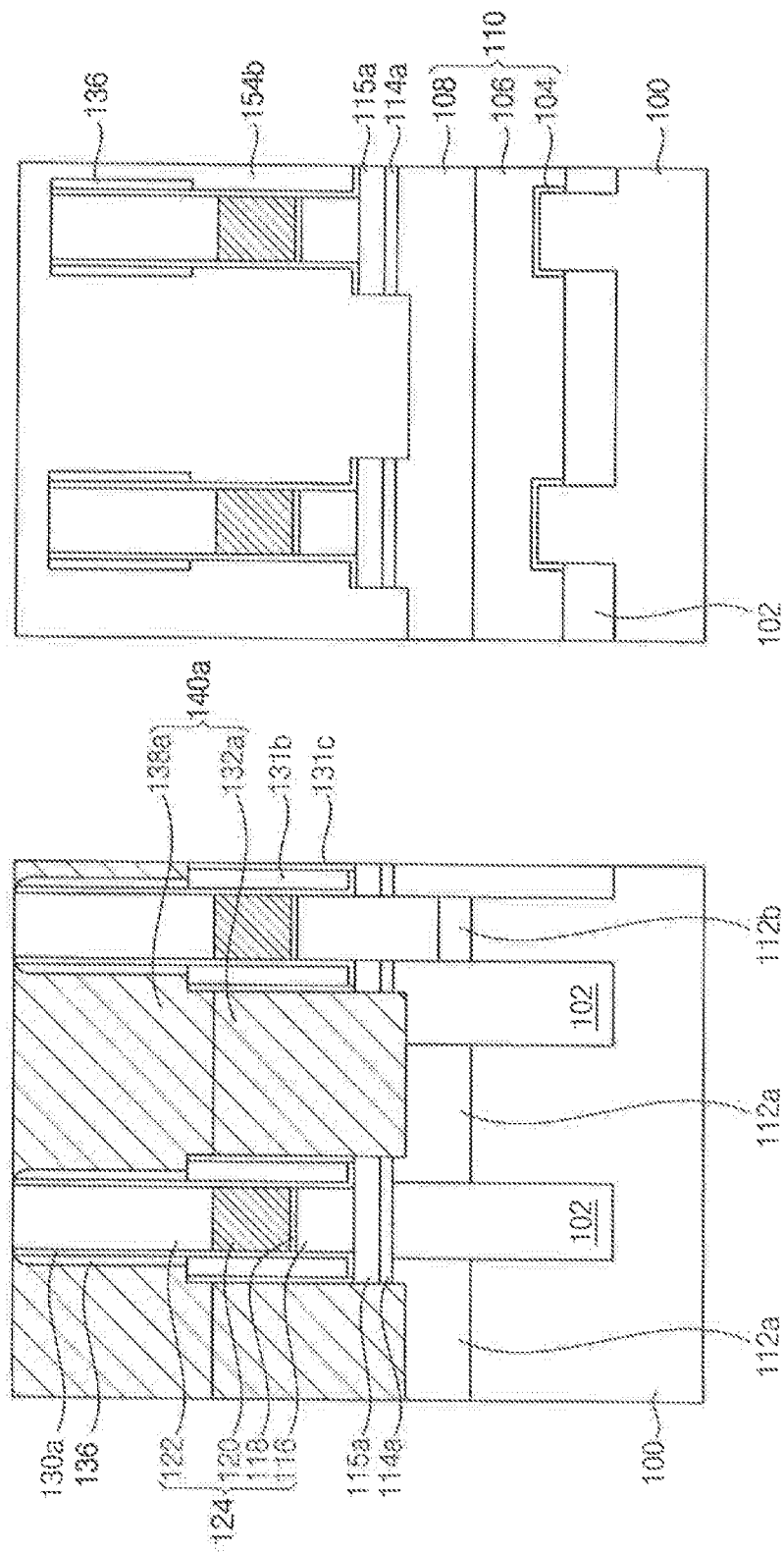

FIG. 40 is a cross-sectional view illustrating a method of manufacturing the semiconductor device in FIG. 39.

First, processes may be performed that are the same as the processes described with reference to FIGS. 5 to 15 to form a structure in FIG. 15.

Referring to FIG. 40, an insulation layer may be formed on the bit line structures 124 and the preliminary contact structure 140a to fill the second opening. The insulation layer may be planarized until an upper surface of the bit line structure is exposed, to form an insulation structure 154b in the second opening.

The insulation layer may be formed of a material having excellent gap fill properties by a deposition process. In example embodiments of the inventive concept, the insulation layer may be formed by a spin coating process, an atomic layer deposition process, a chemical vapor deposition process, etc. Accordingly, the second opening may be completely filled with the insulation layer so that an empty space is not formed. Additionally, an air spacer connected to the second opening may be completely filled with the insulation layer. Accordingly, the air spacer may be removed and then, a first spacer 131b including the insulation material may be formed.

Then, processes the same as the processes described with reference to FIG. 18 may be performed to form a semiconductor device in FIG. 39.

The semiconductor device illustrated in FIG. 39 may be manufactured by following processes.

First, processes may be performed that are the same as the processes described with reference to FIG. 5 to form a structure in FIG. 5. Then, processes may be performed that are the same as the processes described with reference to FIGS. 19 to 21 to form a structure in FIG. 21. For example, a preliminary polysilicon structure may be formed between the bit line structures.

Then, processes the same as the processes described with reference to FIGS. 12 and 15 may be performed to form a structure in FIG. 15. Then, processes the same as the processes described with reference to FIG. 43 may be performed, and processes the same as the processes described with reference to FIG. 18 may be performed to manufacture the semiconductor device in FIG. 42.

Figure 41:
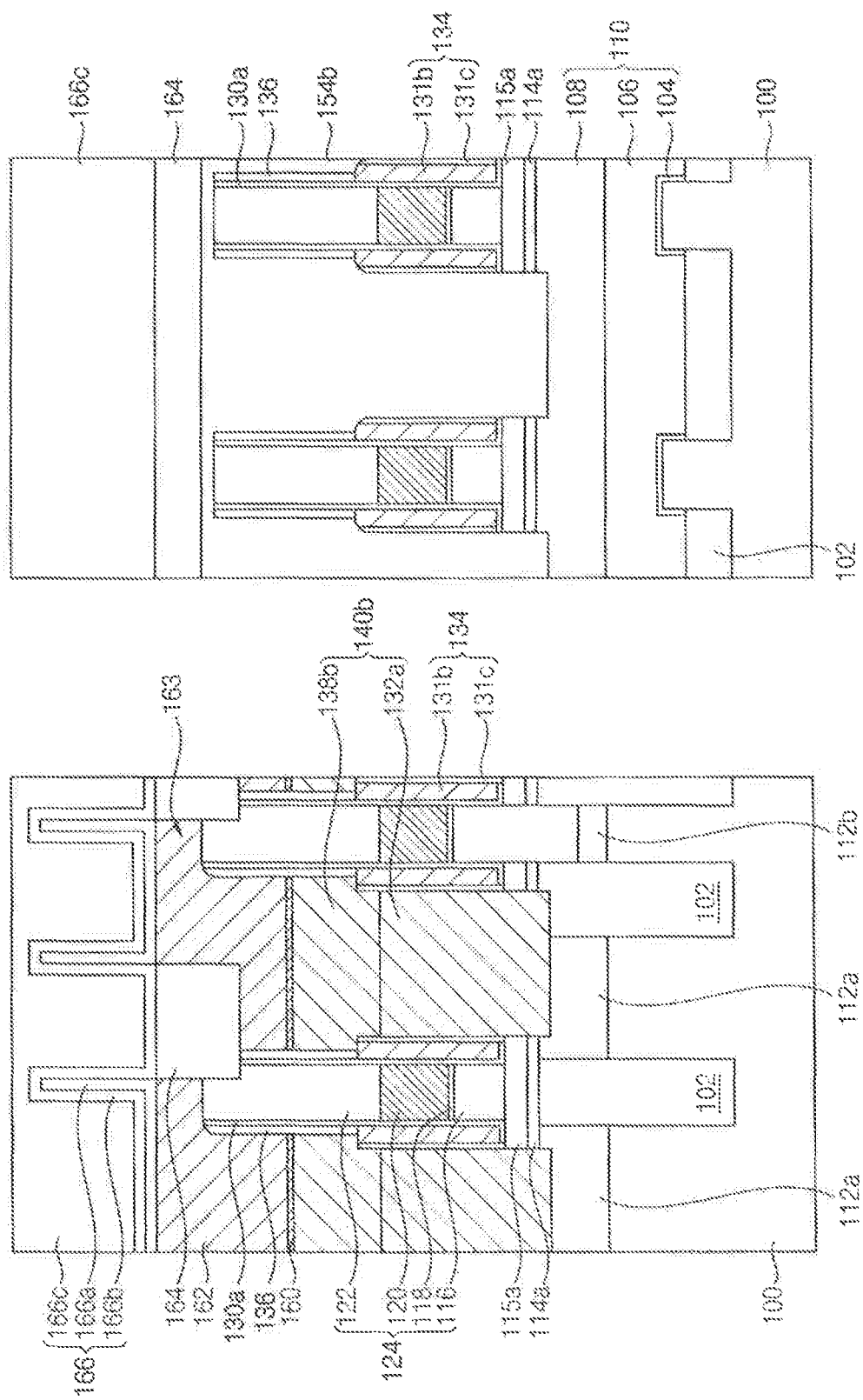

FIG. 41 is a cross-sectional view illustrating a semiconductor device in accordance with example embodiments.

The semiconductor device in FIG. 41 may be substantially the same as the semiconductor device described with reference to the embodiment of FIGS. 1 to 3, except that in FIG. 41 an air spacer and an air gap are not provided, and a spacer structure is further included.

Referring to FIG. 41, a spacer structure 134 may be provided between the bit line structure 124 and the contact structure 140b and between the bit line structure 124 and the insulation structure 154b. The spacer structure 134 may have a shape extending in the first direction along the sidewall of the bit line structure 124.

An upper surface of the spacer structure 134 between the bit line structure 124 and the insulation structure 154b may be rounded more than an upper surface of the spacer structure 134 between the bit line structure 124 and the contact structure 140b.

The spacer structure 134 may include, for example, a first spacer 131b and a second spacer 131c.

The spacer structure 134 may be positioned lower than a bottom surface of the second mask pattern 136. For example, an upper portion of the spacer structure 134 may be positioned lower than the bottom surface of the second mask pattern 136.

The contact structure 140b may have a "T" shape when viewed from a cross-sectional view taken along the second direction.

As the spacer structure 134 is provided between the insulation structure 154b and the bit line structure 124, a lower width in the second direction of the insulation structure 154b may be greater than an upper width in the second direction of the insulation structure 154b. The insulation structure 154b may not include an air gap.

Figure 42:
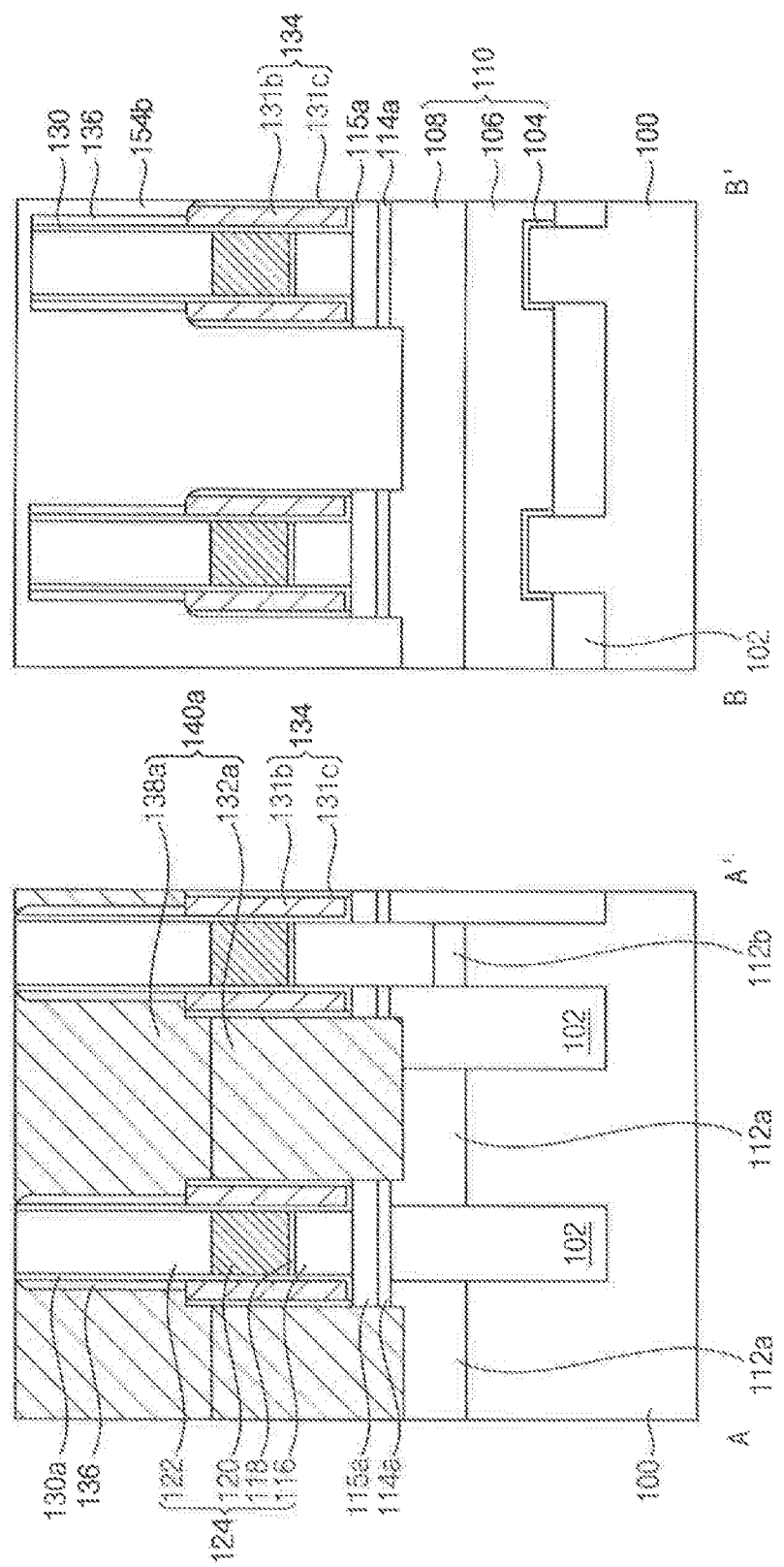

FIG. 42 is a cross-sectional view illustrating a method of manufacturing the semiconductor device in FIG. 41.

First, processes the same as the processes described with reference to FIGS. 5 to 13 may be performed to form a structure in FIG. 13.

Referring to FIG. 42, an insulation layer may be formed on the bit line structure and the preliminary contact structure to fill the first opening. The insulation layer may be planarized until an upper surface of the bit line structure is exposed, to form an insulation structure 154b in the first opening. For example, the spacer structure 134 formed by a previous process may not be removed.

Then, processes the same as the processes described with reference to FIG. 18 may be performed to form the semiconductor device such as shown in FIG. 41.

Hereinafter, a method of manufacturing the semiconductor device such as shown in FIG. 41 will be explained.

First, processes the same as the processes described with reference to FIG. 5 may be performed to form a structure in FIG. 5. Then, processes similar to or the same as the processes described with reference to FIGS. 19 to 21 may be performed to form a preliminary polysilicon structure.

Then, processes the same as the processes described with reference to FIGS. 12 and 13 may be performed to form a preliminary contact structure. Processes the same as the processes described with reference to FIG. 42 may be performed to manufacture the semiconductor device in FIG. 41.

FIG. 43 is a cross-sectional view illustrating a semiconductor device in accordance with example embodiments of the inventive concept.

The semiconductor device in FIG. 43 may be substantially the same as the semiconductor device described with reference to FIG. 43, except for a shape of a contact structure.

Referring to FIG. 43, a spacer structure 134 may be provided between a contact structure 132a and a bit line structure 124.

The spacer structures 134 are formed on a sidewall of the contact structure 132a, and the spacer structures 134 may be spaced apart from each other in the first direction. The spacer structure 134 may have a longer length in the first direction. A width in the second direction of the spacer structure 134 may be greater than a width in the second direction of the second mask pattern 136.

An upper surface of the contact structure 132a may be positioned lower than an upper surface of the spacer structure 134.

The insulation structure 154b may be arranged between the bit line structures 124 and between the contact structures 132a. The insulation structure 154b may not include an air gap.

Figure 44:
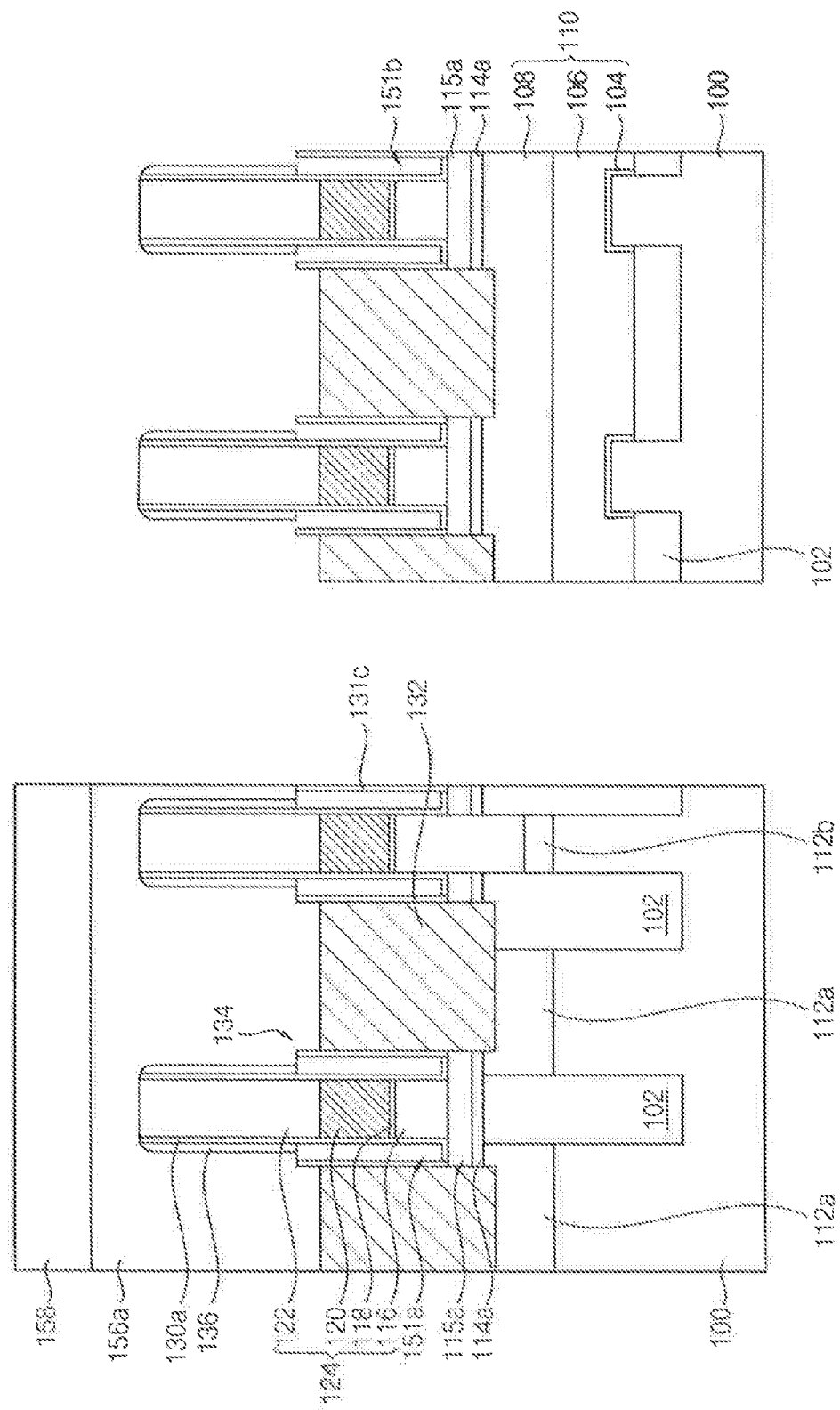
Figure 45:
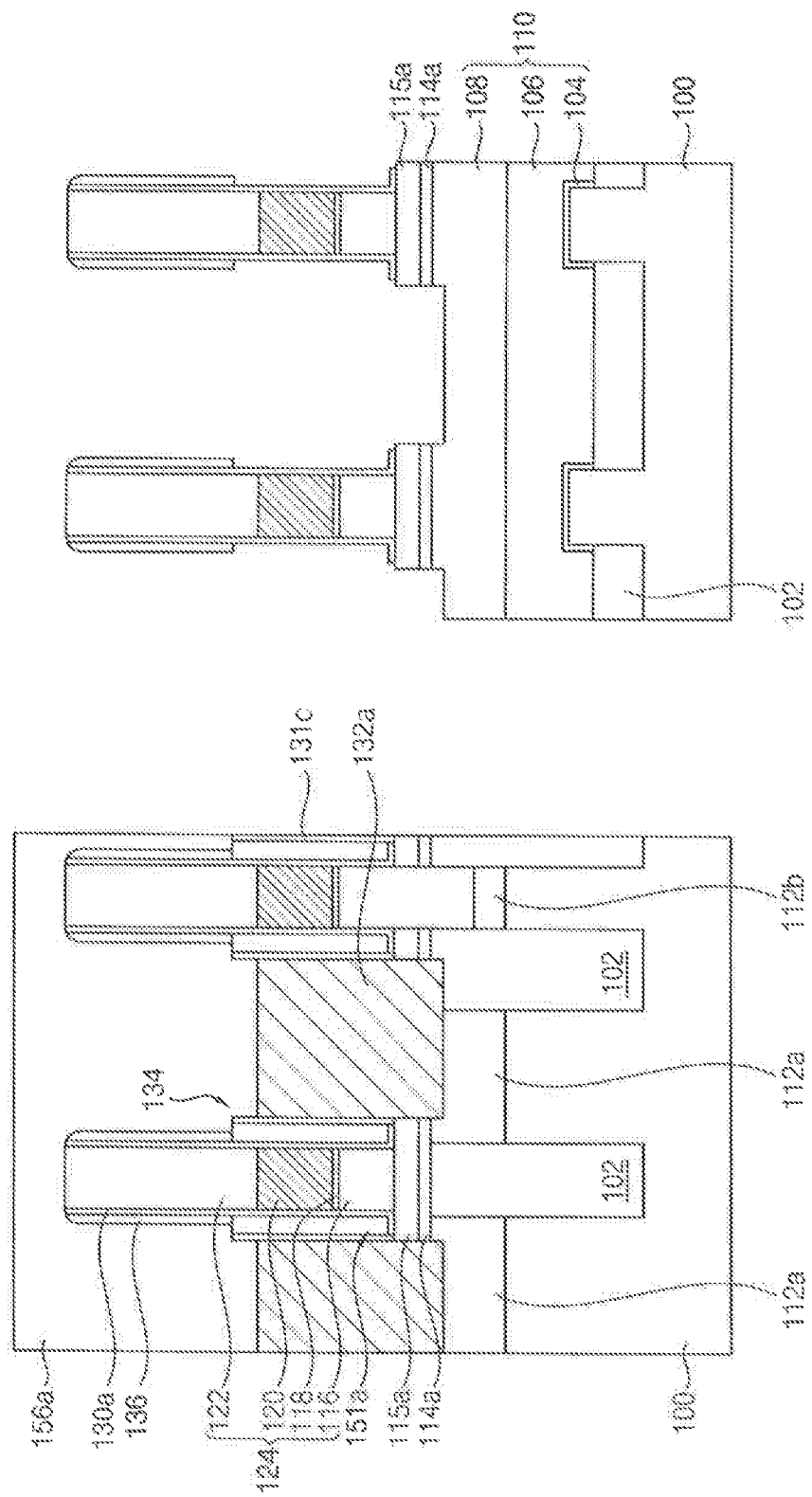

FIGS. 44 and 45 are cross-sectional views illustrating a method of manufacturing the semiconductor device in FIG. 43.

First, processes the same as the processes described with reference to FIGS. 5 to 9 may be performed to form a structure in FIG. 9. Then, processes the same as the processes described with reference to FIG. 27 may be performed to form a structure in FIG. 27. By performing the processes, upper surfaces of the preliminary polysilicon structure and the spacer structure may be exposed.

Referring to FIG. 44, the first spacer 131b in both sides of the bit line structure 124 may be removed. The first spacer 131b may be removed by an isotropic etch process. The portion from which the first spacer 131b is removed may have a shape extending in the first direction.

Referring to FIG. 45, the first preliminary polysilicon pattern 132 may be etched using the mold pattern 156a and the third mask pattern 158 as an etching mask. Accordingly, contact structures 132a having a pillar shape may be formed to make contact with the first impurity region 112a. Additionally, a second opening may be formed between the contact structures 132a and the bit line structures 124.

Then, an insulation layer may be formed on the bit line structure 124 and the mold pattern 156a to fill the second opening. The insulation layer may be planarized until an upper surface of the bit line structure is exposed, to form an insulation structure in the second opening. In example embodiments of the inventive concept, the second opening may be completely filled with the insulation layer so that an empty space is not formed. In this case, the insulation structure may not include an air gap therein.

In some embodiments of the inventive concept, when the insulation layer is formed, an empty space may be formed in the second opening. In this case, the insulation structure may include an air gap therein. In some embodiments, the air gap may face a conductive pattern structure of the bit line structure.

Then, the mold pattern may be removed. Subsequently, the processes of forming a pad structure electrically connected to the contact structure 132a and a capacitor may be performed, to form the semiconductor device in FIG. 43.

Figure 46:
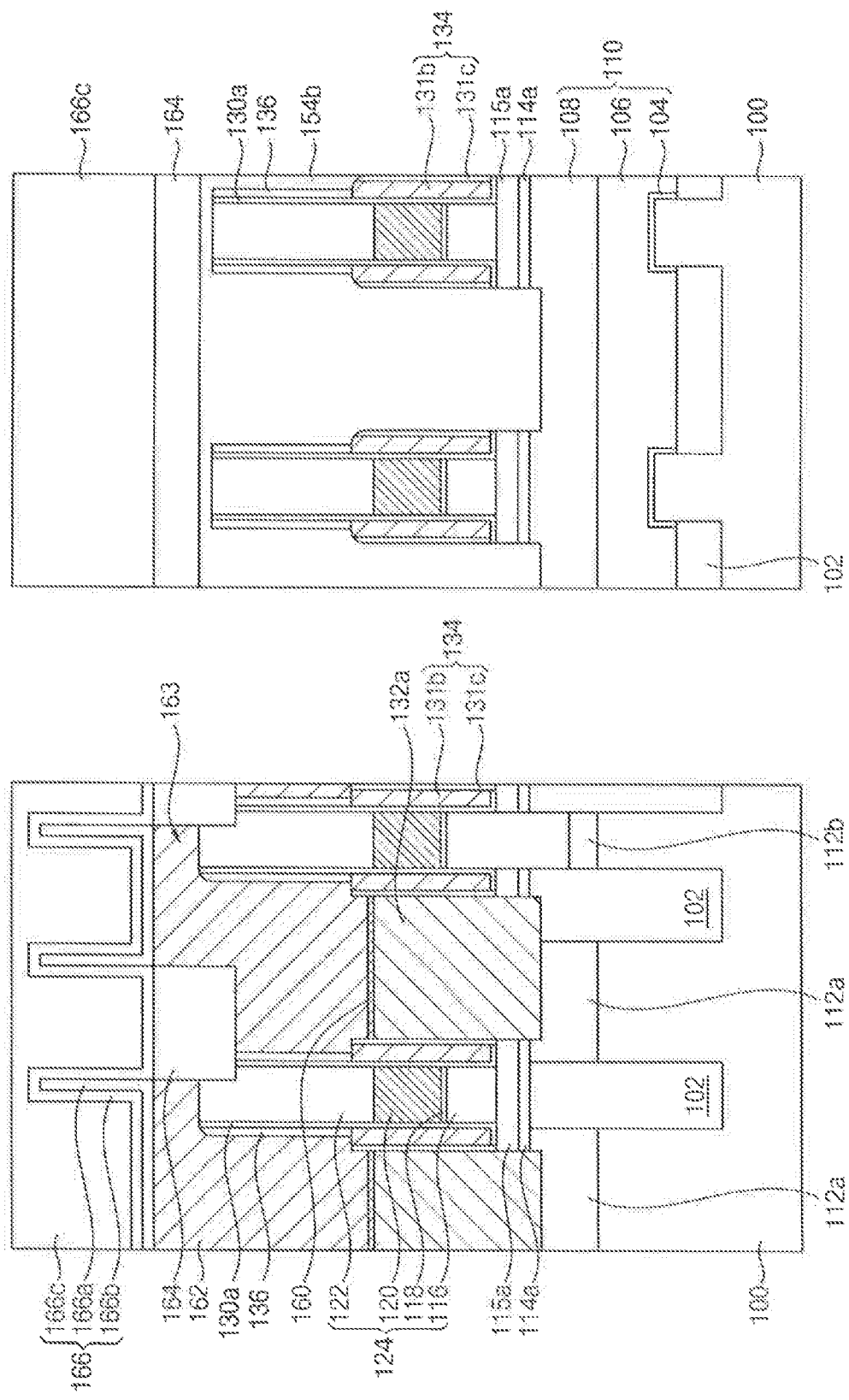

FIG. 46 is a cross-sectional view illustrating a semiconductor device in accordance with example embodiments of the inventive concept.

The semiconductor device in FIG. 46 may be substantially the same as the semiconductor device described with reference to FIG. 43, except for a shape of a contact structure.

Referring to FIG. 46, a spacer structure 134 may be provided between the bit line structure 124 and the contact structure 132a and between the bit line structure 124 and the insulation structure 154b. The spacer structure 134 may have a shape extending in the first direction along a sidewall of the bit line structure 124.

An upper surface of the contact structure 132a may be positioned lower than an upper surface of the spacer structure 134.

The insulation structure 154b may be arranged between the bit line structures 124 and between the contact structures 132a. The insulation structure 154b may not include an air gap.

Figure 47:
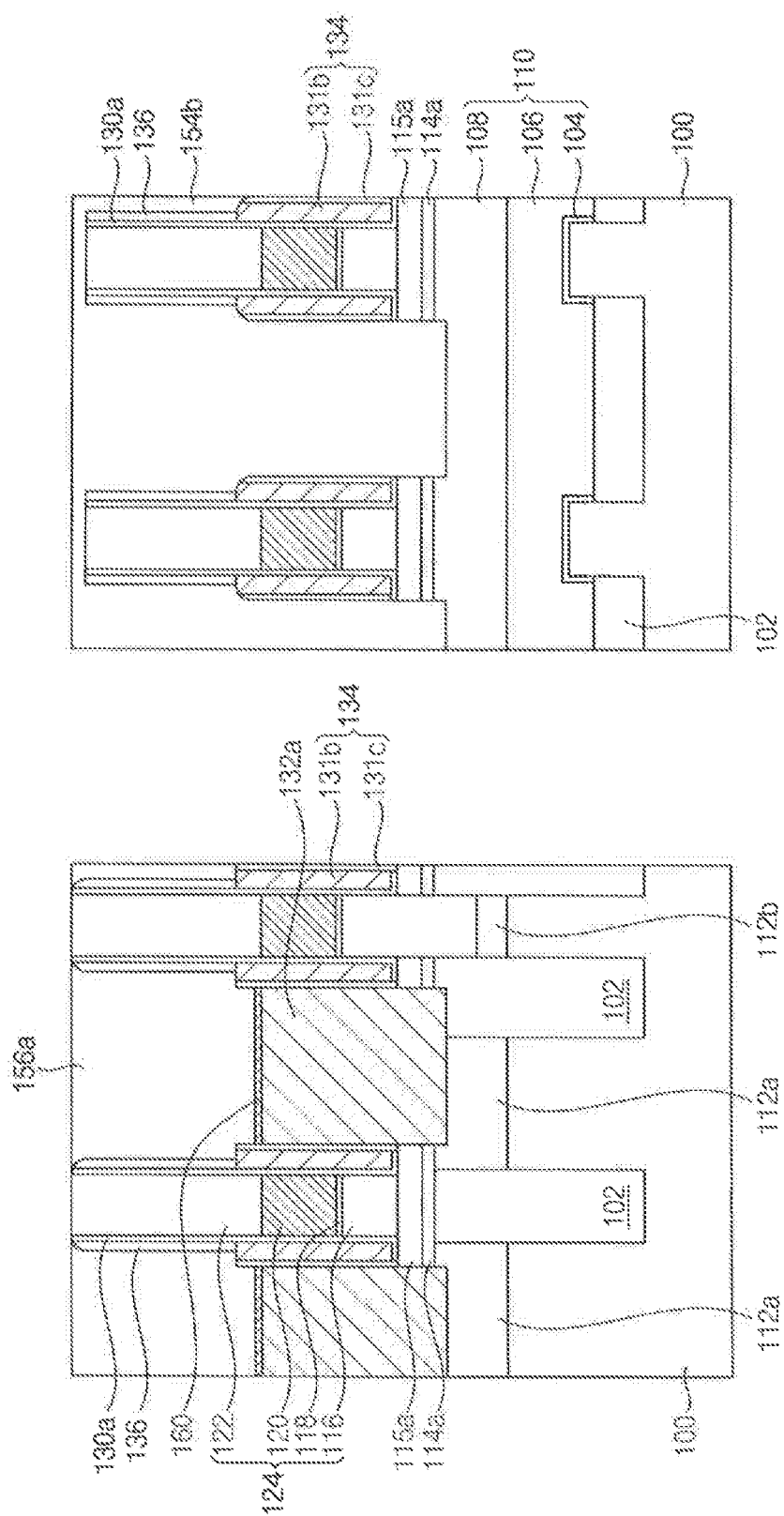

FIG. 47 is a cross-sectional view illustrating a method of manufacturing the semiconductor device shown in FIG. 46.

First, processes the same as the processes described with reference to FIGS. 5 to 9 may be performed to form a structure in FIG. 9. Then, processes that are the same as the processes previously-described with reference to FIG. 27 may be performed to form a structure in FIG. 27. By performing these processes, upper surfaces of the preliminary polysilicon structure and the spacer structure may be exposed.

Referring to FIG. 47, the preliminary polysilicon structure may be etched using the mold pattern 156a and the third mask pattern 158 as an etching mask. Accordingly, contact structures 132a having a pillar shape may be formed that make contact with the first impurity region 112a. Additionally, a second opening may be formed between the contact structures 132a and the bit line structures 124.

Then, an insulation layer may be formed on the bit line structure 124 and the mold pattern 156a to fill the second opening. The insulation layer may be planarized until an upper surface of the bit line structure is exposed, to form an insulation structure 154b in the second opening.

In some example embodiments of the inventive concept, the second opening may be completely filled with the insulation layer so that an empty space is not formed. In this case, the insulation structure may not include an air gap therein.

Then, the mold pattern 156a may be removed. The processes of forming a pad structure electrically connected to the contact structure 132a and a capacitor may be subsequently performed, to form the semiconductor device such as shown in FIG. 49.

As mentioned above, the semiconductor device according to some embodiments of the inventive concept may include an air spacer and an air gap, and the structure reduces a parasitic capacitance between conductive structures.

While example embodiments of the inventive concept have been particularly shown and described, it will be understood by a person of ordinary skill in the art that variations in form and detail may be made therein without departing from the spirit and scope of the claims.

What is claimed is:

1. A semiconductor device, comprising:
   a plurality of conductive structures arranged on a substrate and spaced apart from each other in a second direction substantially perpendicular to a first direction, each of the plurality of conductive structures extending in the first direction;
   a plurality of contact structures arranged between the conductive structures in an alternating arrangement and spaced apart from each other in the first direction, each of the plurality of the contact structures having an upper surface lower than an upper surface of each of the plurality of conductive structures;
   a plurality of insulation structures arranged in a space between the alternating arrangement of the plurality of conductive structures and plurality of the contact structures, respectively; and
   air spacers arranged between a lower portion of each of the plurality of conductive structures and the plurality of contact structures, and the air spacers being spaced apart from each other in the first direction,
   wherein the upper surface of each of the plurality of contact structures is positioned higher than an upper surface of each of the aft spacers.

2. The semiconductor device of claim 1, wherein the plurality of insulation structures comprises an air gap therein.

3. The semiconductor device of claim 1, wherein the air spacers are arranged in pairs on opposite sidewalk of the conductive structures, respectively.

4. The semiconductor device of claim 1, wherein each of the plurality of contact structures has a T shape when viewed from a cross-sectional view in the second direction.

5. The semiconductor device of claim 1, wherein each of the plurality of the conductive structures comprises:
   a conductive pattern;
   a first mask pattern stacked on the conductive pattern; and
   a second mask pattern on an upper sidewall of the first mask pattern.

6. The semiconductor device of claim 5, wherein the second mask pattern has a width less than a width in the second direction of each of the air spacers.

7. The semiconductor device of claim 5, wherein a lower width in the second direction of the second mask pattern is greater than an upper width in the second direction of the second mask pattern.

8. The semiconductor device of claim 5, wherein each of the air spacers is disposed under the second mask pattern.

9. The semiconductor device of claim 1, wherein the space between the alternating arrangement of the plurality of conductive structures and the plurality of contact structures has a lower portion having a first width, a middle portion having a second width greater than the first width and an upper portion having a third width less than the second width.

10. The semiconductor device of claim 1, further comprising a pad structure on each of the plurality of contact structures.

11. The semiconductor device of claim 10, wherein the pad structure includes at least one of a metal and a metal silicide.

12. The semiconductor device of claim 1, wherein the contact structures include polysilicon.

13. A semiconductor device, comprising:
   a plurality of conductive structures arranged on a substrate and spaced apart from each other in a second direction substantially perpendicular to a first direction, each of the plurality of conductive structures extending in the first direction;

a plurality of contact structures arranged between the conductive structures in an alternating arrangement and spaced apart from each other in the first direction;

a plurality of insulation structures, each one of the insulation structures arranged in a space between the alternating arrangement of the conductive structures and the contact structures; and spacers arranged between the alternating arrangement of the conductive structures and the contact structures, respectively, wherein each of the plurality of the conductive structures comprises a conductive pattern, a first mask pattern stacked on the conductive pattern and a second mask pattern on an upper sidewall of the first mask pattern and on an upper surface of a corresponding one of the spacers.

14. The semiconductor device of claim 13, wherein the spacers comprise air spacers, and the air spacers are spaced apart from each other in the first direction.

15. The semiconductor device of claim 13, wherein the second mask pattern has a width less than a width in the second direction of each of the spacers.

16. The semiconductor device of claim 13, wherein each of the spacers is disposed under the second mask pattern.

17. A semiconductor device, comprising:
a plurality of conductive structures arranged on a substrate and spaced apart from each other in a second direction substantially perpendicular to a first direction, each of the plurality of conductive structures extending in the first direction;

a plurality of contact structures arranged between the conductive structures in an alternating arrangement and spaced apart from each other in the first direction, the plurality of contact structures including polysilicon;

a pad structure on each of the plurality of contact structures, the pad structure including at least one of a metal and a metal silicide;

a plurality of insulation structures arranged in a space between the alternating arrangement of the plurality of conductive structures and plurality of the contact structures, respectively; and air spacers arranged between a lower portion of each of the plurality of conductive structures and the plurality of contact structures, and the air spacers being spaced apart from each other in the first direction, wherein an upper surface of at least one of the plurality of contact structures is positioned higher than an upper surface of at least one of the air spacers.

18. The semiconductor device of claim 17, wherein each insulation structure of the plurality of insulation structures comprises an air gap therein, and wherein the air spacers are arranged in pairs on opposite sidewalls of the conductive structures, respectively.

* * * * *